United States Patent
Okada et al.

(10) Patent No.: US 7,597,531 B2
(45) Date of Patent: Oct. 6, 2009

(54) METHOD OF CONTROLLING MOVER DEVICE

(75) Inventors: Keiji Okada, Saijo (JP); Michiro Sugitani, Niihama (JP); Yoshitomo Hidaka, Yokohama (JP); Junichi Murakami, Saijo (JP); Fumiaki Sato, Saijo (JP); Mitsukuni Tsukihara, Saijo (JP); Suguru Hirokawa, Saijo (JP); Masamitsu Shinozuka, Saijo (JP)

(73) Assignee: SEN Corporation, an SHI and Axcelis Company, Tokyo (JP)

( * ) Notice: Subject to any disclaimer, the term of this patent is extended or adjusted under 35 U.S.C. 154(b) by 552 days.

(21) Appl. No.: 11/044,632

(22) Filed: Jan. 28, 2005

(65) Prior Publication Data

US 2005/0188924 A1 Sep. 1, 2005

(30) Foreign Application Priority Data

Jan. 30, 2004 (JP) ............................. 2004-023961

(51) Int. Cl.
- B65H 1/00 (2006.01)
- C23C 16/00 (2006.01)
- C23F 1/00 (2006.01)
- H01L 21/306 (2006.01)
- H02K 41/00 (2006.01)

(52) U.S. Cl. ................. 414/806; 414/800; 414/935; 118/729; 318/135; 318/567; 156/345.54

(58) Field of Classification Search ........... 414/800, 414/806, 935; 355/53; 118/729; 318/135, 318/567

See application file for complete search history.

(56) References Cited

U.S. PATENT DOCUMENTS

| 5,194,893 | A | * | 3/1993 | Nishi ........................... 355/53 |
| 5,815,246 | A | * | 9/1998 | Sperling et al. ............... 355/53 |
| 5,959,427 | A | | 9/1999 | Watson |
| 6,654,098 | B2 | | 11/2003 | Asano et al. |
| 7,187,143 | B2 | * | 3/2007 | Okada et al. ................. 318/135 |
| 2003/0164931 | A1 | | 9/2003 | Galburt et al. |

FOREIGN PATENT DOCUMENTS

| EP | 0 557 100 A1 | 8/1993 |
| JP | 2000-077503 A | 3/2000 |
| JP | 2001-195130 | 7/2001 |
| JP | 2002-008971 A | 1/2002 |

* cited by examiner

Primary Examiner—Karla Moore
(74) Attorney, Agent, or Firm—Squire, Sanders & Dempsey L.L.P.

(57) ABSTRACT

Embodiments of the invention are directed to a method of controlling a mover device The method includes generating a moving force from a moving force generating unit to move a processing base with respect to a movable base, thereby moving the processing base with respect to a fixed base as a result of the movement of the processing base with respect to the movable base; moving the movable base on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base. The method further includes controlling the moving velocity of the processing base with respect to the fixed base.

9 Claims, 45 Drawing Sheets

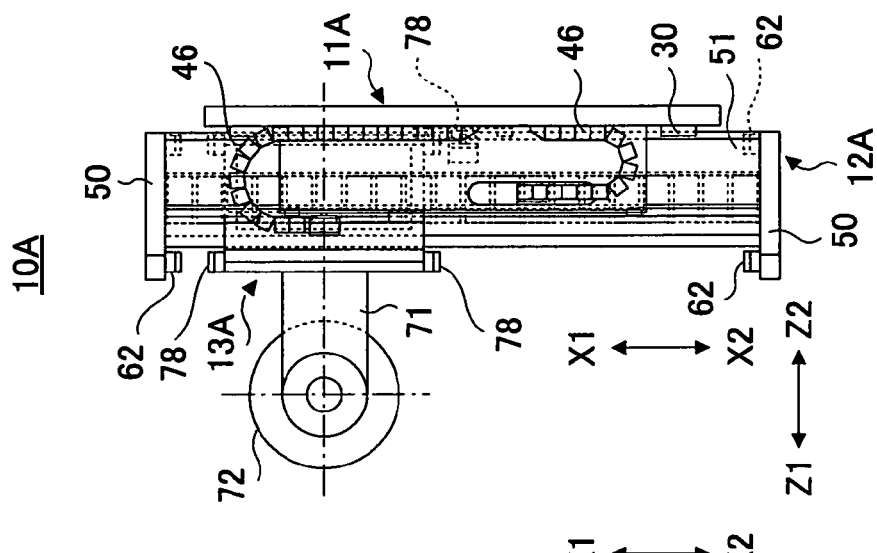
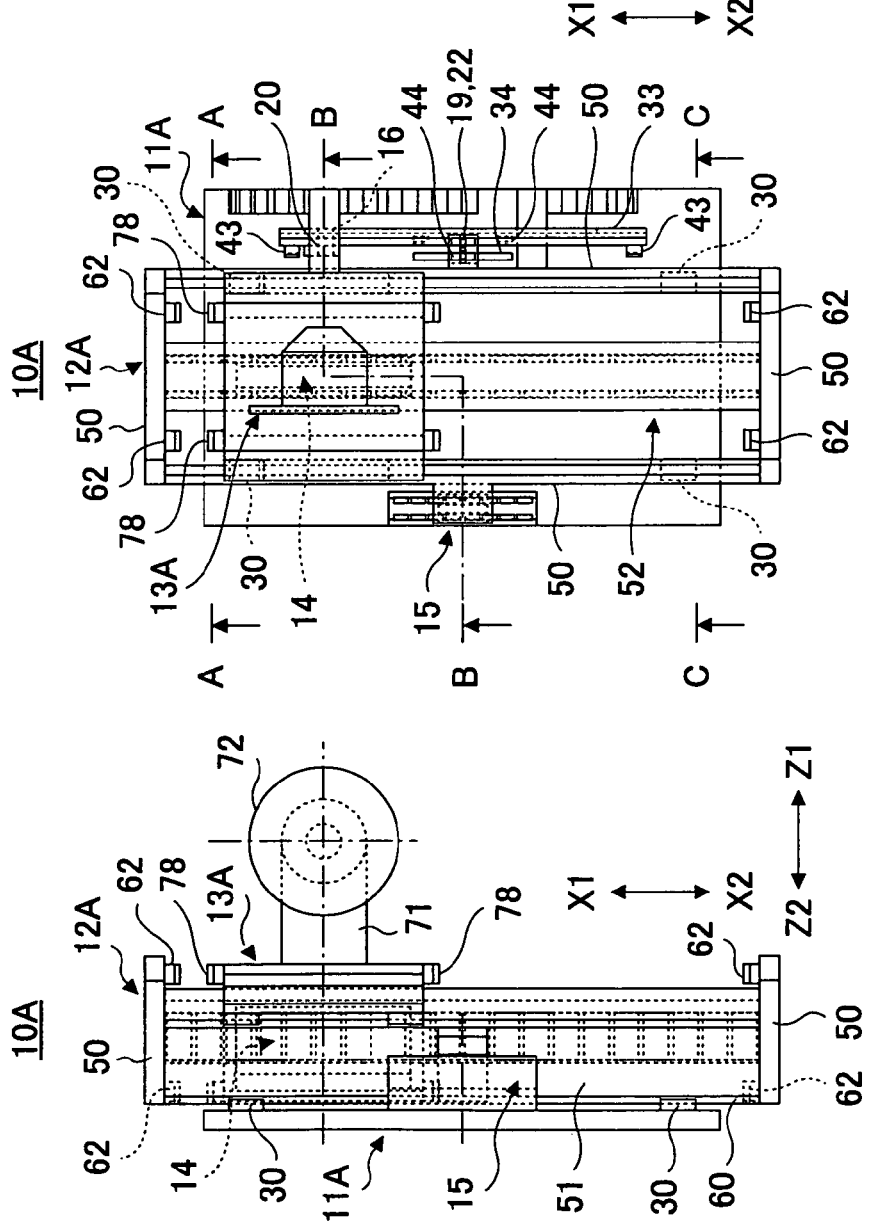

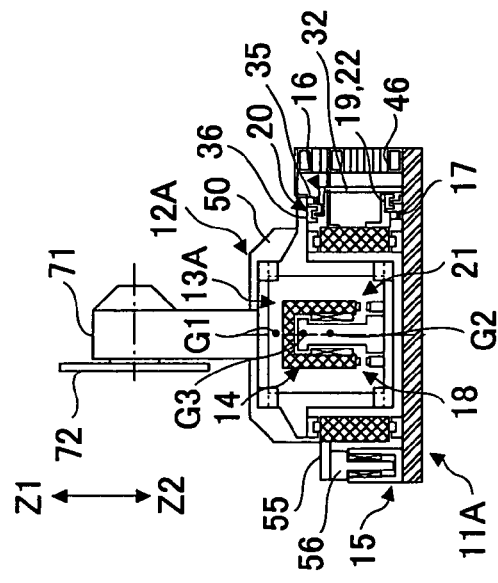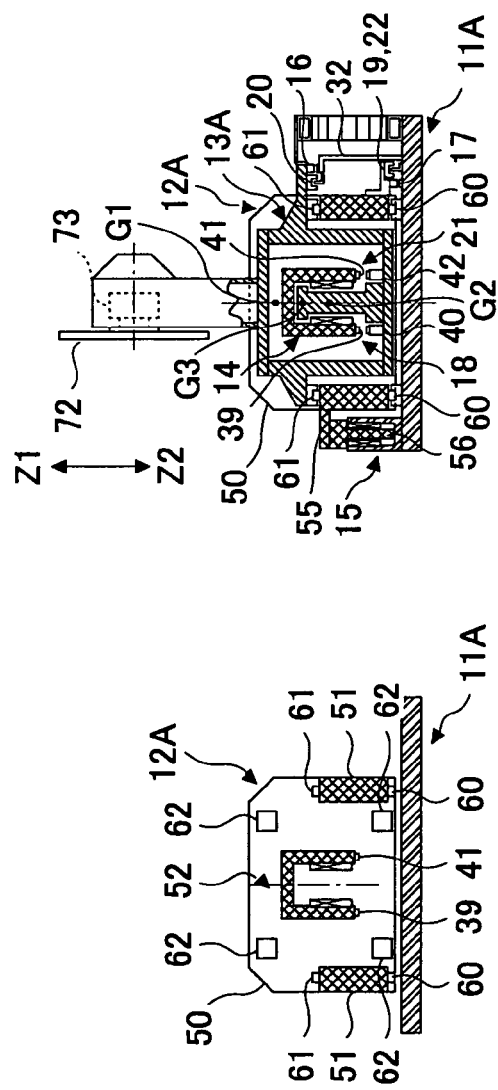

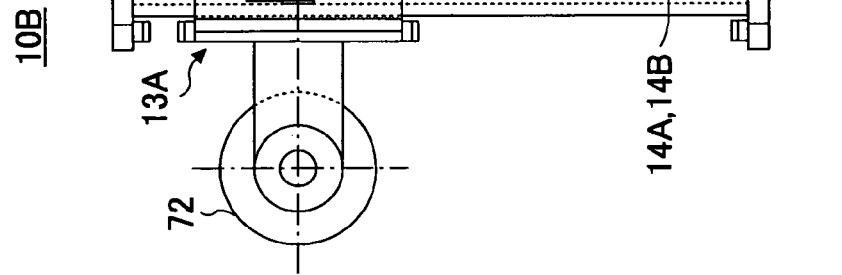
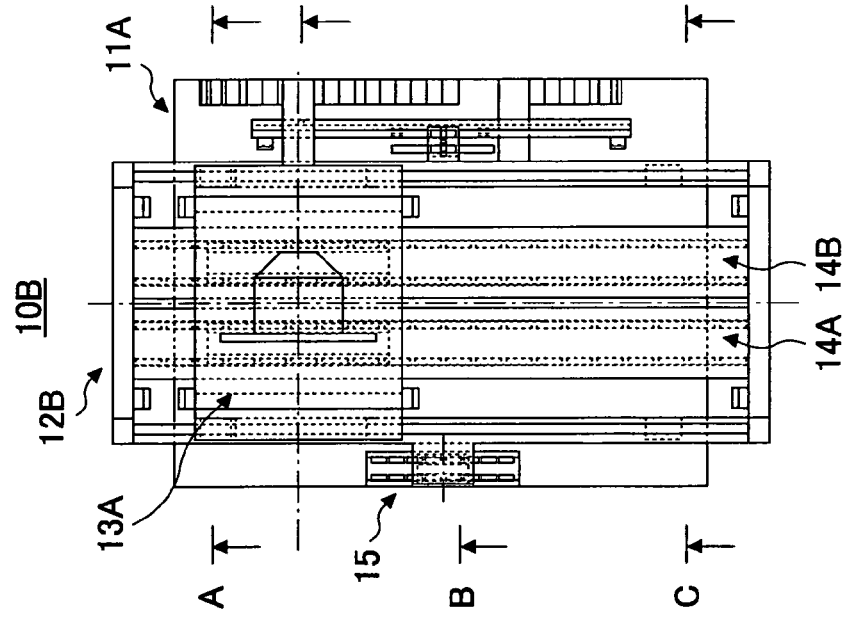
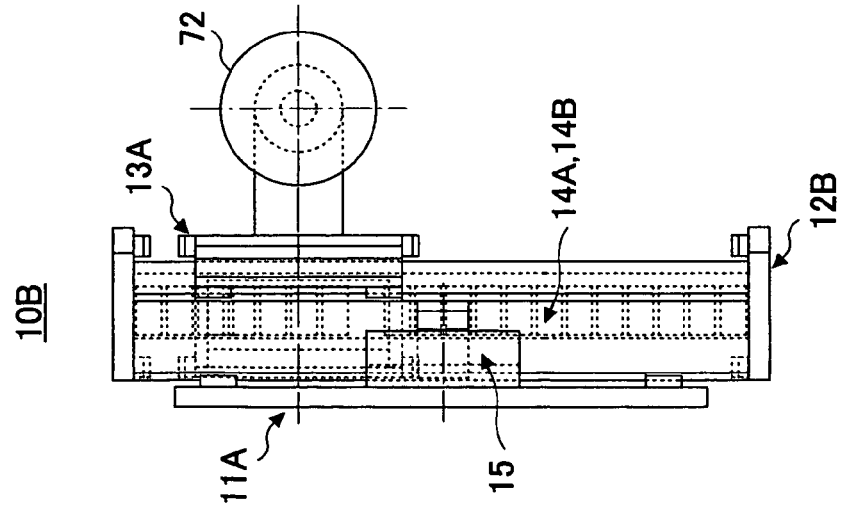

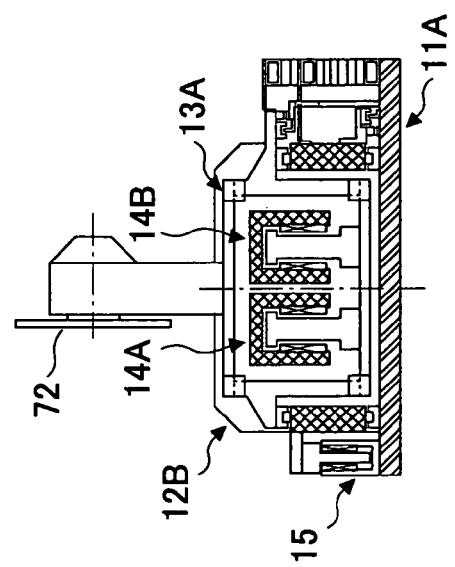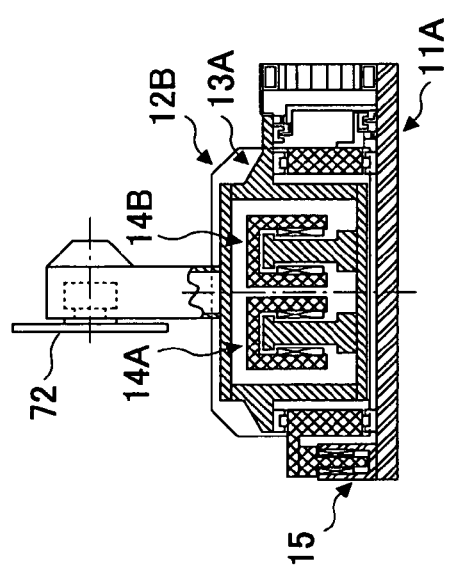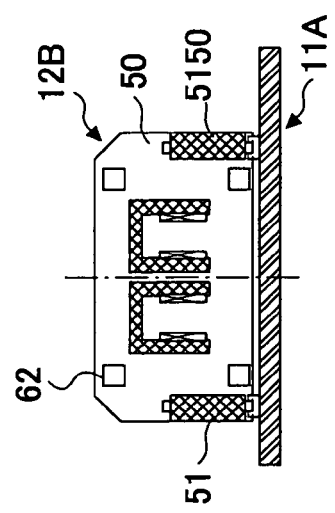

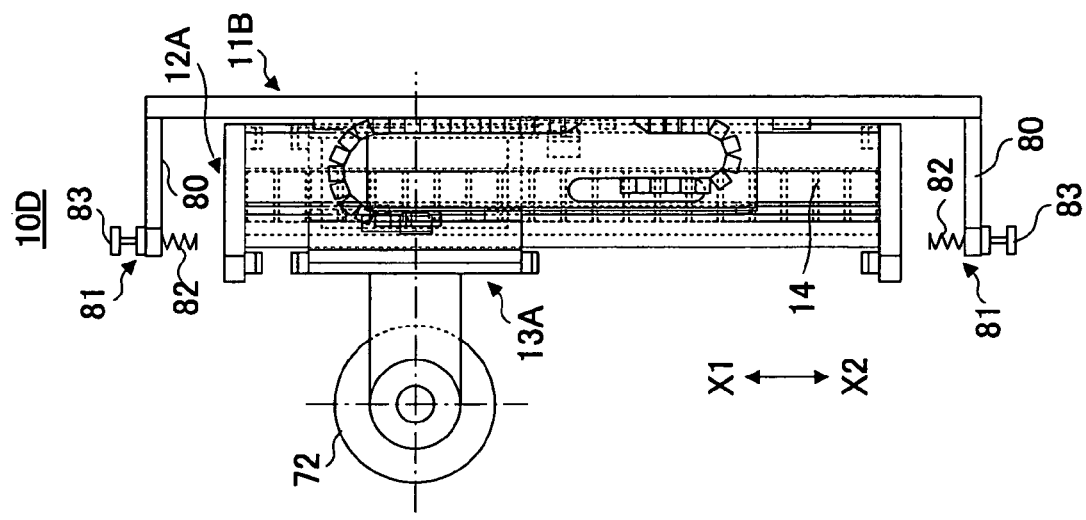
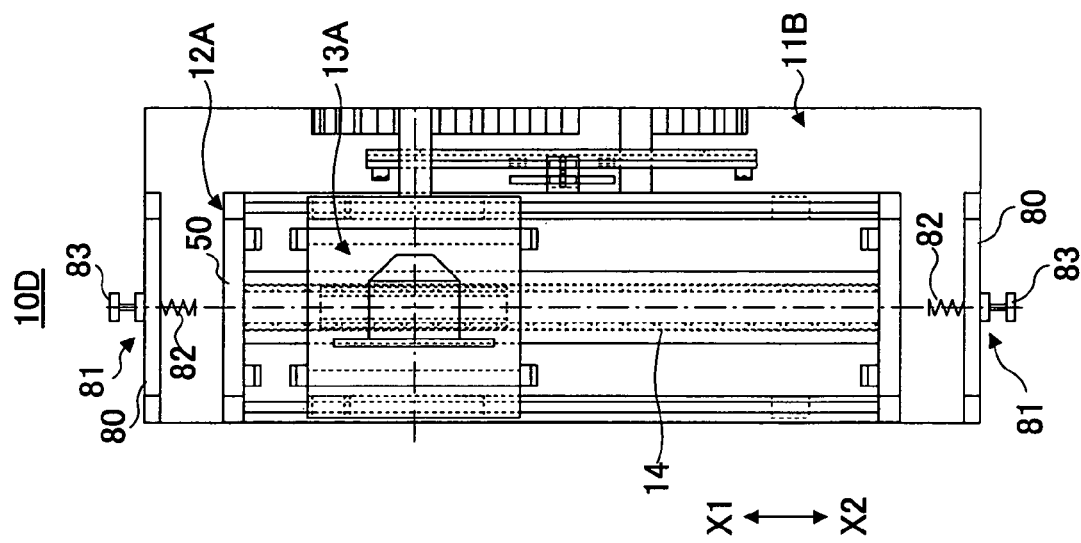
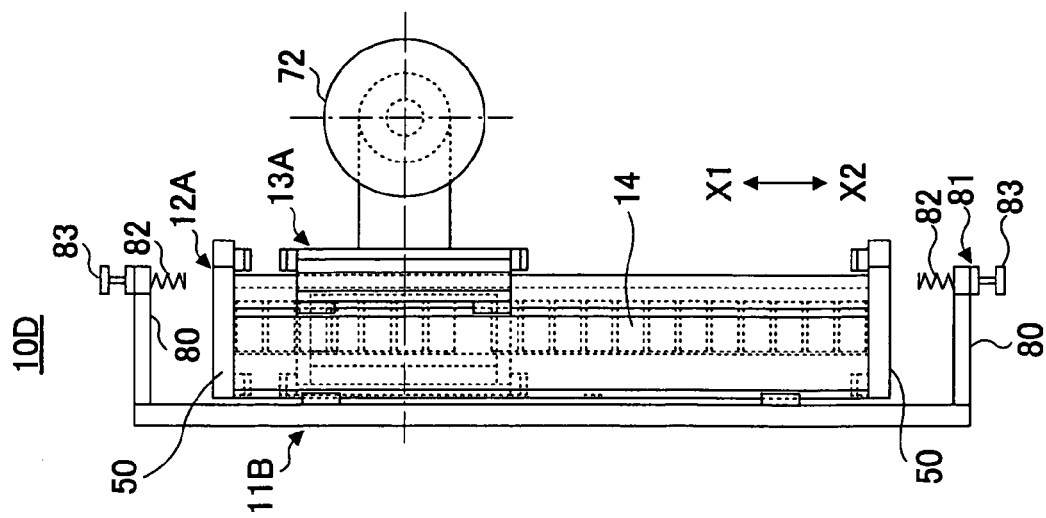

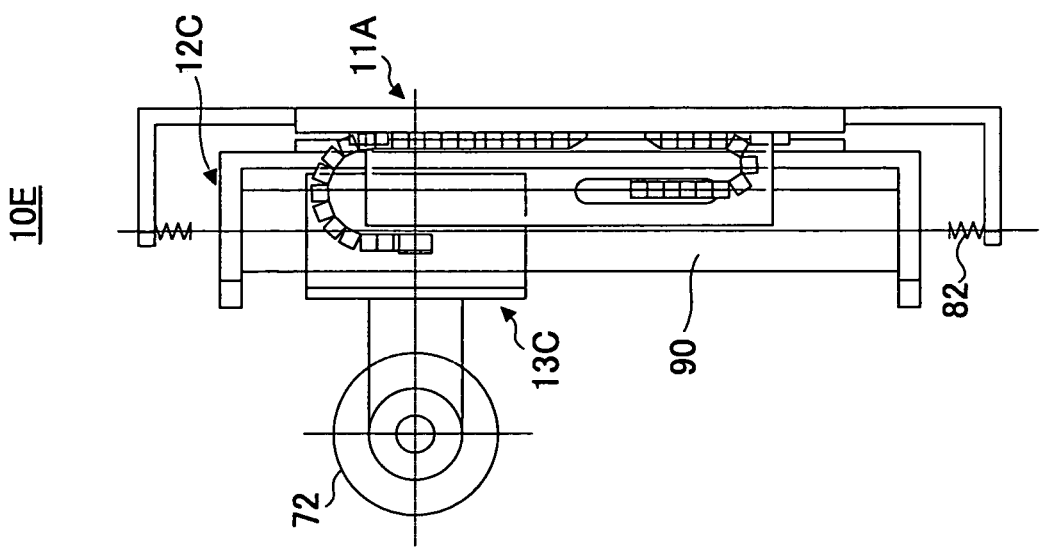
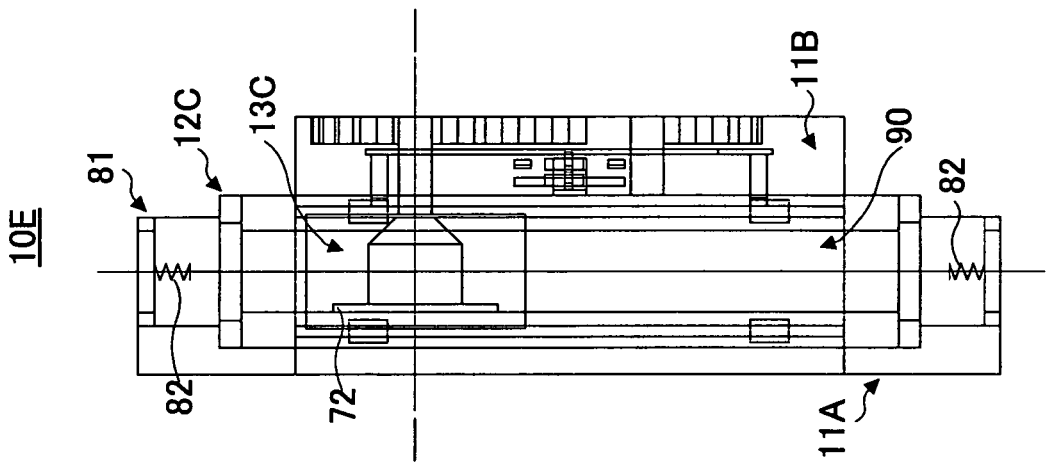
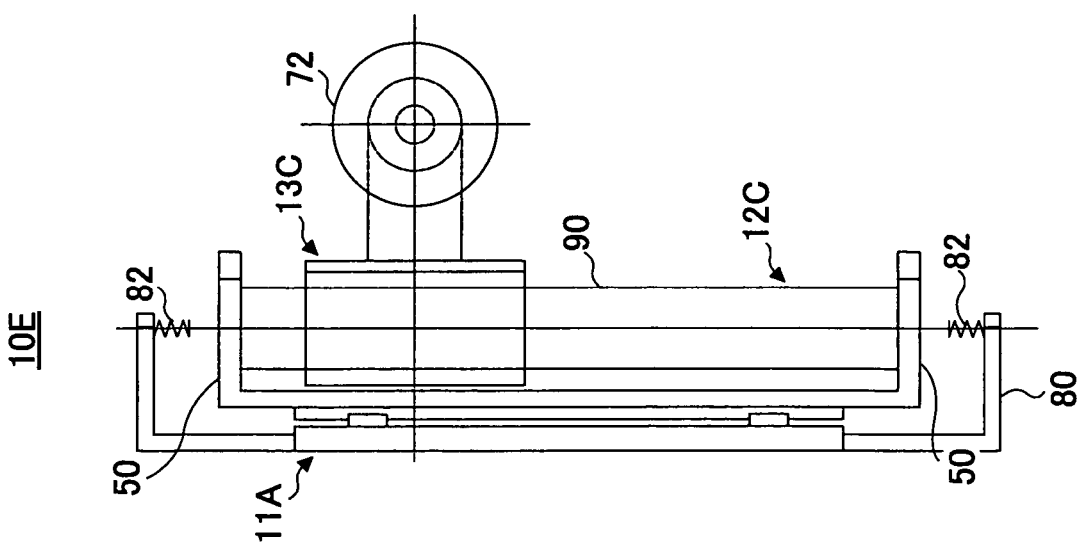

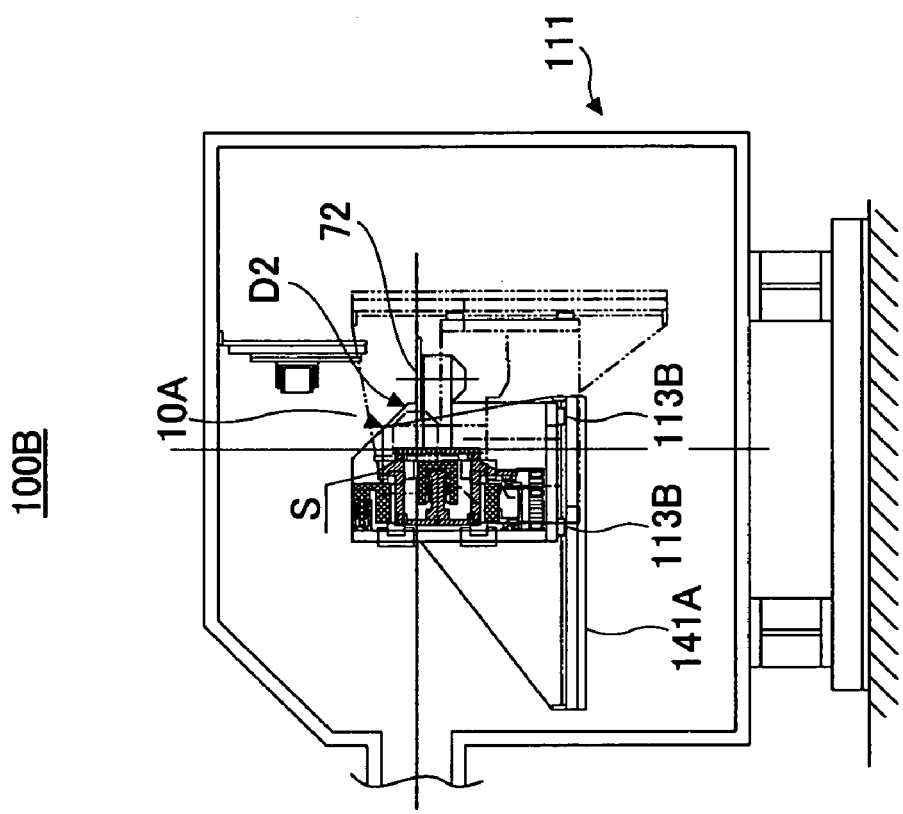
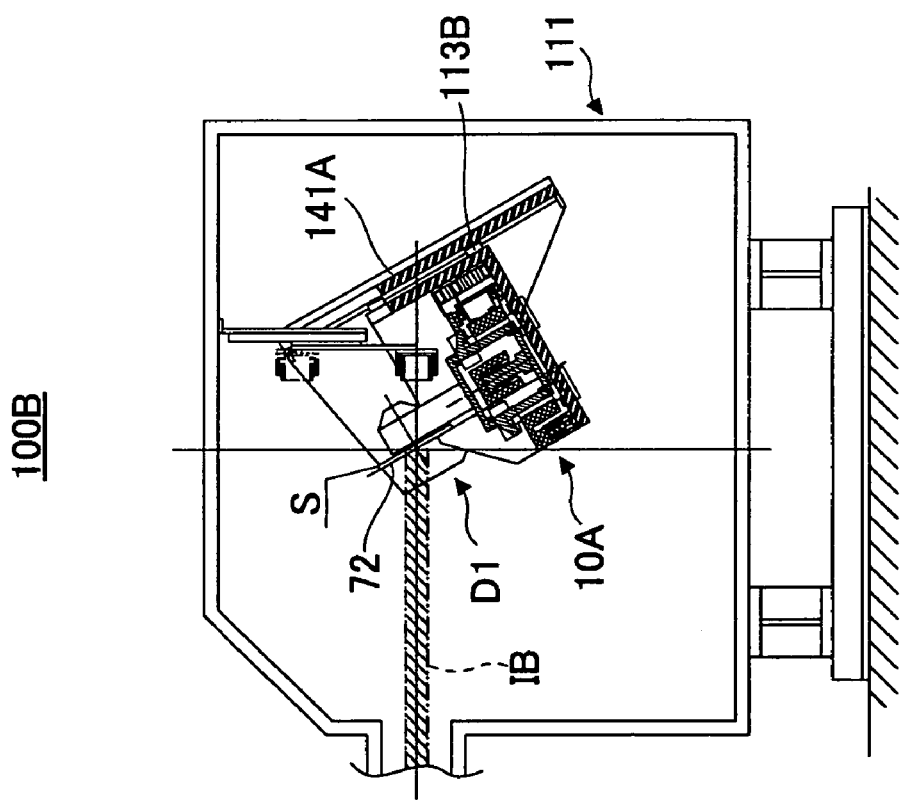

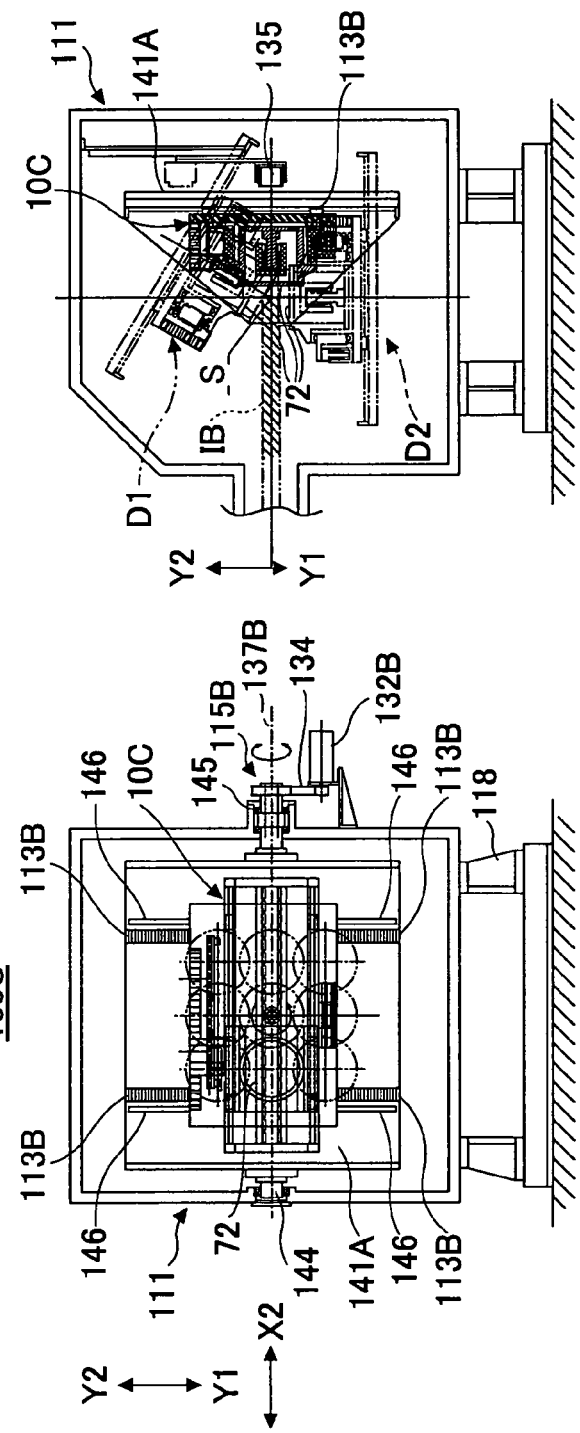
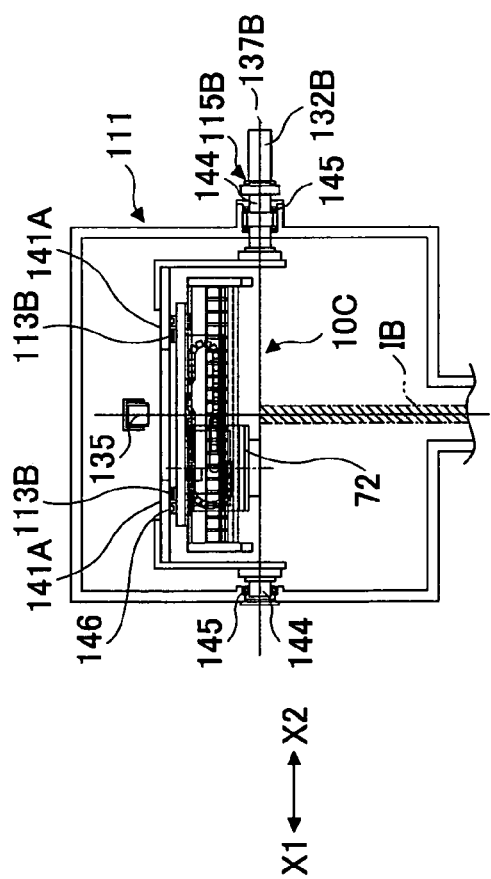
FIG.25A  FIG.25B  FIG.25C

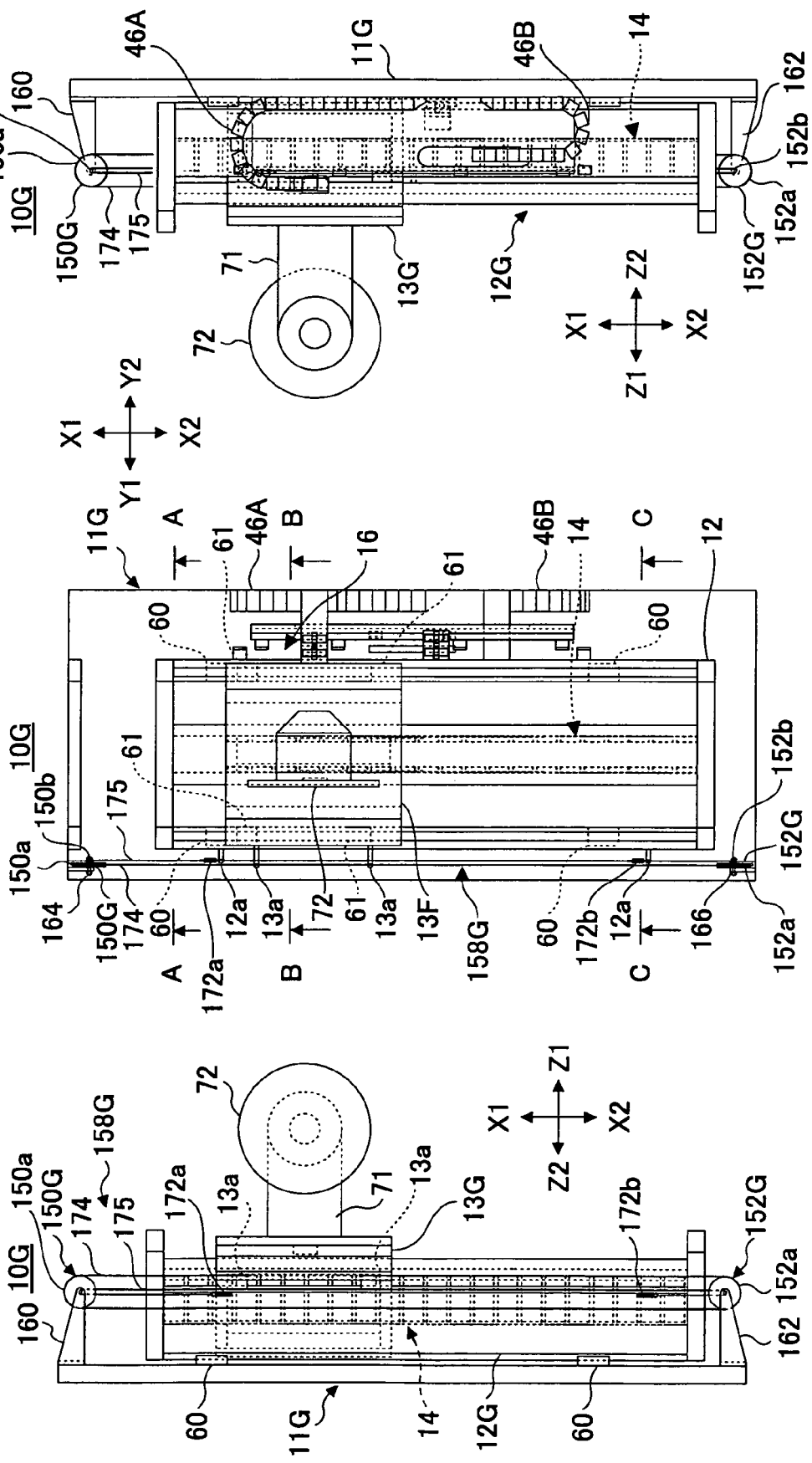

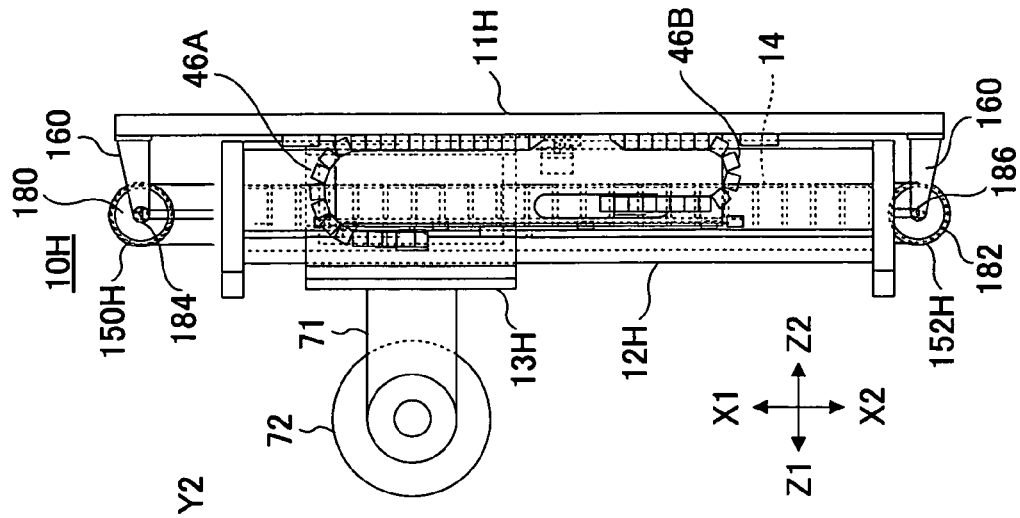
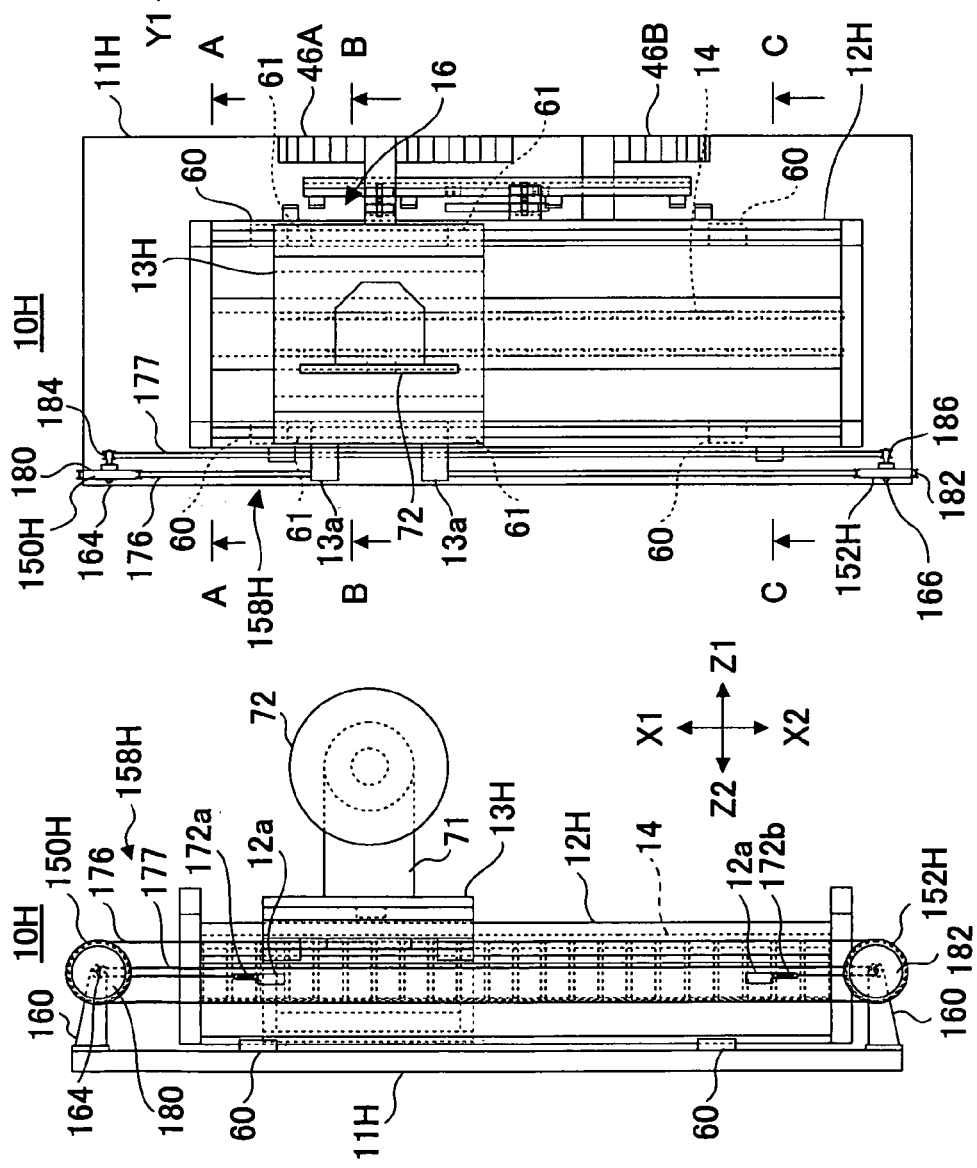

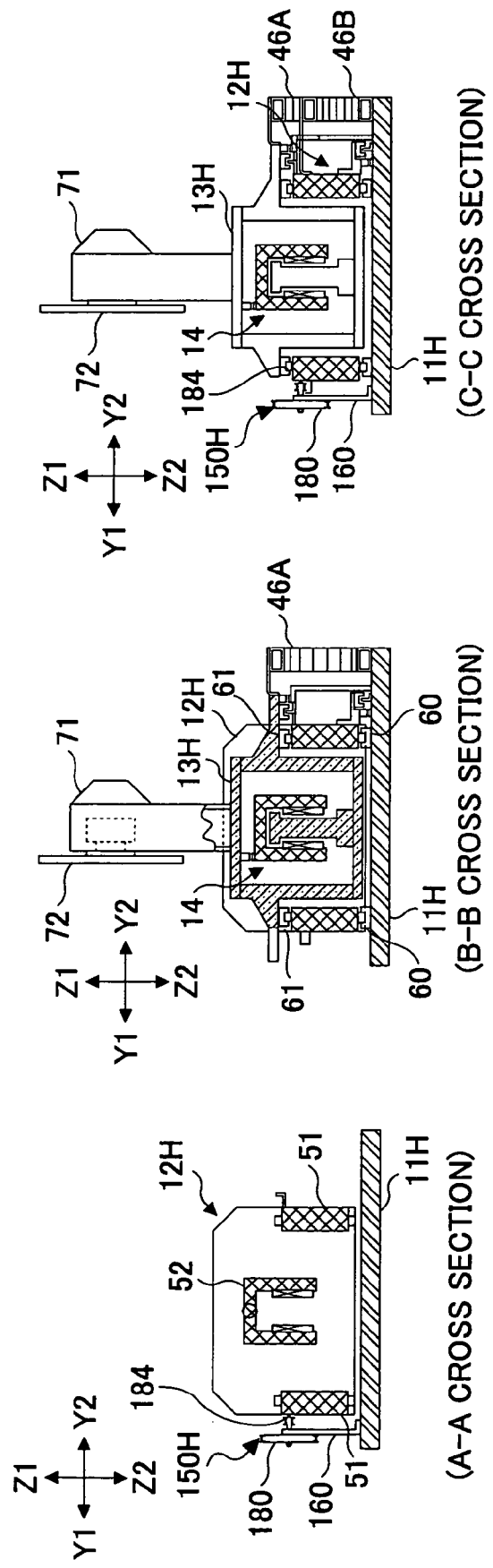

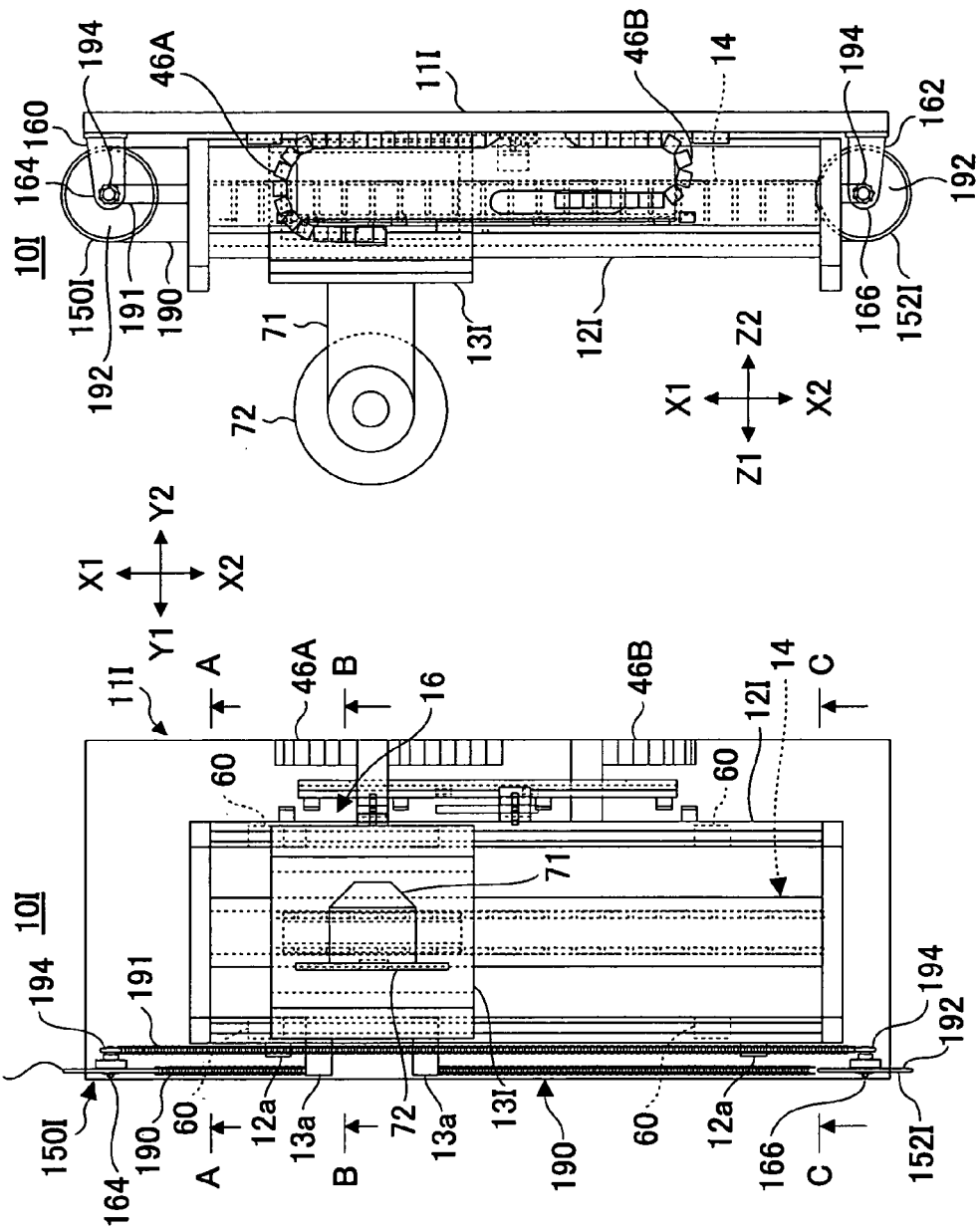

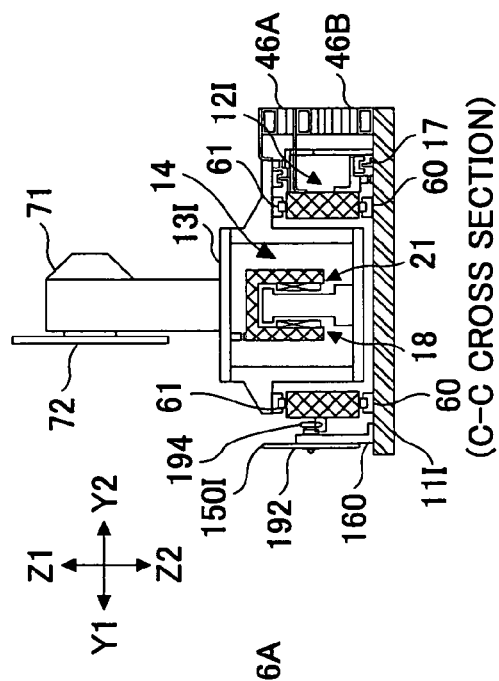
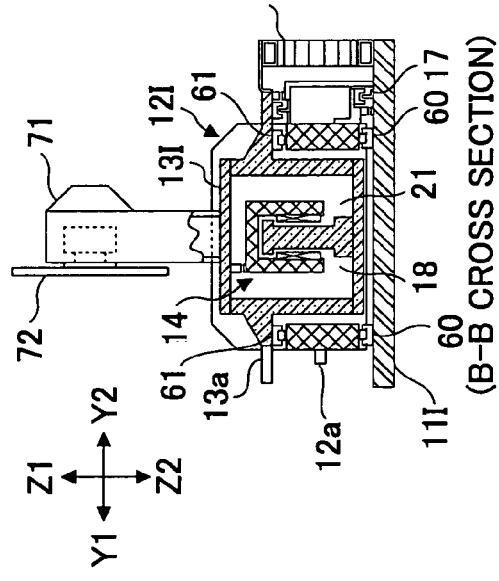
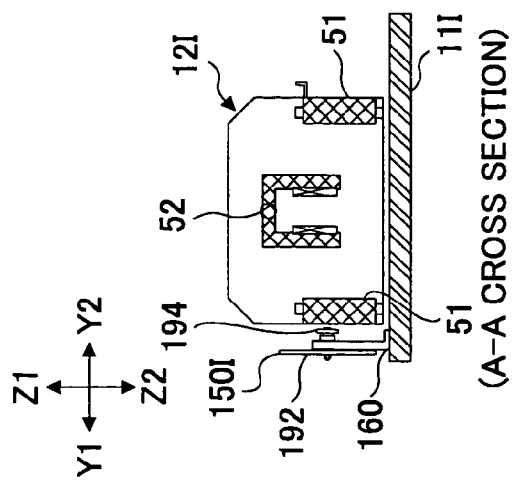

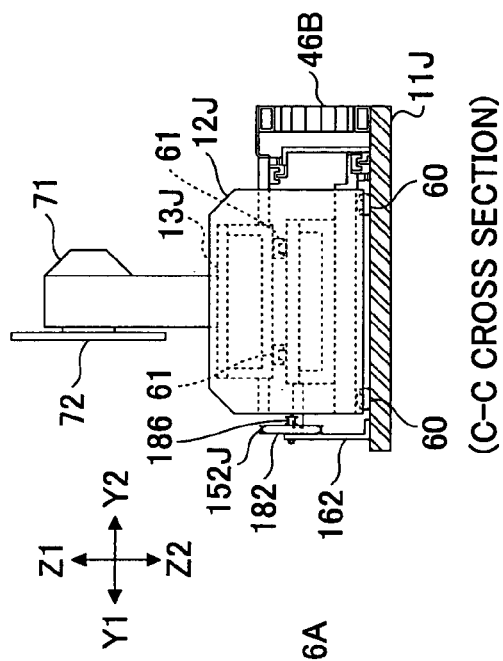
FIG.33F (C-C CROSS SECTION)
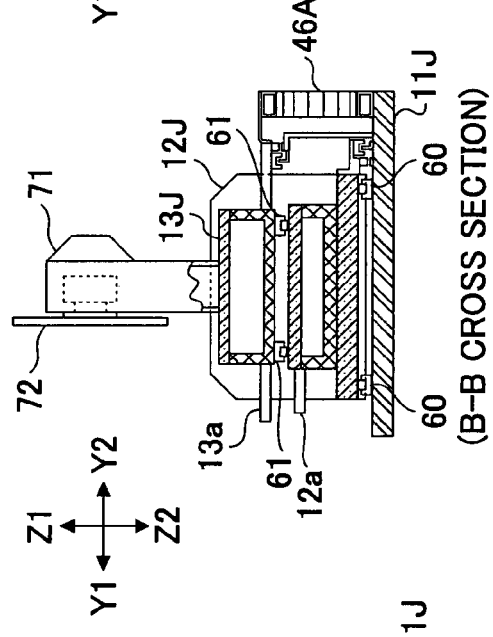
FIG.33E (B-B CROSS SECTION)
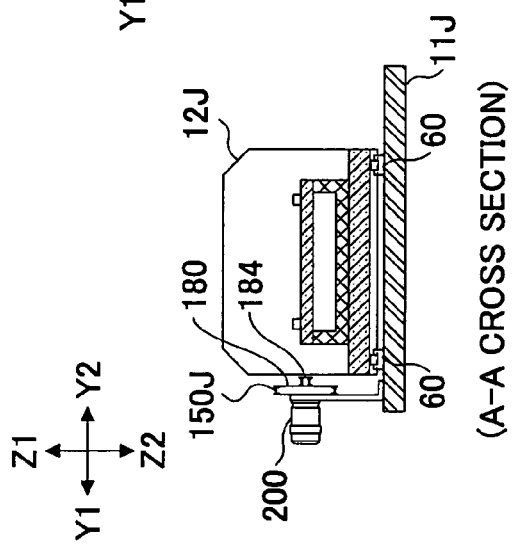
FIG.33D (A-A CROSS SECTION)

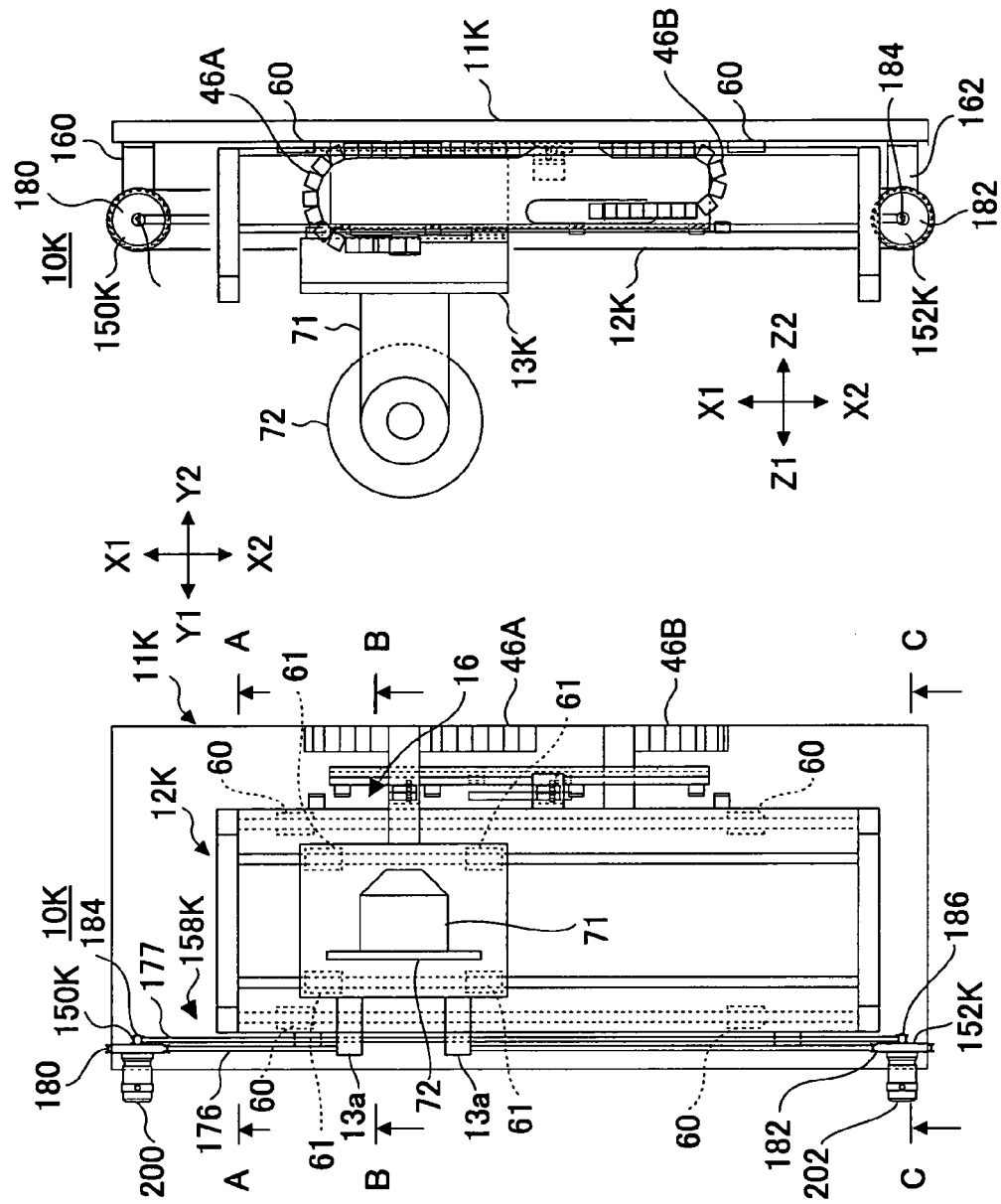

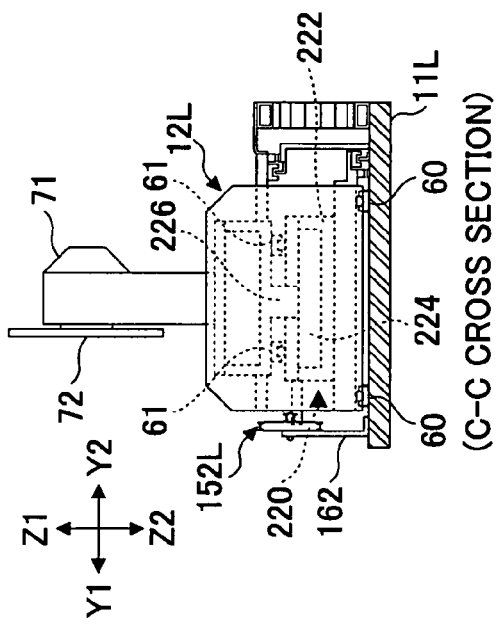
FIG.35D (A-A CROSS SECTION)
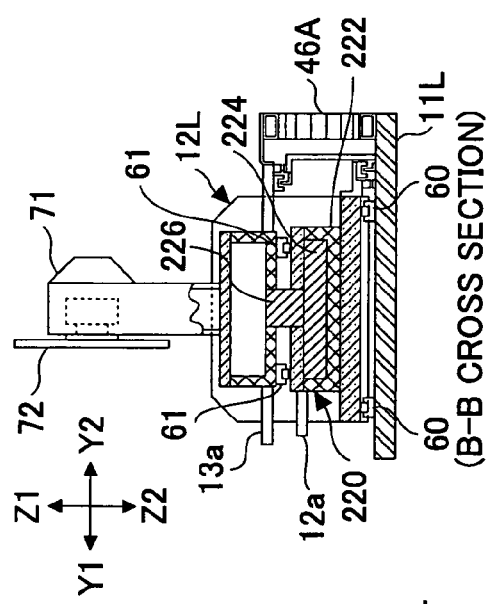
FIG.35E (B-B CROSS SECTION)
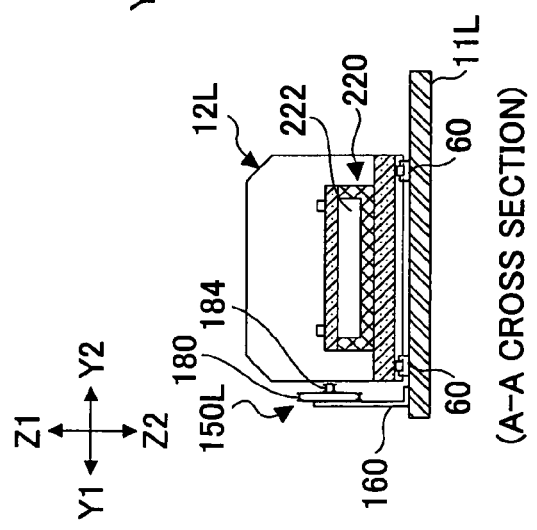
FIG.35F (C-C CROSS SECTION)

METHOD OF CONTROLLING MOVER DEVICE

BACKGROUND OF THE INVENTION

The present invention generally relates to methods of controlling mover devices, cooperative devices of the mover devices, cooperative methods of the mover devices, semiconductor manufacturing devices, liquid crystal manufacturing devices, and mechanical scan ion implantation devices.

More specifically, the present invention is related to a method of controlling a mover device causing a moving force when a processing base reciprocates at high speed, an cooperative device of the mover device, an cooperative method of the mover device, a semiconductor manufacturing device having the cooperative device, a liquid crystal manufacturing device having the cooperative device, and a mechanical scan ion implantation device having the cooperative device.

In semiconductor manufacturing apparatuses and liquid crystal manufacturing apparatuses, a large number of production procedures are normally carried out for each substrate (semiconductor substrate).

More specifically, the following processes are carried out: a sputtering process for physically forming a thin film on a substrate; a CVD sputtering process for forming a thin film on a substrate through chemical vapor deposition; a lithography process for processing the shape of a thin film formed on a substrate; an impurity adding process for adding impurities to a film formed on a substrate; an etching process for etching a thin film formed on a substrate; an electronic beam process for performing minute processing on the surface of a substrate, using electronic beams; an ion beam process for performing minute processing on the surface of a substrate, using ion beams; an ion implanting process for implanting ions, using ion beams; a testing process for conducting a test on a substrate; and an exposure process to be carried out to form a pattern on a substrate.

When any of the above processes is to be carried out, the substrate needs to be precisely positioned in a processing chamber. Therefore, a processor to carry out each of the processes is equipped with a mover device that accurately moves a stage (a processing base) within a processing chamber or a vacuum processing chamber at high speed. Each substrate is attached to the stage (the processing base) prior to an operation.

Especially, in an electronic beam process or an ion beam/ion implanting process that utilizes charged particle beams having small diameters in comparison with the area of a substrate, processing is performed on the entire area of the substrate. Therefore, it is necessary to repeatedly move and stop the processing base in one direction, or to reciprocate the processing base throughout the operation or in a part of the operation.

In recent years, there has been an increasing demand for substrate processing operation with higher throughputs and multi-variation limited-lot production systems. In response to such a demand, it is necessary to move a processing base in one direction at a higher speed or to reciprocate a processing base at a hither speed. In this trend, various mover devices that move a processing base in one direction at high speed or reciprocate a processing base at high speed have been developed.

When a processing base is moved in one direction or reciprocated at high speed, the processing base naturally decelerates and accelerates to reverse the moving direction. At the times of accelerating, decelerating, starting, reversing, and stopping movements, great driving reaction forces are caused in the fixed base that supports the processing base. The driving reaction forces cause impact and vibration that are undesirable for movements of the processing base during operations. So as to eliminate undesirable impact and vibration, structures each having a fixed base formed by a platen with a great mass have been developed. With such structures, driving reaction force generation can be absorbed and restricted. An example of such structures is disclosed in Japanese Unexamined Patent Publication No. 2001-195130.

However, a mover device that exhibits a higher stopping accuracy, moves at a higher speed, and has a processing base with a higher performance, normally has a greater mass than a conventional mover device. As a result, greater driving reaction forces are generated from accelerating, decelerating, starting, reversing, and stopping movements of the processing base of such a mover device. Also, a mover device with a higher performance tends to have a heaver processing base. This also causes greater driving reaction forces. As a result, conventional methods of preventing driving reaction force generation cannot effectively restrict undesirable impact, vibration, and noise in a mover device.

SUMMARY OF THE INVENTION

A general object of the present invention is to provide methods of controlling mover devices, cooperative devices of the mover devices, cooperative methods of the mover devices, semiconductor manufacturing devices, liquid crystal manufacturing devices, and mechanical scan ion implantation devices in which the above disadvantages are eliminated.

A more specific object of the present invention is to provide a method of controlling a mover device, an cooperative device of the mover device, an cooperative method of the mover device, a semiconductor manufacturing device, a liquid crystal manufacturing device, and a mechanical scan ion implantation device, in which a processing base can reciprocate at high speed without undesirable impact, vibration, and noise.

The above objects of the present invention are achieved by a method of controlling a mover device that includes: a fixed base; a movable base that is moveable in a linear direction with respect to the fixed base; a processing base that is movable in a linear direction with respect to the movable base, the linear direction being in parallel with the linear moving direction of the movable base; and a moving force generating unit that is provided between the processing base and the movable base, and forms a main moving unit in cooperation with the processing base and the movable base, the method including the steps of:

generating a moving force from the moving force generating unit to move the processing base with respect to the movable base, thereby moving the processing base with respect to the fixed base as a result of the movement of the processing base with respect to the movable base;

moving the movable base on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base; and controlling the moving velocity of the processing base with respect to the fixed base.

In the above-mentioned method, the mover base may be moveable in the linear direction with respect to the fixed base by a second linear support guide;

the processing base that may be moveable in the linear direction with respect to the movable base by a first linear support guide;

the mover device may include a first precise relative position measuring unit that is provided between the processing base and the fixed base, and a second precise relative position measuring unit that is provided between the movable and the fixed base;

the processing base may move with respect to the fixed base by virtue of a moving force acting in the opposite direction as a result of the movement of the processing base with respect to the movable base;

the moving velocity of the processing base with respect to the fixed base may be controlled by using a detection signal generated from the first precise relative position measuring unit;

the processing base may be supported by the first linear guide so as to move with respect to the fixed base; and the movable base may be supported by the second linear guide so as to move with respect to the processing base.

In the above-mentioned method, the processing base may be supported by the first linear guide so as to move with respect to the fixed base, and the movable base may be supported by the second linear guide so as to move with respect to the fixed base.

By this method, the reaction force caused by the accelerating or decelerating movement of the processing base is absorbed by the movable base, and does not reach the fixed base. Accordingly, even when the processing base is moved at high speed, undesirable vibration is not caused in the mover device at the times of acceleration and deceleration of the processing base. Thus, the processing base can be stably moved with high precision.

The above object of the present invention is also achieved by a method of controlling a mover device that includes: a fixed base; a movable base that is moveable in a linear direction with respect to the fixed base; a processing base that is movable in a linear direction with respect to the movable base, the linear direction being in parallel with the linear moving direction of the movable base; and a moving force generating unit that is provided between the processing base and the movable base, and forms a main moving unit in cooperation with the processing base and the movable base, the method including the steps of:

generating a moving force to accelerate and decelerate the processing base with respect to the movable base, so that the processing base is moved with respect to the movable base, and, as a result, the processing base is moved with respect to the fixed base;

moving the movable base on the fixed base in the opposite direction to the moving direction of the processing base by virtue of a reaction force caused by the moving force generated from the moving force generating unit to move the processing base;

converting the reaction force caused by the movement of the processing base into linear-direction inertial movements of the movable base, so that the processing base and the movable base linearly move with respect to each other;

controlling the moving velocity of the processing base and the movable base that interactively move on the fixed base in linear directions, wherein the linear-direction inertial movement of the movable base caused by the reaction force generated from the movement of the processing base includes accelerating or decelerating movements and a uniform velocity movement.

Disturbance correction controls of the movable base and the processing base may be independently performed by the moving force generating unit and the auxiliary driving unit.

The movable base and the processing base may be controlled so that moving time of acceleration and deceleration motions and a uniform velocity motion of the processing base and the movable base is same and constant.

The movable base and the processing base may be set so that moving time of acceleration and deceleration motions and a uniform velocity motion of the processing base and the movable base is same and constant by a position-time control; and the movable base and the processing base may be driven by a control whereby the movable base and the processing base are synchronized in intervals of the acceleration and deceleration motions and the uniform velocity motion.

By this method, the reaction force caused by the acceleration or deceleration movement of the processing base can be completely absorbed. Also, cogging force generation can be prevented.

Accordingly, the auxiliary driving unit can smoothly move the processing base and the movable base with high precision. Furthermore, the moving velocity of the processing base can be adjusted to a predetermined uniform velocity promptly, and the processing base can be stopped promptly. Accordingly, the uniform velocity region can be widened. When the processing base and the movable base change moving states at the same time (for example, from an accelerating state to a uniform velocity moving state), the processing base and the movable base can interact with each other so as to prevent a positional deviation.

The velocity controlling unit may control the processing base to reciprocate in a predetermined range.

The velocity controlling unit may control the processing base to reciprocate in a predetermined range in such a manner that the processing base moves in both directions at the same velocity in each uniform velocity reciprocation movement.

The velocity controlling unit may repeat acceleration control, uniform velocity control, and deceleration control, while moving the processing base with respect to the fixed base.

Since the processing base reciprocates in the predetermined range, it is possible to stably reciprocate the processing base. Furthermore, it is possible to perform consecutive processing operations on the processing base when an object to be processed (such as a wafer) is attached to the processing base. In addition, when the object to be processed (such as the wafer) is attached to the processing base, processing can be performed on the processing base in the uniform velocity region. Thus, the processing to be performed on the processing base can be easily controlled.

The above object of the present invention is also achieved by an cooperative method of a mover device that includes: a fixed base; a movable base that is moved in a linear direction with respect to the fixed base by a second linear support guide; a processing base that is moved in a linear direction with respect to the movable base by a first linear support guide, the linear direction being in parallel with the linear moving direction of the movable base; a first precise relative position measuring unit that is provided between the processing base and the fixed base; a second precise relative position measuring unit that is provided between the movable base and the fixed base; and a moving force generating unit that is provided between the processing base and the movable base, and forms a main moving unit in cooperation with the processing base and the movable base;

the method including the steps of:

generating a moving force from the moving force generating unit to move the processing base with respect to the movable base, thereby moving the processing base with respect to the fixed base by virtue of a moving force acting in the opposite direction as a result of the movement of the processing base with respect to the movable base;

moving the movable base on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base; and controlling the moving velocity of the processing base with respect to the fixed base, using a detection signal generated from the first precise relative position measuring unit;

wherein the mover device further includes a first belt connecting one end and the other end of the processing base, and a second belt connecting one end and the other end of the movable base;

the first and second belts are connected by pulley step parts for the processing base and the movable base, the pulley step parts including two-step pulleys provided one at each end part of the fixed base;

the pulley step parts are formed as pulley steps whose corresponding diameters for an inverse ratio of the ratio of masses of the processing base and the movable base; and the first belt and the second belt wind around the pulley step parts in opposite directions.

The above object of the present invention is also achieved by an cooperative device of a mover device that includes: a fixed base; a movable base that is moved in a linear direction with respect to the fixed base by a second linear support guide; a processing base that is moved in a linear direction with respect to the movable base by a first linear support guide, the linear direction being in parallel with the linear moving direction of the movable base; a first precise relative position measuring unit that is provided between the processing base and the fixed base; a second precise relative position measuring unit that is provided between the movable base and the fixed base; and a moving force generating unit that is provided between the processing base and the movable base, and forms a main moving unit in cooperation with the processing base and the movable base;

wherein a moving force is generated from the moving force generating unit to move the processing base with respect to the movable base, thereby the processing base is moved with respect to the fixed base by virtue of a moving force acting in the opposite direction as a result of the movement of the processing base with respect to the movable base;

the movable base is moved on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base;

the moving velocity of the processing base with respect to the fixed base is controlled, using a detection signal generated from the first precise relative position measuring unit;

the mover device further includes a first belt connecting one end and the other end of the processing base, and a second belt connecting one end and the other end of the movable base;

the first and second belts are connected by pulley step parts for the processing base and the movable base, the pulley step parts including two-step pulleys provided one at each end part of the fixed base;

the pulley step parts are formed as pulley steps whose corresponding diameters form an inverse ratio of the ratio of masses of the processing base and the movable base; and the first belt and the second belt wind around the pulley step parts in opposite directions.

Thus, the first belt connecting both ends of the processing base and the second belt connecting both ends of the movable base wind around the pulley step parts in opposite directions. Accordingly, even when the processing base is moved at high speed, undesirable vibration is not caused in the mover device at the times of acceleration and deceleration of the processing base. Thus, the processing base can be stably moved with high precision.

The processing base and the movable base may be driven by a fluid actuator using fluid as transfer means.

Since the processing base and the movable base are driven by the fluid actuator using fluid as the transfer means, even when the processing base is moved at high speed, undesirable vibration is not caused in the mover device at the times of acceleration and deceleration of the processing base. Thus, the processing base can be stably moved with high precision.

An excess tension adjust member may be provided at both ends of the processing base and both ends of the movable base so as to adjust excess tension between the first belt and the second belt.

Thus, since the excess tension adjust member is provided at the first and second belts, the tensions acting at the first and second belts are absorbed by the excess tension adjust member. Accordingly, even when the processing base is moved at high speed, undesirable vibration is not caused in the mover device at the times of acceleration and deceleration of the processing base. Thus, the processing base can be stably moved with high precision.

An adjustment mechanism may be provided so as to adjust tensions of the first belt and the second belt.

Thus, since the adjustment mechanism is provided so as to adjust tensions of the first belt and the second belt, the tensions acting at the first and second belts are properly adjusted. Accordingly, even when the processing base is moved at high speed, undesirable vibration is not caused in the mover device at the times of acceleration and deceleration of the processing base. Thus, the processing base can be stably moved with high precision.

The cooperative device of the mover device may further include:

an actuator configured to rotate the two-step pulleys, wherein the processing base may be moved with respect to the movable base by the moving force generation unit.

Thus, the actuator is provided to rotate two-step pulleys, and the processing base is moved with respect to the movable base by the moving force generation unit. Accordingly, even when the processing base is moved at high speed, undesirable vibration is not caused in the mover device at the times of acceleration and deceleration of the processing base. Thus, the processing base can be stably moved with high precision.

The cooperative device including the mover device may be provided in a vertical state; and the processing base and the movable base may be moved in a vertical direction.

Since the cooperative device including the mover device is provided in the vertical state, and the processing base and the movable base are moved in the vertical direction, even when the processing base is moved at high speed by using the masses of the processing base and the movable base, undesirable vibration is not caused in the mover device at the times of acceleration and deceleration of the processing base. Thus, the processing base can be stably moved with high precision.

The above object of the present invention is achieved by a semiconductor manufacturing device having an cooperative device including a mover device that includes: a fixed base; a movable base that is moved in a linear direction with respect to the fixed base by a second linear support guide; a processing base that is moved in a linear direction with respect to the movable base by a first linear support guide, the linear direction being in parallel with the linear moving direction of the movable base; a first precise relative position measuring unit that is provided between the processing base and the fixed base; a second precise relative position measuring unit that is provided between the movable base and the fixed base; and a moving force generating unit that is provided between the processing base and the movable base, and forms a main moving unit in cooperation with the processing base and the movable base;

wherein a moving force is generated from the moving force generating unit to move the processing base with respect to the movable base, thereby the processing base is moved with respect to the fixed base by virtue of a moving force acting in the opposite direction as a result of the movement of the processing base with respect to the movable base;

the movable base is moved on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base;

the moving velocity of the processing base with respect to the fixed base is controlled, using a detection signal generated from the first precise relative position measuring unit;

the mover device further includes a first belt connecting one end and the other end of the processing base, and a second belt connecting one end and the other end of the movable base;

the first and second belts are connected by pulley step parts for the processing base and the movable base, the pulley step parts including two-step pulleys provided one at each end part of the fixed base;

the pulley step parts are formed as pulley steps whose corresponding diameters form an inverse ratio of the ratio of masses of the processing base and the movable base; and the first belt and the second belt wind around the pulley step parts in opposite directions.

According to this semiconductor manufacturing device, it is possible to implant ions in the wafer as a processed substrate with high precision.

The above object of the present invention is achieved by a liquid crystal device having an cooperative device including a mover device that includes: a fixed base; a movable base that is moved in a linear direction with respect to the fixed base by a second linear support guide; a processing base that is moved in a linear direction with respect to the movable base by a first linear support guide, the linear direction being in parallel with the linear moving direction of the movable base; a first precise relative position measuring unit that is provided between the processing base and the fixed base; a second precise relative position measuring unit that is provided between the movable base and the fixed base; and a moving force generating unit that is provided between the processing base and the movable base, and forms a main moving unit in cooperation with the processing base and the movable base;

wherein a moving force is generated from the moving force generating unit to move the processing base with respect to the movable base, thereby the processing base is moved with respect to the fixed base by virtue of a moving force acting in the opposite direction as a result of the movement of the processing base with respect to the movable base;

the movable base is moved on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base;

the moving velocity of the processing base with respect to the fixed base is controlled, using a detection signal generated from the first precise relative position measuring unit;

the mover device further includes a first belt connecting one end and the other end of the processing base, and a second belt connecting one end and the other end of the movable base;

the first and second belts are connected by pulley step parts for the processing base and the movable base, the pulley step parts including two-step pulleys provided one at each end part of the fixed base;

the pulley step parts are formed as pulley steps whose corresponding diameters form an inverse ratio of the ratio of masses of the processing base and the movable base; and the first belt and the second belt wind around the pulley step parts in opposite directions.

According to this crystal liquid manufacturing device, it is possible to implant ions in the liquid crystal substrate as a processed substrate with high precision.

The above object of the present invention is also achieved by a one-axis mechanical scan ion implantation device having an cooperative device including a mover device that includes: a fixed base; a movable base that is moved in a linear direction with respect to the fixed base by a second linear support guide; a processing base that is moved in a linear direction with respect to the movable base by a first linear support guide, the linear direction being in parallel with the linear moving direction of the movable base; a first precise relative position measuring unit that is provided between the processing base and the fixed base; a second precise relative position measuring unit that is provided between the movable base and the fixed base; and a moving force generating unit that is provided between the processing base and the movable base, and forms a main moving unit in cooperation with the processing base and the movable base;

wherein a moving force is generated from the moving force generating unit to move the processing base with respect to the movable base, thereby the processing base is moved with respect to the fixed base by virtue of a moving force acting in the opposite direction as a result of the movement of the processing base with respect to the movable base;

the movable base is moved on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base;

the moving velocity of the processing base with respect to the fixed base is controlled, using a detection signal generated from the first precise relative position measuring unit;

the mover device further includes a first belt connecting one end and the other end of the processing base, and a second belt connecting one end and the other end of the movable base;

the first and second belts are connected by pulley step parts for the processing base and the movable base, the pulley step parts including two-step pulleys provided one at each end part of the fixed base, the pulley step parts are formed as pulley steps whose corresponding diameters form an inverse ratio of the ratio of masses of the processing base and the movable base, and the first belt and the second belt wind around the pulley step parts in opposite directions.

According to this one-axis mechanical scan ion implantation device, it is possible to implant ions in the processed substrate with high precision.

The above object of the present invention is achieved by a two-axis mechanical scan ion implantation device having an cooperative device including a mover device that includes: a fixed base; a movable base that is moved in a linear direction with respect to the fixed base by a second linear support guide; a processing base that is moved in a linear direction with respect to the movable base by a first linear support guide, the linear direction being in parallel with the linear moving direction of the movable base; a first precise relative position measuring unit that is provided between the processing base and the fixed base; a second precise relative position measuring unit that is provided between the movable base and the fixed base; and a moving force generating unit that is provided between the processing base and the movable base, and forms a main moving unit in cooperation with the processing base and the movable base;

wherein a moving force is generated from the moving force generating unit to move the processing base with respect to the movable base, thereby the processing base is moved with respect to the fixed base by virtue of a moving force acting in the opposite direction as a result of the movement of the processing base with respect to the movable base;

the movable base is moved on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base;

the moving velocity of the processing base with respect to the fixed base is controlled, using a detection signal generated from the first precise relative position measuring unit;

the mover device further includes a first belt connecting one end and the other end of the processing base, and a second belt connecting one end and the other end of the movable base;

the first and second belts are connected by pulley step parts for the processing base and the movable base, the pulley step parts including two-step pulleys provided one at each end part of the fixed base, the pulley step parts are formed as pulley steps whose corresponding diameters form an inverse ratio of the ratio of masses of the processing base and the movable base, and the first belt and the second belt wind around the pulley step parts in opposite directions.

According to this two axes mechanical scan ion implantation device, it is possible to implant ions in the processed substrate with high precision.

In the method of controlling the mover device, the moving force generating unit may perform asynchronous driving so as to shift timings of pulse driving of the main moving device and pulse driving of the auxiliary driving unit to achieve non-driving interference.

Since the moving force generating unit performs asynchronous driving so as to shift the timings of pulse driving of the main moving device and pulse driving of the auxiliary driving unit to achieve non-driving interference, even when the processing base is moved at high speed, undesirable vibration is not caused in the mover device at the times of acceleration and deceleration of the processing base. Thus, the processing base can be stably moved with high precision.

In the control method of the mover device, the auxiliary driving unit may be provided between the fixed base and the movable base;

the movable base with respect to the fixed base may be controlled by the auxiliary driving unit so as to have a uniform velocity in a uniform velocity control interval by driving of the moving force generating unit of the processing base; and a gap of the movable base against the fixed base may be adjusted by the auxiliary driving unit in the acceleration and deceleration intervals.

Thus, the gap of the movable base against the fixed base is adjusted by the auxiliary driving unit in the acceleration and deceleration intervals. Hence, even when the moving states of the processing base and the movable base are simultaneously changed, it is possible to prevent the generation of the position gap by mutual action of the processing base and the movable base.

The above object of the present invention is also achieved by a method of controlling a mover device that includes: a fixed base; a movable base that is moved in a linear direction with respect to the fixed base by a second linear support guide; a processing base that is moved in a linear direction with respect to the movable base by a first linear support guide, the linear direction being in parallel with the linear moving direction of the movable base; a first precise relative position measuring unit that is provided between the processing base and the fixed base; a second precise relative position measuring unit that is provided between the movable base and the fixed base; and a moving force generating unit that is provided between the processing base and the movable base, and forms a main moving unit in cooperation with the processing base and the movable base;

the method including the steps of:

generating a moving force from the moving force generating unit to move the processing base with respect to the movable base, thereby moving the processing base with respect to the fixed base by virtue of a moving force acting in the opposite direction as a result of the movement of the processing base with respect to the movable base; and moving the movable base on the fixed base in the opposite direction to the moving direction of the processing base by virtue of a reaction force caused by the moving force generated from the moving force generating unit to move the processing base, so that the movable base moves in the opposite direction to the moving direction of the processing base on the fixed base;

wherein the processing base with respect to the movable base is velocity-controlled by a detection signal of a third precise relative position measuring unit provided between the processing base and the movable base; and a moving velocity of the processing base with respect to the fixed base in the uniform velocity region is correction-controlled by the first precise relative position measuring unit.

Thus, the processing base with respect to the movable base is velocity-controlled by the detection signal of the third precise relative position measuring unit provided between the processing base and the movable base, and the moving velocity of the processing base with respect to the fixed base in the uniform velocity region is correction-controlled by the first precise relative position measuring unit. Accordingly, even when the processing base is moved at high speed, undesirable vibration is not caused in the mover device at the times of acceleration and deceleration of the processing base. Thus, the processing base can be stably moved with high precision.

In the control method of the mover device, starting friction, dynamic friction, and actual driving torque diagram of the movable base and the processing base may be preliminarily calculated; and the moving force generating unit may be controlled by a preliminary correction trapezoid so that the processing base has a uniform velocity with respect to the fixing base.

Thus, the starting friction, dynamical friction, and actual driving torque diagram of the movable base and the processing base are preliminarily calculated, and the moving force generating unit is controlled by the preliminary correction trapezoid so that the processing base has a uniform velocity with respect to the fixed base. Hence, it is possible to reciprocate the processing base more stably.

The movable base and the processing base may be reciprocated designated times in advance, so that moving data obtained from the preliminary reciprocation are sampled, main sampling correction trapezoid data may be obtained from the data having been sampled, and the moving force generating unit may be program-controlled so that the velocity of the processing base has a uniform velocity with respect to the fixed base.

Thus, the movable base and the processing base are reciprocated designated times in advance, so that moving data obtained from the preliminary reciprocation are been sampled, the main sampling correction trapezoid data are obtained from the data having been sampled, and the moving force generating unit is program-controlled so that the processing base has a uniform velocity with respect to the fixed base. Accordingly, even when the processing base is moved at high speed, undesirable vibration is not caused in the mover device at the times of acceleration and deceleration of the processing base. Thus, the processing base can be stably moved with high precision.

The above and other objects and features of the present invention will become more apparent from the following description taken in conjunction with the accompanying drawings.

BRIEF DESCRIPTION OF THE DRAWINGS

FIG. 1A is a left side view of a mover device in accordance with a first embodiment of the present invention;

FIG. 1B is a plan view of the mover device in accordance with the first embodiment;

FIG. 1C is a right side view of the mover device in accordance with the first embodiment;

FIG. 1D is a section view of the mover device, taken along the line A-A of FIG. 1B;

FIG. 1E is a section view of the mover device, taken along the line B-B of FIG. 1B;

FIG. 1F is a section view of the mover device, taken along the line C-C of FIG. 1B;

FIGS. 18A through 18F illustrate the hardware structure of a mover device in accordance with a second embodiment of the present invention;

FIGS. 20A through 20C illustrate the hardware structure of a mover device in accordance with a fourth embodiment of the present invention;

FIGS. 21A through 21C illustrate the hardware structure of a mover device in accordance with a fifth embodiment of the present invention;

FIGS. 24A and 24B illustrate operations of the ion implanter apparatus in accordance with the seventh embodiment;

FIG. 25A is a plan view illustrating the hardware structure of an ion implanter apparatus in accordance with an eighth embodiment of the present invention;

FIG. 25B is a front view illustrating the ion implanter apparatus in accordance with the eighth embodiment;

FIG. 25C is a right side view illustrating the ion implanter apparatus in accordance with the eighth embodiment;

FIG. 28A is a left side view of a mover device in accordance with a tenth embodiment;

FIG. 28B is a plan view of the mover device in accordance with the tenth embodiment;

FIG. 28C is a right side view of the mover device in accordance with the tenth embodiment;

FIG. 29A is a left side view of a mover device in accordance with an eleventh embodiment;

FIG. 29B is a plan view of the mover device in accordance with the eleventh embodiment;

FIG. 29C is a right side view of the mover device in accordance with the eleventh embodiment;

FIG. 29D is a section view of the mover device, taken along the line A-A of FIG. 29B;

FIG. 29E is a section view of the mover device, taken along the line B-B of FIG. 29B;

FIG. 29F is a section view of the mover device, taken along the line C-C of FIG. 29B;

FIG. 31A is a left side view of a mover device in accordance with a twelfth embodiment;

FIG. 31B is a plan view of the mover device in accordance with the twelfth embodiment;

FIG. 31C is a right side view of the mover device in accordance with the twelfth embodiment;

FIG. 31D is a section view of the mover device, taken along the line A-A of FIG. 31B;

FIG. 31E is a section view of the mover device, taken along the line B-B of FIG. 31B;

FIG. 31F is a section view of the mover device, taken along the line C-C of FIG. 31B;

FIG. 33D is a section view of the mover device, taken along the line A-A of FIG. 33B;

FIG. 33E is a section view of the mover device, taken along the line B-B of FIG. 33B;

FIG. 33F is a section view of the mover device, taken along the line C-C of FIG. 33B;

FIG. 34A is a left side view of a mover device in accordance with a fourteenth embodiment;

FIG. 34B is a plan view of the mover device in accordance with the fourteenth embodiment;

FIG. 34C is a right side view of the mover device in accordance with the fourteenth embodiment;

FIG. 35D is a section view of the mover device, taken along the line A-A of FIG. 35B;

FIG. 35E is a section view of the mover device, taken along the line B-B of FIG. 35B; and FIG. 35F is a section view of the mover device, taken along the line C-C of FIG. 35B.

DESCRIPTION OF THE PREFERRED EMBODIMENTS

The following is a description of embodiments of the present invention, with reference to the accompanying drawings.

First Embodiment

Figure 2A:
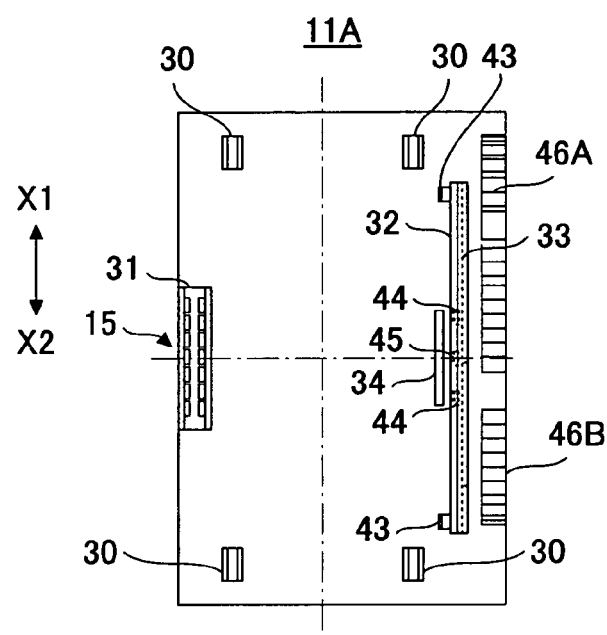
FIG. 2A is a plan view of the fixed base of the mover device in accordance with the first embodiment.
Figure 2B:
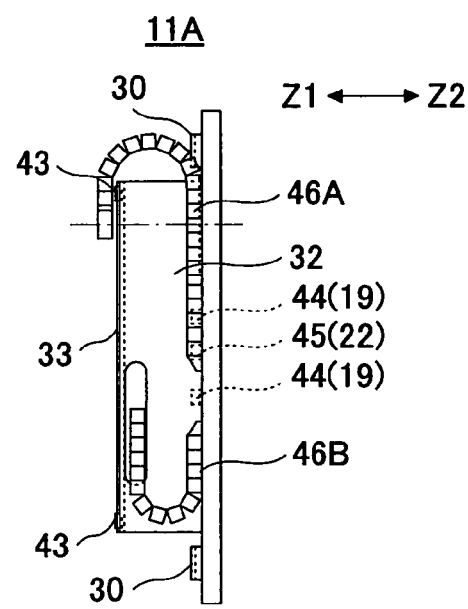
FIG. 2B is a right side view of the fixed base of the mover device in accordance with the first embodiment.
Figure 2C:
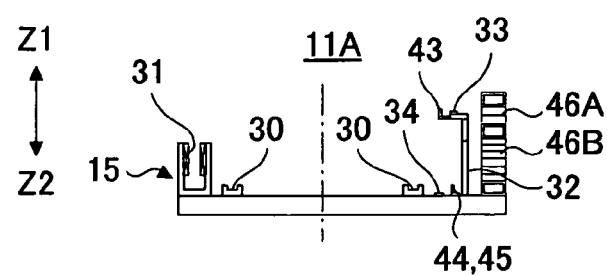
FIG. 2C is a front view of the fixed base of the mover device in accordance with the first embodiment.
Figure 3A:
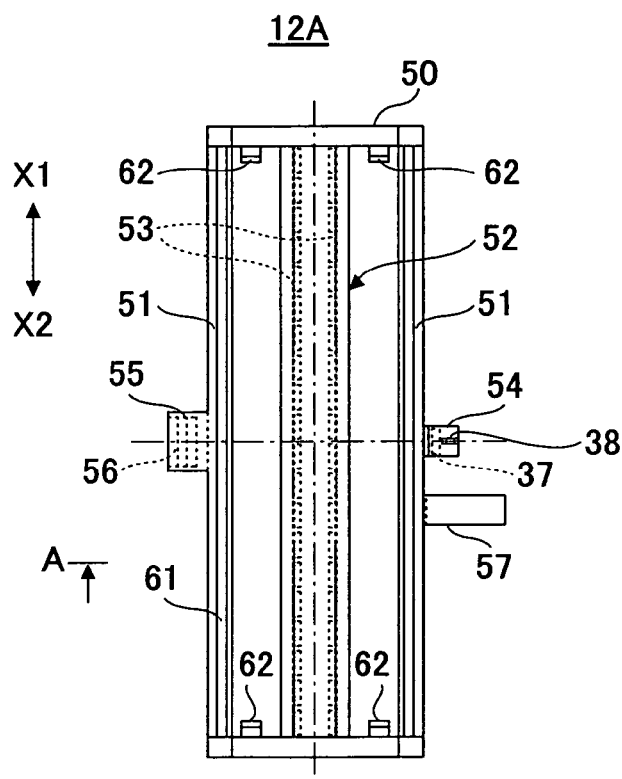
FIG. 3A is a plan view of the movable base of the mover device in accordance with the first embodiment.
Figure 3B:
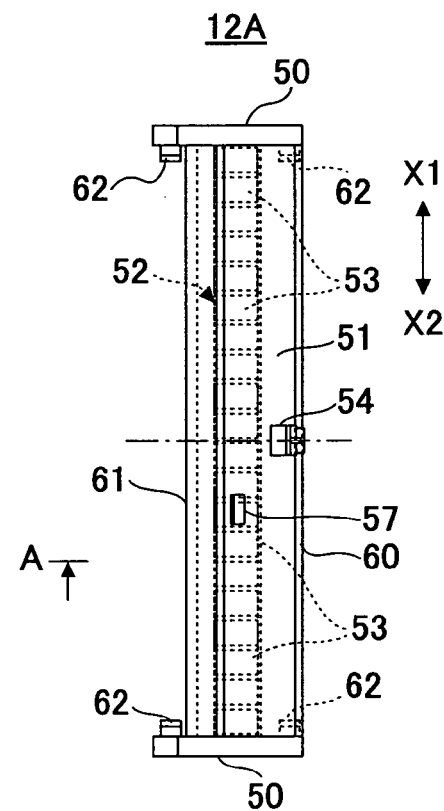
FIG. 3B is a right side view of the movable base of the mover device in accordance with the first embodiment.
Figure 3C:
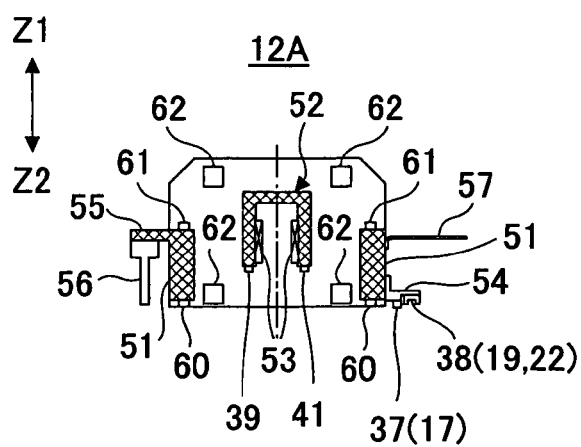
FIG. 3C is a section view of the movable device, taken along the line A-A of FIG. 3A.
Figure 4A:
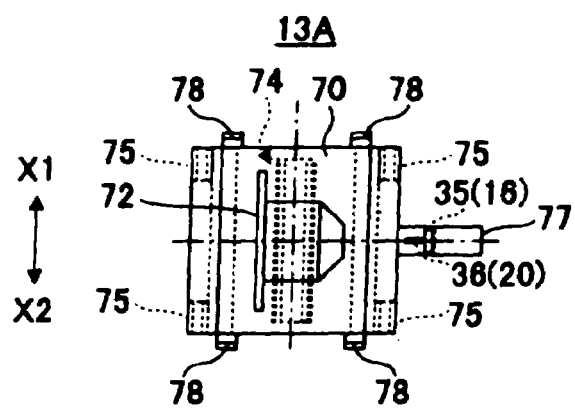
FIG. 4A is a plan view of the processing base of the mover device in accordance with the first embodiment.
Figure 4B:
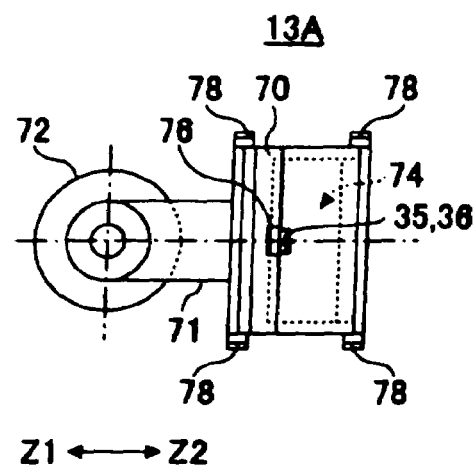
FIG. 4B is a right side view of the processing base of the mover device in accordance with the first embodiment.
Figure 4C:
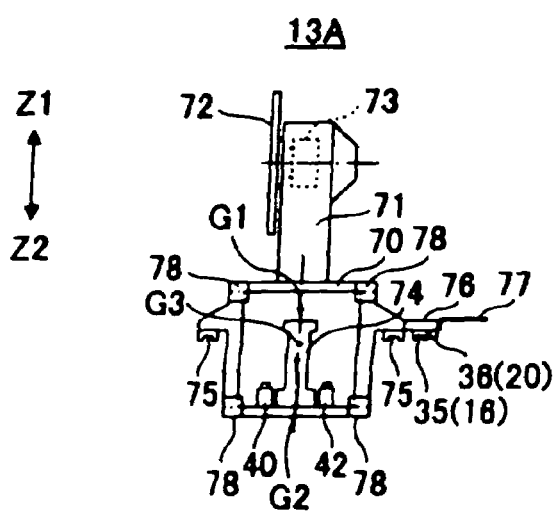
FIG. 4C is a front view of the processing base of the mover device in accordance with the first embodiment.

FIGS. 1A through 4C illustrate the hardware structure of a mover device 10A in accordance with a first embodiment of the present invention. FIGS. 1A through 1F illustrate the entire structure of the mover device 10A. FIGS. 2A through 2C illustrate a fixed base 11A. FIGS. 3A through 3C illustrate a movable base 12A. FIGS. 4A through 4C illustrate a processing base 13A.

As shown in FIGS. 1A through 1F, the mover device 10A includes the fixed base 11A, the movable base 12A, the processing base 13A, a main linear motor 14, and a sub linear motor 15. The mover device 10A linearly moves the processing base 13A in a reciprocation manner in the directions of the arrows X1 and X2 shown in the drawings. This is carried out in accordance with a control operation performed by a later described control device 80 (see FIG. 6).

The fixed base 11A will be first described. As shown in FIGS. 1A through 1F and FIGS. 2A through 2C, the fixed base 11A has a linear guide block 30 in the vicinity of each of the four corners. The linear guide blocks 30 are to be engaged with first linear guide rails 60 formed in the movable base 12A that will be described later. With the linear guide blocks 30 being engaged with the first linear guide rails 60, the movable base 12A can be movable in the directions of the arrows X1 and X2 with respect to the fixed base 11A.

Sub linear motor magnets 31 that form the sub linear motor 15 are provided at the center left in the fixed base 11A shown in FIG. 2A. The sub linear motor magnets 31 are provided at predetermined intervals, and are divided into two rows, with a space being formed between the two rows. A sub linear motor coil unit 56 (provided on the movable base 12A) that is a part of the sub linear motor 15 is inserted in the space. Here, the sub linear motor coil unit 56 is movable in the directions of the arrows X1 and X2.

At the center right in the fixed base 11A shown in FIG. 2A, a holder board 32, a F-P (Fixed-Processing) linear scale 33, a F-M (Fixed-Movable) linear scale 34, F-P overrun detecting pieces 43, F-M overrun detecting pieces 44, a movable base origin mark 45, and cable bearings 46A and 46B are provided.

The holder board 32 is a board material standing on the fixed base 11A, and extends in the directions of X1 and X2, as shown in FIG. 2B. The F-P linear scale 33 and the F-P overrun detecting pieces 43 are provided on the upper surface of the holder board 32, as shown in FIGS. 2A and 2C.

The F-P linear scale 33 extends in the directions of X1 and X2 on the upper surface of the holder board 32. The length of the F-P linear scale 33 should be longer than the moving range of the processing base 13A in the directions of X1 and X2. The F-P linear scale 33 has an alternating multi-phase (A, B, . . . Z phases) structure in which high light reflectance parts and low light reflectance parts are alternately arranged at predetermined intervals. The F-P linear scale 33 forms a F-P sensor 16 in cooperation with an optical sensor 35 provided on the processing base 13A.

The F-P sensor 16 detects the location of the movable base 12A with respect to the fixed base 11A. The location information as to the movable base 12A with respect to the fixed base 11A that is detected by the F-P sensor 16 is sent to the control device 80 (see FIG. 6).

The F-P overrun detecting pieces 43 are provided at the X1 end and the X2 end of the holder board 32. As shown in FIG. 2C, each of the F-P overrun detecting pieces 43 is a bent claw-like piece having an L-shape. The F-P overrun detecting pieces 43 form a F-P overrun sensor 20 in cooperation with a photointerrupter 36 provided in the processing base 13A.

The F-P overrun sensor 20 detects a movement of the processing base 13A outside the predetermined allowable moving range due to an external disturbance or the like. Such a movement of the processing base 13A will be hereinafter referred to as an overrun. The positions of the F-P overrun detecting pieces 43 are restricted within the allowable reciprocation moving range of the processing base 13A in the directions of X1 and X2. When the F-P overrun sensor 20 detects an overrun of the processing base 13A, the overrun detection information is sent to the control device 80 (see FIG. 6).

The F-M linear scale 34 extends in the directions of X1 and X2 on the upper surface of the fixed base 11A, and is longer than the moving range of the movable base 12A in the directions of X1 and X2 with respect to the fixed base 11A. Like the F-P linear scale 33, the F-M linear scale 34 has a multi-phase (A, B, . . . Z phases) structure in which high light reflectance parts and low light reflectance parts are alternately arranged at predetermined intervals. The F-M linear scale 34 having such a structure forms a F-M sensor 17 in cooperation with an optical sensor 37 (shown in FIG. 3C) provided in the movable base 12A.

The pair of F-M overrun detecting pieces 44 are provided at a predetermined distance from each other on the fixed base 11A. As shown in FIG. 2C, each of the F-M overrun detecting pieces 44 is a bent claw-like piece having an L-shape. The F-M overrun detecting pieces 44 form a F-M overrun sensor 19 in cooperation with a photointerrupter 38 provided in the movable base 12A.

The F-M overrun sensor 19 detects a movement of the movable base 12A outside the predetermined allowable moving range due to an external disturbance or the like. Such a movement of the movable base 12A will be hereinafter referred to as an overrun. The positions of the F-M overrun detecting pieces 44 are restricted within the allowable reciprocation moving range of the movable base 12A in the directions of X1 and X2. When the F-M overrun sensor 19 detects an overrun of the movable base 12A, the overrun detection information is sent to the control device 80 (see FIG. 6).

The movable base origin mark 45 is located at the middle point between the pair of F-M overrun detecting pieces 44 in this embodiment. This movable base origin mark 45 is a claw-like piece having an L shape, which is the same as each of the F-M overrun detecting pieces 44. The movable base origin mark 45 forms a movable base origin detecting sensor 22 in cooperation with the photointerrupter 38.

The movable base origin detecting sensor 22 detects the location of the movable base 12A with respect to the fixed base 11A when the mover device 10A is activated. Therefore, the control device 80 cannot grasp the current location of the movable base 12A immediately before and after the mover device 10A is activated.

After the mover device 10A is activated, the control device 80 moves the movable base 12A until the photointerrupter 38 detects the movable base origin mark 45. When the movable base origin mark 45 is detected, the control device 80 sets an origin that is to be used in software operations (this origin will be hereinafter referred to as the software origin).

As the software origin is set in the above manner, the location of the movable base 12A with respect to the location of the fixed base 11A can be detected from the software origin. Therefore, after the setting of the software origin, the F-M sensor 17 (including the F-M linear scale 34 and the optical sensor 37) can detect the location of the movable base 12A with respect to the location of the fixed base 11A.

The cable bearings 46A and 46B are provided on the outer sides of the holder board 32 of the fixed base 11A. Inside the cable bearings 46A and 46B, various cables that are connected to the movable base 12A and the processing base 13A are provided. The cable bearing 46A is connected to the processing base 13A, while the cable bearing 46B is connected to the movable base 12A.

The movable base 12A will be next described. As shown in FIGS. 1A through 1F and FIGS. 3A through 3C, the movable base 12A includes a pair of sideboards 50, side connecting bodies 51, a center part connecting body 52, the sub linear motor coil unit 56, the first linear guide rails 60, second linear guide rails 61, and reverse facilitating magnets 62. The movable base 12A is mounted to the fixed base 11A, and is movable in the directions of the arrows X1 and X2.

The pair of sideboards 50 is provided at a distance from each other in the directions of the arrows X1 and X2. Between the two sideboards 50, the side connecting bodies 51 are provided on the left side and the right side in FIG. 3A. At the center point between the two sideboards 50, the center part connecting body 52 is provided. With the pair of sideboards 50 being connected with the connecting bodies 51 and 52, the movable base 12A has a rigid body.

The side connecting body 51, which is provided on the left side in FIG. 3A, has a motor arm that is located at the center with respect to the directions of X1 and X2, and extends to the left in FIG. 3A. As shown in FIG. 3C, the motor arm 55 has the sub linear motor coil unit 56 extending downward.

The sub linear motor coil unit 56 has coils provided therein. These coils are cooled down to a predetermined temperature by a cooling mechanism (not shown), and are capable of generating a strong magnetic field though small in size.

The coils provided in the sub linear motor coil unit 56 are so-called coreless coils. With the use of the coreless coils, cogging force generation can be prevented when the sub linear motor 15 is driven. Thus, the sub linear motor 15 can smoothly move the movable base 12A with high precision. The sub linear motor coil unit 56 forms the sub linear motor 15 in cooperation with the sub linear motor magnets 31 provided in the fixed base 11A.

The sub linear motor 15 moves the movable base 12A in the directions of the arrows X1 and X2 with respect to the fixed base 11A. The sub linear motor 15 is controlled by the control device 80 (see FIG. 6).

It is also possible to employ a linear motor with a core. In such a case, a control operation may be performed to make a correction. If cogging force is generated from a linear motor with a core driven at a uniform velocity, a correcting operation needs to be performed to generate positive acceleration to cancel the cogging force. Since the size of the cogging force generated from the linear motor is a known value, the correcting operation to cancel the cogging force is relatively easy.

Meanwhile, the side connecting body 51 provided on the right side in FIG. 3A has a sensor arm 54 that is located at the center with respect to the directions of the X1 and X2, and extends to the right in FIG. 3A. Also, a cable bearing arm 57 to which the cable bearing 46B is connected is provided at a location slightly shifted from the location of the sensor arm 54 in the direction of X2.

The sensor arm 54 holds the optical sensor 37 that forms the F-M sensor 17 in cooperation with the F-M linear scale 34, and the photointerrupter 38 that forms the F-M overrun sensor 19 in cooperation with the F-M overrun detecting pieces 44. The photointerrupter 38 also functions as the movable base origin detecting sensor 22 in cooperation with the movable base origin mark 45.

As shown in FIG. 3C, the center part connecting body 52 has three walls, and main linear motor magnets 53 that form the main linear motor 14 are provided on the inner surfaces of the walls. The main linear motor magnets 53 are arranged at predetermined intervals, and are divided into two rows, with a space being formed in between. A main linear motor coil unit 74 (provided on the processing base 13A) that is also a part of the main linear motor 14 is inserted in the space between the two rows of the main linear motor magnets 53. Here, the main linear motor coil unit 74 is movable in the directions of the arrows X1 and X2.

Four reverse facilitating magnets 62 are formed on each of the inner surfaces of the two facing sideboards 50 of the movable base 12A. There are eight reverse facilitating magnets 62 provided on the inner surfaces of the two facing sideboards 50 of the movable base 12A. The reverse facilitating magnets 62 help the processing base 13A to reverse near an end of the movable base 12A by virtue of magnetic repulsion. More specifically, when the processing base 13A reverses in an reciprocation movement, the reverse facilitating magnets 78 exhibit a braking effect, a stopping effect, and a reverse directing effect.

Each of the side connecting bodies 51 has a first linear guide rail 60 provided at the lower end (on the Z2 side in FIG. 3C), and has a second linear guide rail 61 at the upper end (on the Z1 side in FIG. 3C). The first linear guide rails 60 and the second linear guide rails 61 extend in the directions of the arrows X1 and X2, and are flanked by the pair of sideboards 50.

The first linear guide rails 60 are to be engaged with the linear guide blocks 30 provided on the fixed base 11A. Accordingly, the movable base 12A moves in the directions of the arrows X1 and X2, being guided by the linear guide blocks 30 and the first linear guide rails 60. Even in a high speed movement, the movable base 12A can remain positioned with high precision, and move in a stable state.

Meanwhile, the second linear guide rails 61 are to be engaged with linear guide blocks provided on the processing base 13A. Accordingly, the processing base 13A moves in the directions of the arrows X1 and X2, being guided by the second linear guide rails 61 and the linear guide blocks 75. Even in a high speed movement, the processing base 13A can remain positioned with high precision, and move in a stable state.

Further, a P-M (Processing-Movable) linear scale 39 and a processing base origin mark 41 are provided at the two lower ends of the center part connecting body 52 having the three walls. In FIG. 3C, the P-M linear scale 39 is provided at the left lower end of the center part connecting body 52, while the processing base origin mark 41 is provided at the right lower end of the center part connecting body 52.

The P-M linear scale 39 is formed over a longer range than the moving range of the processing base 13A in the directions of X1 and X2 with respect to the movable base 12A. Like each of the linear scales 33 and 34, the P-M linear scale 39 has a multi-phase (A, B, . . . Z phases) structure in which high light reflectance parts and low light reflectance parts are alternately arranged at predetermined intervals. The P-M linear scale 39 having such a structure forms a P-M sensor 18 in cooperation with an optical sensor 40 (see FIG. 4C) provided in the processing base 13A.

The processing base origin mark 41 is located at the center point of the center part connecting body 52 extending in the directions of X1 and X2 in this embodiment. The processing base origin mark 41 is a mark (a reflection sheet) that includes only the high reflectance parts of the linear scale. The processing base origin mark 41 forms a processing base origin detecting sensor 21 in cooperation with an optical sensor 42 provided in the processing base 13A.

The processing base origin detecting sensor 21 detects the location of the processing base 13A with respect to the movable base 12A when the mover device 10A is activated. Therefore, the control device 80 cannot grasp the current location of the processing base 13A immediately before and after the mover device 10A is activated.

After the mover device 10A is activated, the control device 80 moves the processing base 13A on the movable base 12A until the optical sensor 42 detects the processing base origin mark 41. When the processing base origin mark 41 is detected, the control device 80 sets an origin that is to be used in software operations (this origin will be hereinafter referred to as the software origin).

As the software origin is set in the above manner, the location of the processing base 13A with respect to the location of the movable base 12A can be detected from the software origin. Therefore, after the setting of the software origin, the P-M sensor 18 (including the P-M linear scale 39 and the optical sensor 40) can detect the location of the processing base 13A with respect to the location of the movable base 12A.

The movement of the processing base 13A with respect to the fixed base 11A is also detected by the F-P sensor 16 (including the F-P linear scale 33 and the optical sensor 35). It is therefore necessary to set a software origin for the F-P sensor 16 in the same manner as the setting of the software origins for the F-M sensor 17 and the P-M sensor 18. This software origin will be hereinafter referred to as the F-P software origin.

In this embodiment, the F-P software origin is determined through an arithmetic operation. More specifically, the movable base 12A moves with respect to the fixed base 11A, and the processing base 13A moves with respect to the movable base 12A. The software origin of the movable base 12A with respect to the fixed base 11A (this origin will be hereinafter referred to as the F-M software origin) and the software origin of the processing base 13A with respect to the movable base 12A (this software origin will be hereinafter referred to as the P-M software origin) are set in the above described manner.

Accordingly, the F-P software origin can be determined through an arithmetic operation based on the F-M software origin and the P-M software origin.

The processing base 13A will be described next. As shown in FIGS. 1A through 1F and FIGS. 4A through 4C, the processing base 13A includes a housing 70, a stay frame 71, a platen 72, and the main linear motor coil unit 74.

The housing 70 has a rectangular shape, with a hollow being formed inside. The stay frame 71 stands on the upper part of the housing 70. The platen 72, to which an object to be processed, such as a wafer, is to be attached, is provided at the upper end of the stay frame 71. The platen 72 can be rotated by a platen motor 73 built in the processing base origin mark 41.

As shown in FIG. 4C, the main linear motor coil unit 74, the optical sensor 40, and the optical sensor 42 are provided inside the housing 70. The main linear motor coil unit 74 has coils provided therein. The coils are cooled down to a predetermined temperature by a cooling mechanism (not shown), and accordingly, can generate a strong magnetic field.

The coils provided in the main linear motor coil unit 74 are so-called coreless coils. With the use of the coreless coils, cogging force generation can be prevented. This main linear motor coil unit 74 forms the main linear motor 14 in cooperation with the main linear motor magnets 53 provided on the movable base 12A.

The main linear motor 14 moves (or drives) the processing base 13A in the directions of the arrows X1 and X2 with respect to the movable base 12A. The main linear motor 14 is controlled by the controlling device 80 (see FIG. 6). As a linear motor that can linearly reciprocate and can be easily controlled is employed as the moving force generator for the movable base 12A in this embodiment, highly responsive control operations can be performed through simple processes. The same applied to the sub linear motor 15. Also, the main linear motor 14 may be a linear motor with a core.

The optical sensor 40 forms the P-M sensor 18 in cooperation with the P-M linear scale 39. The optical sensor 40 is provided on a side of the main linear motor coil unit 74. Meanwhile, the optical sensor 42 forms the processing base origin detecting sensor 21 in cooperation with the processing base origin mark 41. The optical sensor 42 is also provided on a side of the main linear motor coil unit 74.

The housing 70 has a sensor arm 76 that extends to the right in FIGS. 4A and 4C. This sensor arm 76 has the optical sensor 35 and the photointerrupter 36 attached thereto. The optical sensor 35 forms the F-P sensor 16 in cooperation with the F-P linear scale 33. Meanwhile, the photointerrupter 36 forms the F-P overrun sensor 20 in cooperation with the F-P overrun detecting pieces 43. Also, a cable bearing arm 77 to which the cable bearing 46A is to be connected is provided at the end of the sensor arm 76.

The linear guide blocks 75 are provided at the four corners of the housing 70, as shown in the plan view of FIG. 4A. The linear guide blocks 75 are to be engaged with the second linear guide rails 61 provided in the movable base 12A. Accordingly, the processing base 13A can move steadily in the directions of the arrows X1 and X2, guided by the second linear guide rails 61 and the linear guide blocks 75, which position the processing base 13A with high precision.

In this embodiment, the second linear guide rails 61 provided in the movable base 12A are engaged with the linear guide blocks 75 provided on the processing base 13A, so as to guide the processing base 13A in a linear movement. However, it is also possible to provide third linear guide rails on the fixed base 11A. In such a case, the third linear guide rails are engaged with the linear guide blocks 75, so as to guide the processing base 13A in a linear movement. Where the third linear guide rails are employed, the second linear guide rails 61 can be omitted.

The housing 70 further has the reverse facilitating magnets 78. When the processing base 13A is mounted onto the movable base 12A, the reverse facilitating magnets 78 face the reverse facilitating magnets 62 provided on the sideboards 50 of the movable base 12A. More specifically, the reverse facilitating magnets 78 face the reverse facilitating magnets 62 in the moving direction of the movable base 12A. The reverse facilitating magnets 62 provided on the sideboards 50 facing each other have the same polarity as the reverse facilitating magnets 78 provided on the housing 70.

Although the processing base 13A reciprocates in the directions of the arrows X1 and X2 on the movable base 12A, the reverse facilitating magnets 62 and 78 help the reverse movements in the reciprocating movements of the processing base 13A. Referring now to FIG. 1B, the reverse helping operation of the reverse facilitating magnets 62 and 78 will be described below.

In this example, the processing base 13A has reached the limit in the direction of the arrow X1, and is about to reverse the moving direction and move in the direction of the arrow X2. Under the control of the controlling device 80 that will be described later, the processing base 13A slows down after the constant movement in the X1 direction.

As the processing base 13A moves in the X1 direction, the reverse facilitating magnets 78 provided on the housing 70 (the processing base 13A) approach the reverse facilitating magnets 62 provided on the sideboards 50 (the movable base 12A). Since the reverse facilitating magnets 62 have the same polarity as the reverse facilitating magnets 78, repulsion forces are caused between the reverse facilitating magnets 62 and the reverse facilitating magnets 78. As the processing base 13A approaches the sideboards 50, the repulsion forces between the magnets 62 and the magnets 78 gradually increase, and finally push the processing base 13A in the direction of the arrow X2 (i.e., the reverse direction).

When the processing base 13A is reversed, the main linear motor 14 and the sub linear motor 15 reverse the moving direction of the processing base 13A. Therefore, it is necessary to generate a large driving force. As a result, the power consumption of each of the linear motors 14 and 15 increases every time the processing base 13A is reversed.

With the reverse facilitating magnets 62 and 78, however, the repulsion forces caused between the magnets 62 and the magnets 78 facilitate the reversing of the processing base 13A. Accordingly, the power consumption (the load) of each of the linear motors 14 and 15 can be reduced, and the processing base 13A can be more smoothly reversed compared with a case where the processing base 13A is reversed only by the linear motors 14 and 15. The same effect is of course expected when the processing base 13A is reversed after reaching the limit in the direction of the arrow X2.

Referring now to FIGS. 5A through 5H, the basic operation of the mover device 10A having the above described structure will be described. Although various control operations are performed by the sub linear motor 15 in an actual moving operation of the processing base 13A, the following description of the basic operation of the mover device 10A illustrated in FIGS. 5A through 5H does not involve the sub linear motor 15, for ease of explanation.

The mover device 10A of this embodiment has the movable base 12A provided movably in the directions of X1 and X2 on the fixed base 11A, and the processing base 13A provided movably in the directions of X1 and X2 on the movable base 12A. The main linear motor 14 drives the processing base 13A to linearly reciprocate in the directions of X1 and X2 with respect to the movable base 12A.

Figure 5A:
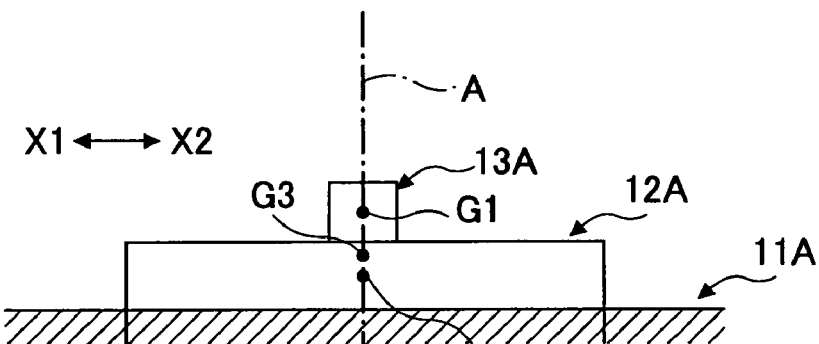
FIGS. 5A through 5H illustrate the center of composite gravity between the processing base and the movable base.
Figure 5B:
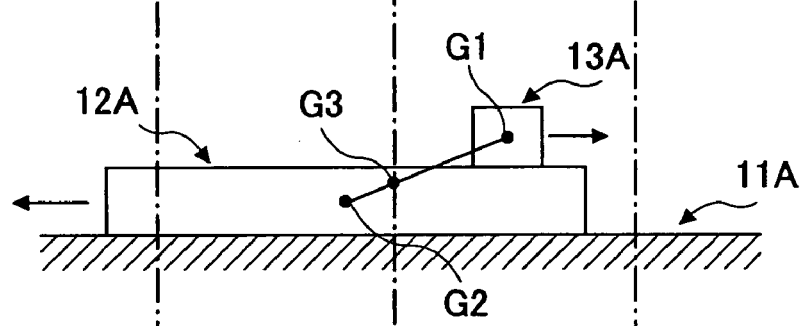

FIG. 5A illustrates a situation in which the processing base 13A and the movable base 12A are located in the movement center position (indicated by the dashed lines denoted by A in FIG. 5A). FIG. 5D illustrates the processing base 13A and the movable base 12A in the situation of FIG. 5A, seen from the right. In this situation, the main linear motor 14 provided between the movable base 12A and the processing base 13A drives the processing base 13A to move in the direction of the arrow X2 with respect to the fixed base 11A.

The main linear motor 14 drives (increases or reduces the speed) the processing base 13A to move in the direction of the arrow X2 with respect to the movable base 12A. Here, the movable base 12A receives a reaction force generated from the moving force of the processing base 13A moving in the X2 direction. As a result, the movable base 12A is pushed in the direction of the arrow X1. As the movable base 12A is movable in the directions of X1 and X2 with respect to the fixed base 11A, the movable base 12A is moved by the reaction force in the X1 direction, as shown in FIG. 5B.

Likewise, when the main linear motor 14 drives the processing base 13A to move in the direction of the arrow X1 through acceleration or deceleration, a reaction force is generated to push the movable base 12A in the X2 direction. Accordingly, the movable base 12A is moved in the X2 direction by the reaction force.

The application direction of the reaction force onto the movable base 12A is opposite to the moving direction of the processing base 13A. Here, the acceleration in the movement of the movable base 12A is inversely proportional to the mass ratio of the processing base 13A to the movable base 12A.

As the movable base 12A is moved by the reaction force generated from the moving force of the processing base 13A, the reaction force generated by accelerating or decelerating the processing base 13A does not reach the fixed base 11A, and is absorbed by the movement of the movable base 12A.

More specifically, the movable base 12A converts the reaction force into the moving force of the movable base 12A, and also uses the reaction force as a counter weight to reduce the movement of the movable base 12A with respect to the processing base 13A. Even if the processing base 13A is moved at high speed (50 „s or 100 „s, for example), the mover device 10A can be prevented from vibrating when the processing base 13A is accelerated or decelerated. Thus, the processing base 13A can be steadily moved with high precision.

When driving the processing base 13A, the main linear motor 14 overcomes the force to start the movable base 12A, and moves the processing base 13A with a greater force than the moving force of the movable base 12A in the opposite direction. In other words, the force F1 that is required to move the movable base 12A in the directions of X1 and X2 with respect to the fixed base 11A is greater than the force F2 that is required to move the processing base 13A in the directions of X1 and X2 with respect to the movable base 12A (F1>F2).

So as to form the above structure, the weight of the processing base 13A is made lighter than the weight of the movable base 12A, for example. By doing so, the processing base 13A can be started with certainty, while the movable base 12A can also be started.

Referring to FIGS. 5A through 5H, the relationships among the center of gravity G1 of the processing base 13A, the center of gravity G2 of the movable base 12A, and the center of composite gravity G3 of the center of gravity G1 of the processing base 13A and the center of gravity G2 of the movable base 12A, will now be described. FIGS. 5A through 5H schematically illustrate the fixed base 11A, the movable base 12A, and the processing base 13A. For ease of explanation, the centers of gravity G1, G2, and G3 are located in the center positions of the fixed base 11A, the movable base 12A, and the processing base 13A, respectively.

FIG. 5A illustrates a situation in which the processing base 13A and the movable base 12A are located in the movement center position (indicated by the dashed lines denoted by A in FIG. 5A). In this situation, the centers of gravity G1, G2, and G3 are all located in the movement center position A. More specifically, the center of gravity G1 of the processing base 13A, the center of composite gravity G3, and the center of gravity G2 of the movable base 12A are located in this order, seen from the top in FIG. 5A.

FIG. 5B illustrates a situation in which the processing base 13A has moved in the X2 direction. As the processing base 13A has moved in the X2 direction, the movable base 12A has moved in the X1 direction due to the reaction force. Here, the acceleration in the movement is inversely proportional to the mass ratio of the processing base 13A to the movable base 12A.

As the processing base 13A and the movable base 12A move, the center of gravity G1 of the processing base 13A and the center of gravity G2 of the movable base 12A move. In the mover device 10A of this embodiment, however, the center of composite gravity G3 remains at a predetermined point over the fixed base 11A, regardless of the movements of the processing base 13A and the movable base 12A.

Figure 5C:
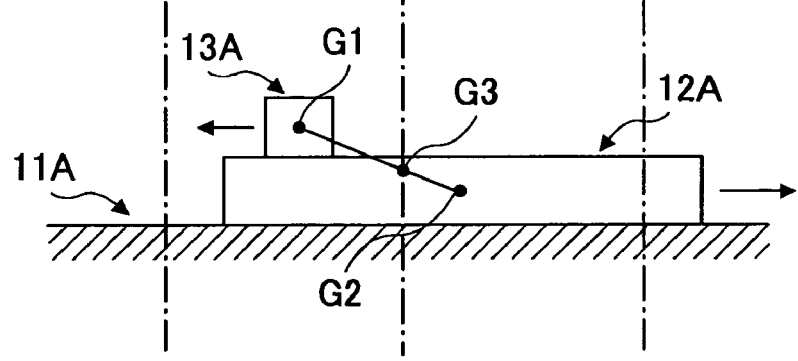
Figure 5D:
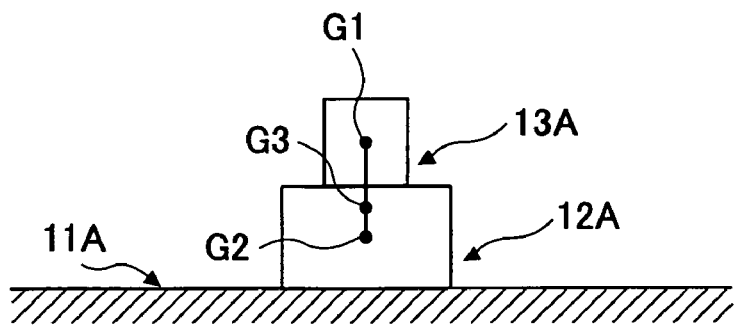

FIG. 5C illustrates a situation in which the processing base 13A has moved in the X1 direction. As the processing base 13A has moved in the X1 direction, the movable base 12A has moved in the X2 direction due to the reaction force. In this situation, the center of composite gravity G3 also remains at the predetermined point (in the movement center position A) over the fixed base 11A, despite the movements of the processing base 13A and the movable base 12A.

As described above, even if the movable base 12A and the processing base 13A move, the center of composite gravity G3 of the center of gravity G1 of the processing base 13A and the center of gravity G2 of the movable base 12A remains at the predetermined point over the fixed base 11A. Accordingly, the fixed base 11A can be prevented from vibrating due to shifting of the center of composite gravity G3. Thus, vibration and noise can be eliminated from the mover device 10A, and the processing base 13A can be steadily moved with high precision.

In the mover device 10A of this embodiment, the center of composite gravity G3 of the center of gravity G1 of the processing base 13A and the center of gravity G2 of the movable base 12A is substantially the same as a composite application point at which the main linear motor 14 and the sub linear motor 15 cooperate to apply a moving force to the processing base 13A.

In other words, the location of the center of composite gravity G3 is substantially the same as the location at which the composite force of the moving force of the main linear motor 14 moving the processing base 13A and the moving force of the sub linear motor 15 moving the processing base 13A through the movable base 12A is applied to move the processing base 13A (this location will be hereinafter referred to as the composite moving force application point).

With this structure, unnecessary moment generation in the processing base 13A can be prevented when the linear motors 14 and 15 apply moving forces to the processing base 13A. Thus, the processing base 13A can be smoothly moved with high precision.

Alternatively, it is possible to employ a structure in which the center of gravity G1 of the processing base 13A, the center of gravity G2 of the movable base 12A, and the center of composite gravity G3 of the two centers of gravity G1 and G2 are located at the same point. In this structure, each of the centers of gravity G1, G2, and G3 (G1=G2=G3) also corresponds to the composite moving force application point.

Figure 5E:
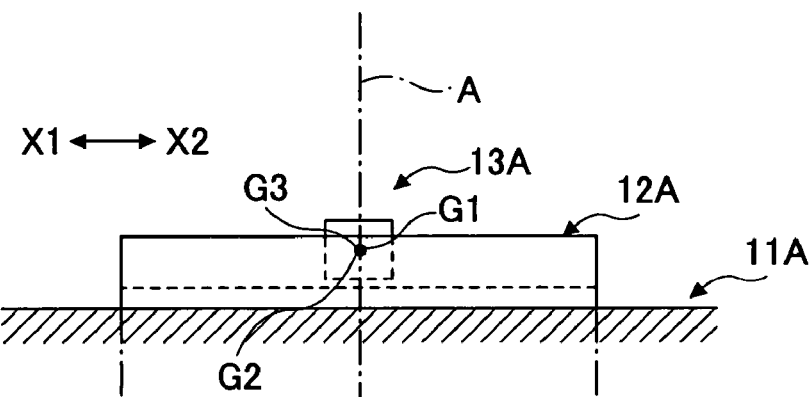

FIG. 5E illustrates a situation in which the processing base 13A and the movable base 12A are located in the movement center position (indicated by the dashed lines denoted by A in FIG. 5E). Here, the centers of gravity G1, G2, and G3 are all located at the same point.

Figure 5F:
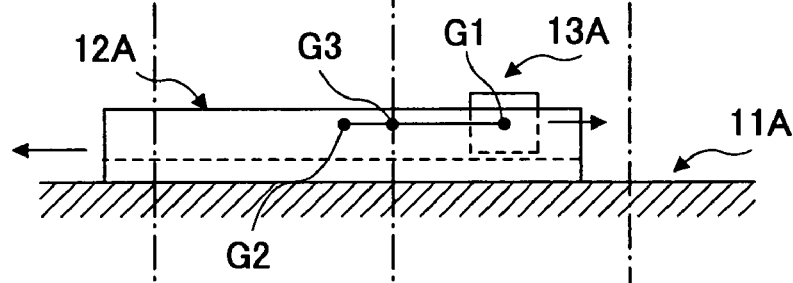

FIG. 5F illustrates a situation in which the processing base 13A has moved in the X2 direction. As the processing base 13A has moved in the X2 direction, the movable base 12A has moved in the X1 direction by the reaction force, as shown in FIG. 5F. As already mentioned in the explanation of the situation shown in FIG. 5B, the acceleration in the movement is inversely proportional to the mass ratio of the processing base 13A to the movable base 12A.

As the processing base 13A and the movable base 12A move, the center of gravity G1 of the processing base 13A and the center of gravity G2 of the movable base 12A move. In the mover device 10A of this embodiment, however, the center of composite gravity G3 remains at a predetermined point over the fixed base 11A, despite the movements of the processing base 13A and the movable base 12A. In this situation, the center of gravity G1 of the processing base 13A and the center of gravity G2 of the movable base 12A are located on the horizontal line that passes through the center of composite gravity G3 and extends in parallel with the fixed base 11A.

Figure 5G:
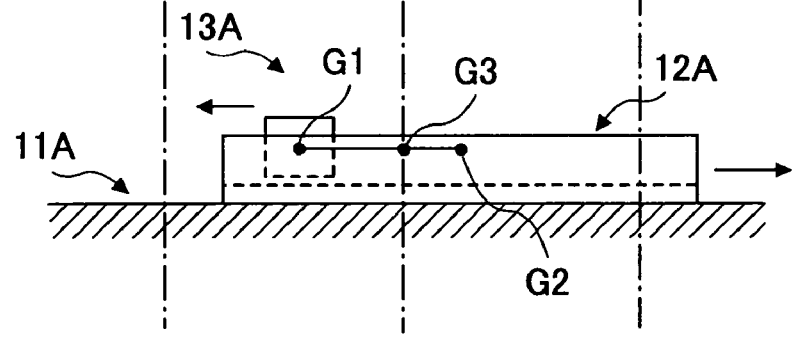
Figure 5H:
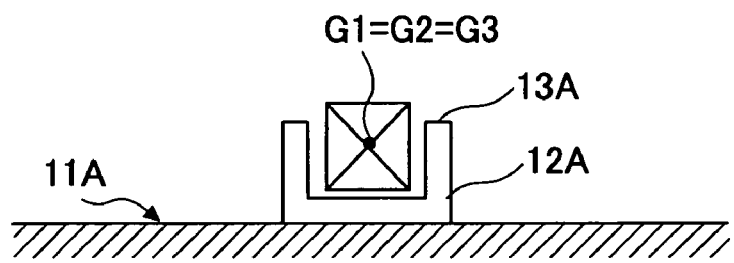

FIG. 5G illustrates a situation in which the processing base 13A has moved in the X1 direction. As the processing base 13A has moved in the X1 direction, the movable base 12A has moved in the X2 direction by the reaction force. In this situation, the center of composite gravity G3 remains at the predetermined point (located in the movement center position A) over the fixed base 11A, despite the movements of the processing base 13A and the movable base 12A. Also, the center of gravity G1 of the processing base 13A and the center of gravity G2 of the movable base 12A are located on the horizontal line that passes through the center of composite gravity G3 and extends in parallel with the fixed base 11A.

With the structure shown in FIGS. 5E through 5H, unnecessary moment generation in the processing base 13A can be prevented, and the processing base 13A can be smoothly moved with high precision.

In the above described mover device 10A of this embodiment, the linear guide blocks 30 are provided on the fixed base 11A, and the first linear guide rails 60 are formed on the movable base 12A. However, it is also possible to form the first linear guide rails 60 on the fixed base 11A and to provide the linear guide blocks 30 on the movable base 12A.

Also, in the above described mover device 10A, the sub linear motor magnets 31 that form the sub linear motor 15 are provided on the fixed base 11A, and the sub linear motor coil unit 56 is provided on the movable base 12A. However, it is possible to provide the sub linear motor coil unit 56 on the fixed base 11A and to provide the sub linear motor magnets 31 on the movable base 12A.

Further, in the above described mover device 10A, the main linear motor magnets 53 that form the main linear motor 14 are provided on the movable base 12A, and the main linear motor coil unit 74 is provided on the processing base 13A. However, it is possible to provide the main linear motor coil unit 74 on the movable base 12A and to provide the main linear motor magnets 53 on the processing base 13A.

Figure 6:
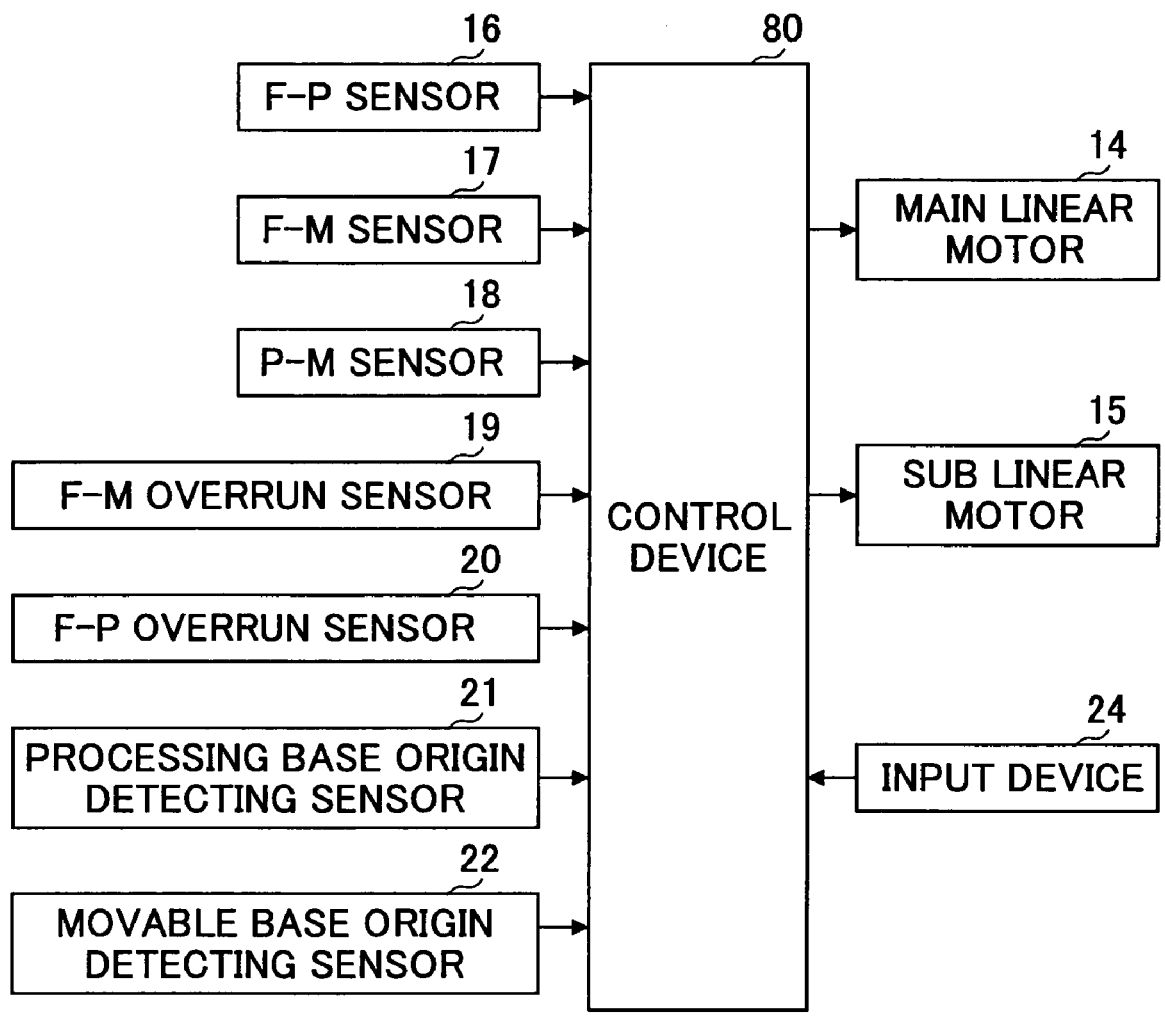
FIG. 6 is a control block diagram of the mover device in accordance with the first embodiment of the present invention.

FIG. 6 is a control block diagram of the mover device 10A. As shown in FIG. 6, the mover device 10A includes the control device 80 that controls all movement of the processing base 13A.

The control device 80 is formed by a computer (such as a microcomputer, a controller, a workstation, or a sequencer). The F-P sensor 16, the F-M sensor 17, the P-M sensor 18, the F-M overrun sensor 19, the F-P overrun sensor 20, the processing base origin detecting sensor 21, the movable base origin detecting sensor 22, and an input device 24, are all connected to the input port side of the control device 80. Meanwhile, the main linear motor 14 and the sub linear motor 15 are connected to the output port side of the control device 80. The control device 80 controls movements of the movable base 12A and the processing base 13A in accordance with a control program that will be described later.

The control device 80 performs various control operations to move the processing base 13A. In the following, those control operations to be performed by the control device 80 will be described.

Figure 7:
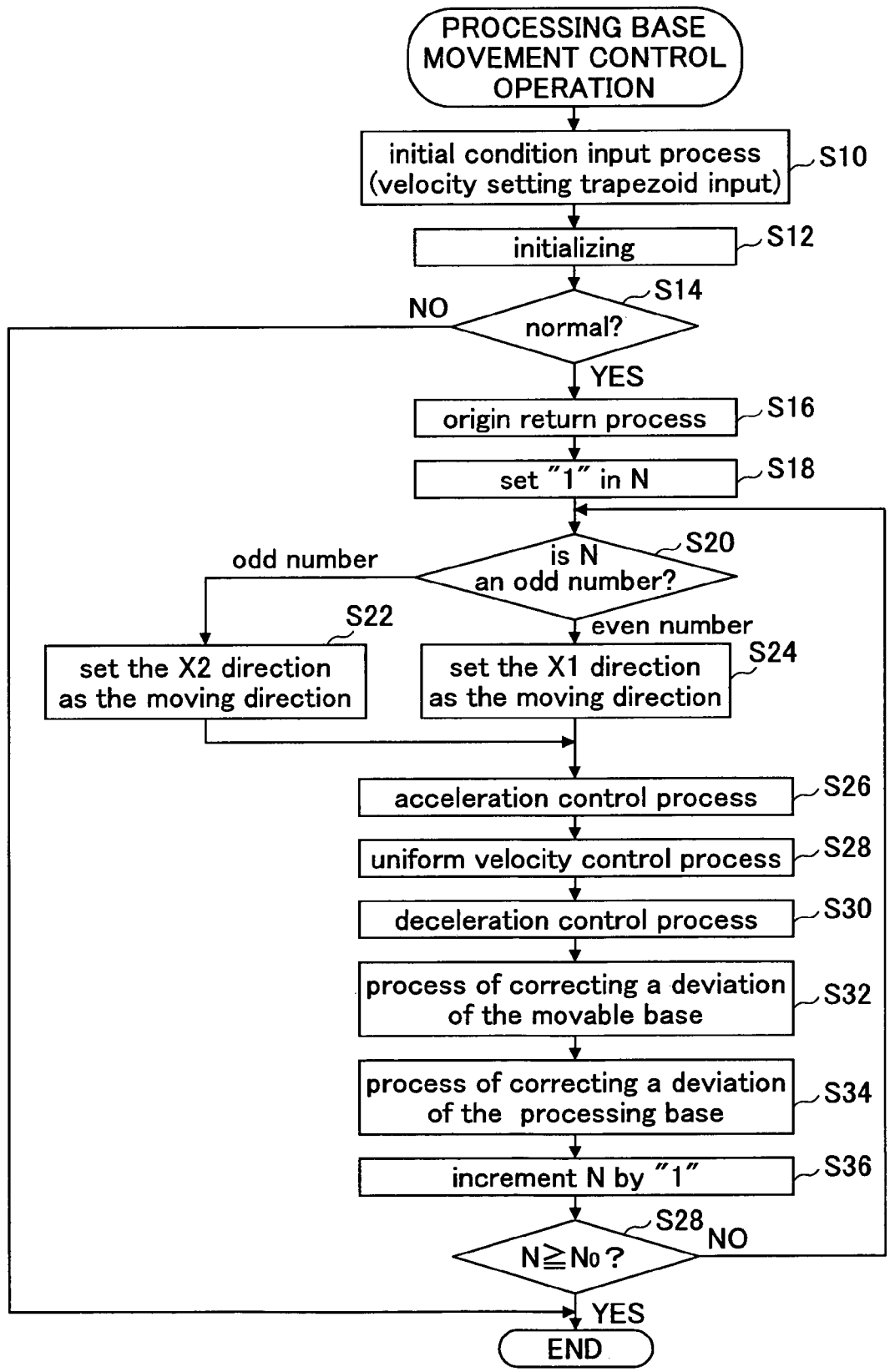
FIG. 7 is a flowchart of a movement control operation to be performed on the processing base.

FIG. 7 is a flowchart of a processing base movement control operation that is performed by the control device 80 so as to move the processing base 13A. The processing base movement control operation is performed to control the mover device 10A including the sub linear motor 15 that has been described with reference to FIGS. 1A through 6.

In the following example of a control operation, the processing base 13A reciprocates in a predetermined range with respect to the fixed base 11A. It should be noted, however, that the control operations in accordance with the present invention are not limited to operations to reciprocate the processing base, but can also be applied to any structure in which the processing base moves only in one direction, including a case where an accelerating process, a uniform velocity process, and a decelerating process are repeated in one direction.

In the example described in the following description, the mover device 10A is incorporated into a wafer processor, and moves a wafer in the wafer processor.

When the processing base movement control operation shown in FIG. 7 starts, an initial condition input process is first carried out in step S10. In the initial condition input process, various initial conditions that are required to move the processing base 13A are input. Specific initial conditions include the diameter of each wafer, a target uniform velocity, the distance of a uniform velocity required range, the number N0 of wafers to be processed, allowable positional deviations QMAX and RMAX from predetermined reference positions, and a velocity setting trapezoid that represents an ideal moving velocity of the processing base 13A (see FIG. 17). Each of the initial conditions is input to the control device 80 by the input device 24.

In step S12, the mover device 10A is initialized. The initializing involves processes of determining whether the mover device 10A, the control device 80, and the processor into which the mover device 10A is incorporated, are ready to operate. The initializing is performed by the control device 80.

Specific initializing processes to be carried out by the control device 80 include: a diagnostic process of checking the control device 80 for problems; an operation checking process for the linear motors 14 and 15; a normality checking process for the coil units 56 and 57 (checking for a problem such as disconnection, a change in the coil resistance value, and a coil cooling temperature); a checking process for power sources; and a normality checking process for the processor into which the mover device 10A is incorporated.

In step S14, the mover device 10A and the processor, into which the mover device 10A is incorporated, are determined whether to be in a normal state and to be ready for the processing base movement control operation, based on the initialing performed in step S12. If the mover device 10A and the processor are determined not to be in a normal state and not to be ready for the processing base movement control operation ("NO" in step S14), steps S16 through S28 are not carried out, and the operation comes to an end. If the mover device 10A and the processor are determined to be in a normal state and to be ready for the processing base movement control operation ("YES" in step S14), the operation moves on to step S16.

Figure 8:
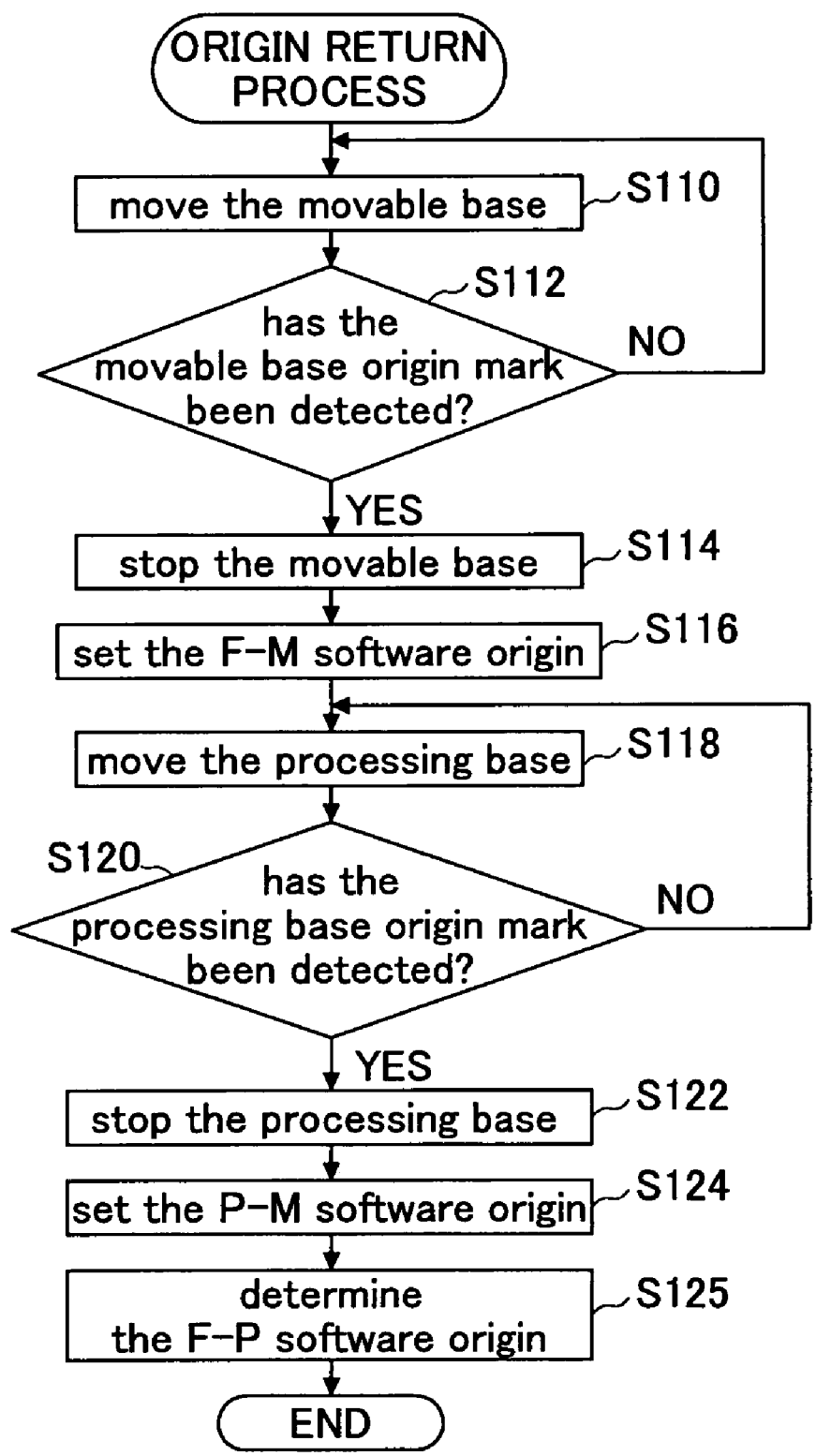
FIG. 8 is a flowchart of an origin return process.

In step S16, an origin return process is carried out to return the movable base 12A and the processing base 13A to the original positions. Referring now to FIG. 8, the origin return process will be described. FIG. 8 is a flowchart of the origin return process.

When the origin return process starts, the control device 80 first drives the sub linear motor 15 to move the movable base 12A with respect to the fixed base 11A in step S110. The moving of the movable base 12A continues until the photointerrupter 38 that forms the movable base origin detecting sensor 22 detects the movable base origin mark 45 (step S112).

When the photointerrupter 38 detects the movable base origin mark 45 in step S112, the operation moves to step S114. The control device 80 stops the movable base 12A in step S114, and sets the F-M software origin in step S116. Having set the F-M software origin, the control device 80 can recognize the location of the movable base 12A with respect to the fixed base 11A, and hereafter controls movements of the movable base 12A with respect to the fixed base 11A, using the F-M software origin as the reference point.

In step S118, the control device 80 drives the main linear motor 14 to move the processing base 13A with respect to the movable base 12A. The moving of the processing base 13A continues until the optical sensor 42 that forms the processing base origin detecting sensor 21 detects the processing base origin mark 41 (step S120).

When the optical sensor 42 detects the processing base origin mark 41 in step S120, the operation moves to step S122. The control device 80 then stops the processing base 13A, and sets the P-M software origin in step S124. Having set the P-M software origin, the control device 80 can recognize the location of the processing base 13A with respect to the movable base 12A, and hereafter controls movements of the processing base 13A with respect to the movable base 12A, using the P-M software origin as the reference point.

In step S125, based on the F-M software origin set in step S116 and the P-M software origin set in step S124, the control device 80 performs an arithmetic operation to determine the F-P software origin, which is the movement origin between the fixed base 11A and the processing base 13A.

Having determined the F-P software origin, the control device 80 can recognize the location of the processing base 13A with respect to the fixed base 11A, and hereafter controls movements of the processing base 13A with respect to the fixed base 11A, using the F-P software origin as the reference point. After the F-M software origin, the P-M software origin, and the F-P software origin have been determined in the above manner, the origin return process shown in FIG. 8 comes to an end.

Accordingly, in the control method of the mover device 11A, the movable base 12A and the processing base 13A are reciprocated designated times in advance (preliminary reciprocation), so that moving data obtained from the preliminary reciprocation are been sampled. From the data having been sampled, main sampling correction trapezoid data are obtained, and the main linear motor 14 (moving force generating unit) is program-controlled so that the processing base 13A has a uniform velocity against the fixed base 11A. That is, driving data with respect to starting friction, dynamic friction, and actual driving torque diagram of the movable base 12A and the processing base 13A are sampled and the main sampling correction (deformation) trapezoid data are obtained through the sampling data. While a minor correction via a position sensor is input following the speed trapezoid, the velocity of the processing base 13A against the fixed base 11A is controlled to be a uniform velocity.

Referring back to FIG. 7, the procedures of step S16 and later in the processing base movement control operation will be described. In step S18, "1" is set in the counter value N. In step S20, the counter value N is determined whether to be an odd number.

If the counter value N is determined to be an odd number in step S20, the operation moves on to step S22. In step S22, the control device 80 carries out a process of setting the X2 direction as the moving direction of the processing base 13A. If the counter value N is determined to be an even number in step S20, the operation moves on to step S24. In step S24, the control device 80 carries out a process of setting the X1 direction as the moving direction of the processing base 13A.

The procedures of steps S20 through S24 are carried out to make the processing base 13A reciprocate. More specifically, after the series of accelerating, uniform velocity, and decelerating processes for the processing base 13A, the counter value N is incremented by "1" in step S36. After the procedures of steps S20 through S38 are carried out for the first time, the determination result of step S38 is "NO", and the procedures of steps S20 through S38 are repeated. If the counter value N is an odd number when the procedures of steps S20 through S38 are carried out for the first time, the counter value N is an even number when the procedures of steps S20 through S38 are carried out for the second time. If the counter value N is an even number for the first time, the counter value N is an odd number for the second time. Accordingly, every time the procedures of steps S20 through S38 are completed, the moving direction of the processing base 13A is reversed. Thus, the processing base 13A reciprocates.

After the moving direction of the processing base 13A is set in steps S24 through 24, the acceleration control process of step S26, the uniform velocity control process of step S28, and the deceleration control process of step S30 are carried out in this order. In this embodiment, there are two driving devices; the main linear motor 14 and the sub linear motor 15. Using the linear motors 14 and 15, movements of the processing base 13A and the movable base 12A are simultaneously controlled through the acceleration, uniform velocity, and deceleration control processes. In the following, the acceleration, uniform velocity, and deceleration control processes to be carried out by the control device 80 on the movable base 12A and the processing base 13A will be described.

Figure 9:
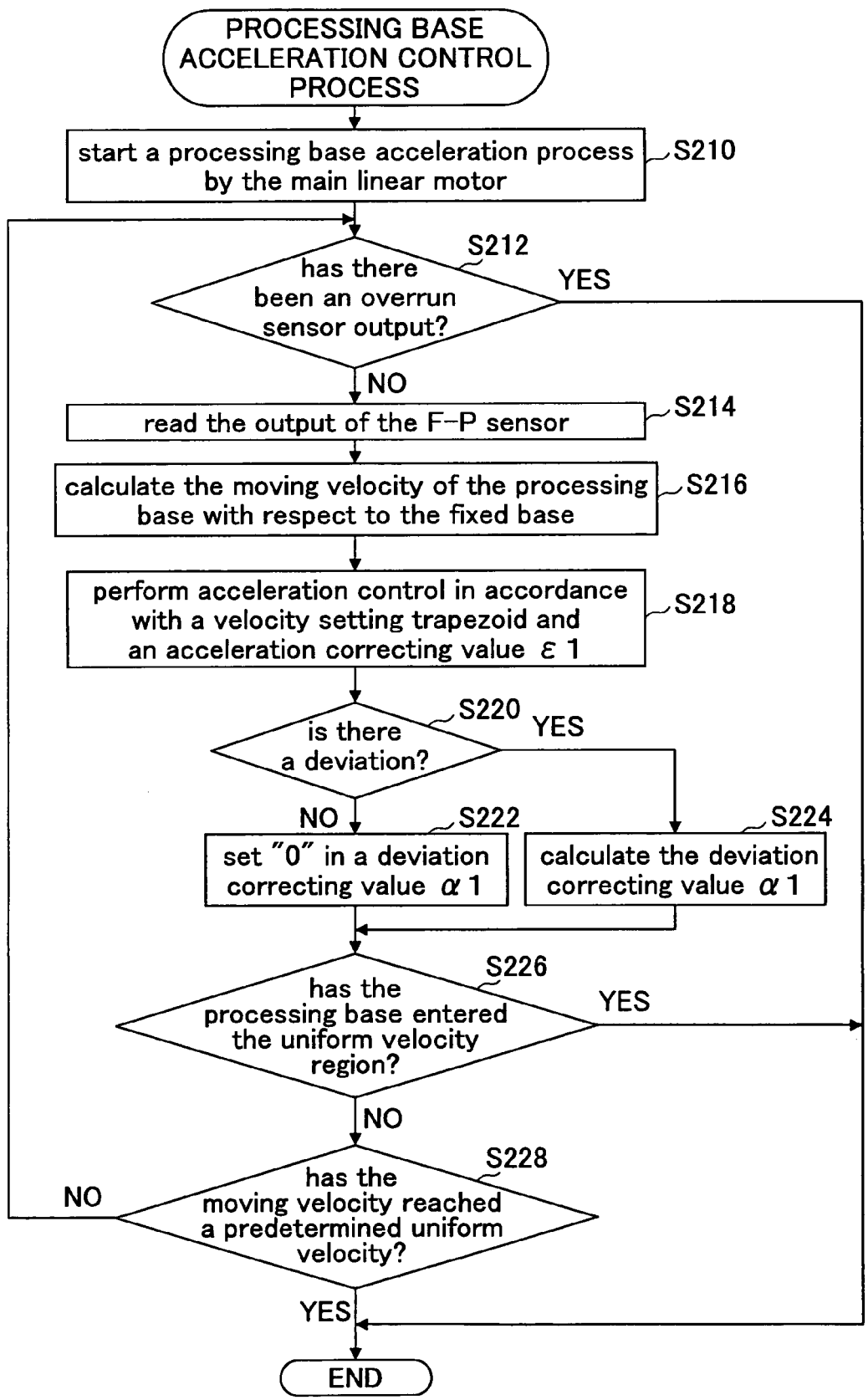
FIG. 9 is a flowchart of an acceleration control process to be carried out for the processing base.
Figure 10:
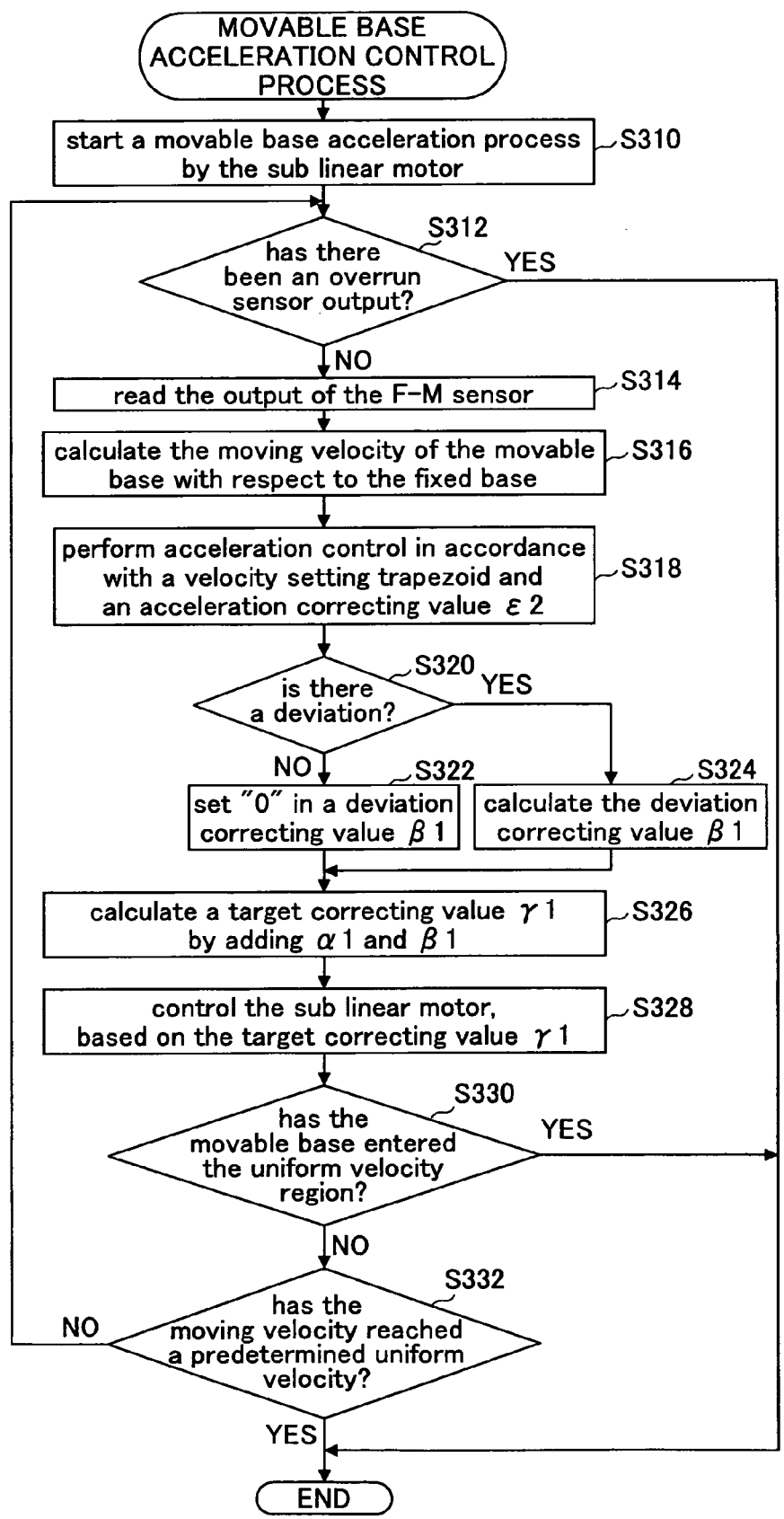
FIG. 10 is a flowchart of an acceleration control process to be carried out for the movable base.

The acceleration control process will be first described. FIG. 9 is a flowchart of the acceleration control process to be carried out on the processing base 13A. FIG. 10 is a flowchart of the acceleration control process to be carried out on the movable base 12A.

When the acceleration control process for the processing base 13A starts, the control device 80 drives the main linear motor 14 in step S210, and an acceleration process for the processing base 13A starts. In step S212, the control device 80 determines whether there has been an output from the F-P overrun sensor 20.

The F-P overrun sensor 20 transmits an output signal to the control device 80 when the processing base 13A moves beyond the allowable reciprocation movement range (overruns the allowable reciprocation movement range) due to adverse influence of an external disturbance or the like. If the control device 80 determines that there has been an output from the F-P overrun sensor 20 in step S212, the procedures of steps S214 through S228 are not carried out, and the acceleration control process comes to an end.

If it is determined that there has not been an output from the F-P overrun sensor 20 ("NO" in step S212), the operation moves on to step S214. In step S214, the output from the F-P sensor 16 is read. In step S216, based on the output from the F-P sensor 16 read in step S214, the control device 80 performs an arithmetic operation to determine the velocity of the processing base 13A with respect to the fixed base 11A.

In step S218, the control device 80 performs acceleration control based on an acceleration correcting value ,,1 and the velocity setting trapezoid (indicated by the bold solid line A in FIG. 17) that represents the ideal moving velocity of the processing base 13A and has been input in advance in step S10. Here, the acceleration control based on the velocity setting trapezoid A is performed to control the moving velocity of the processing base 13A, so that the moving velocity of the processing base 13A conforms to the acceleration region of the velocity setting trapezoid A shown in FIG. 17.

Figure 17:
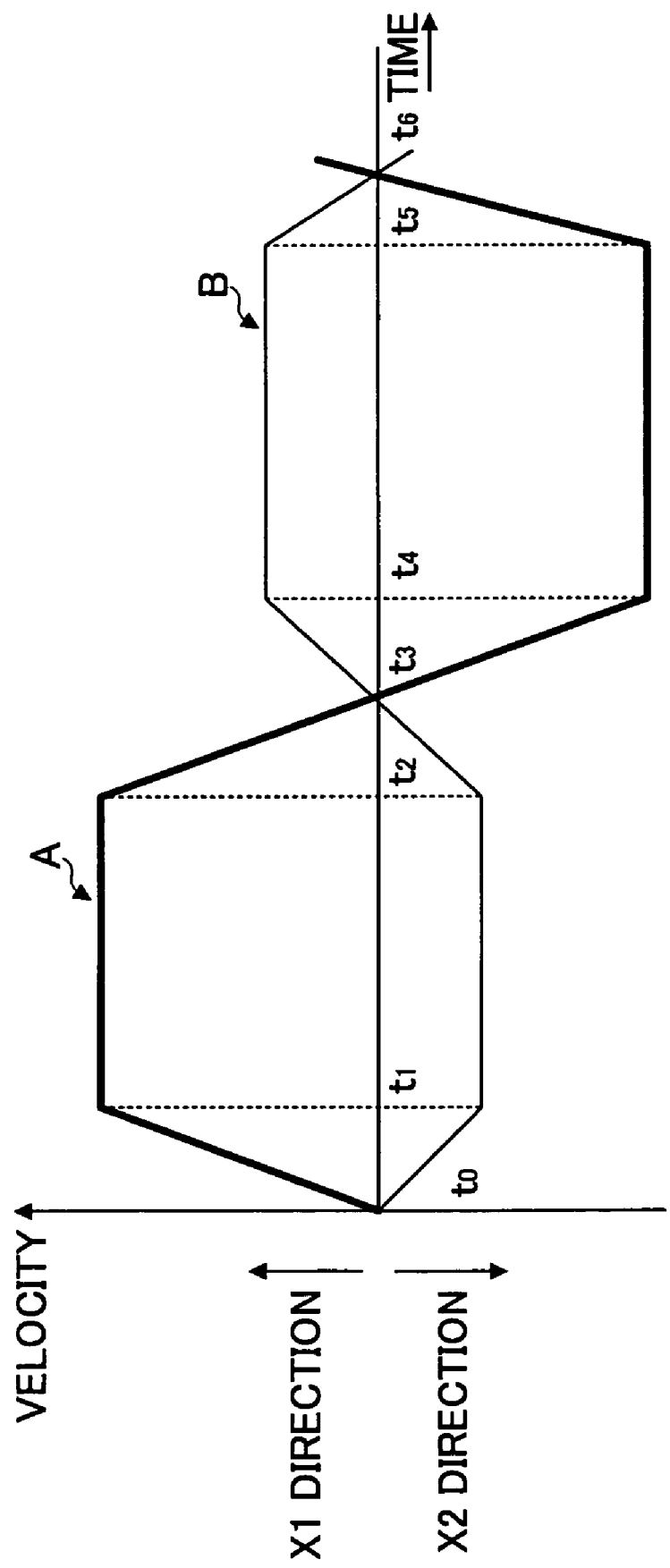
FIG. 17 shows examples of the velocity setting trapezoids of the processing base and the movable base.
Figure 19C:
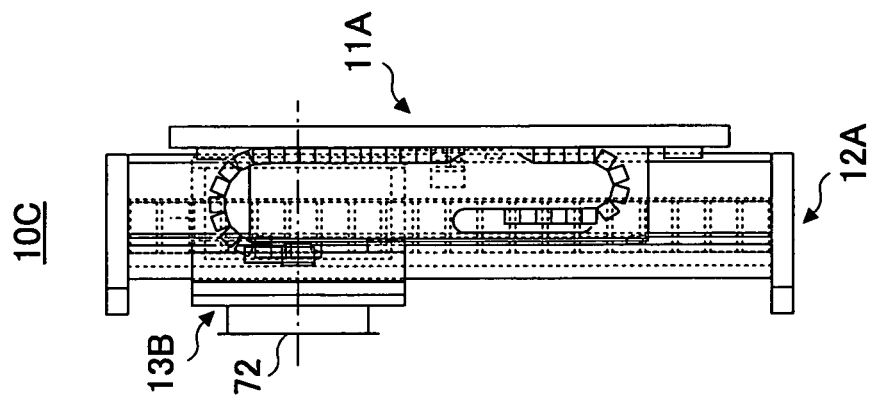
FIGS. 19A through 19F illustrate the hardware structure of a mover device in accordance with a third of the present invention.
Figure 19B:
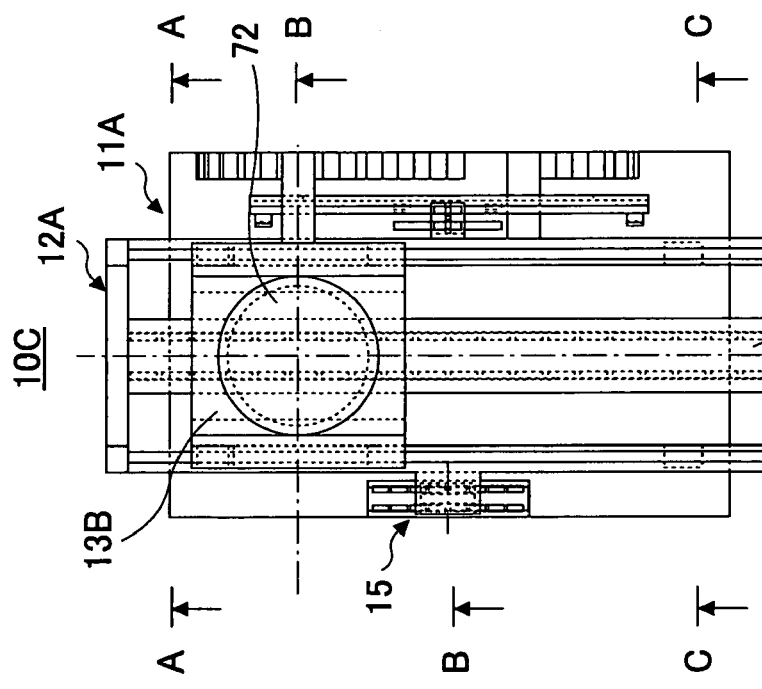
Figure 19A:
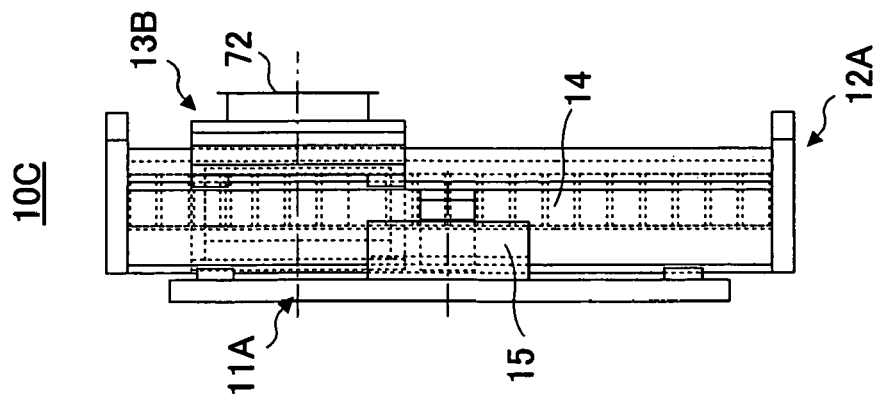
Figure 19D:
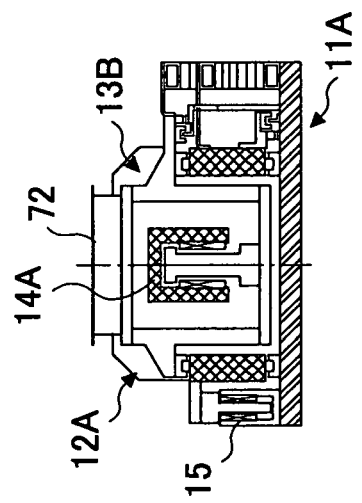
Figure 19E:
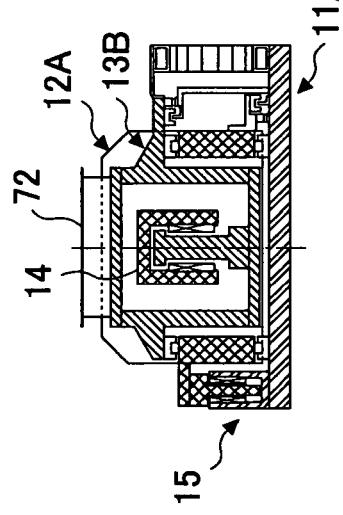
Figure 19F:
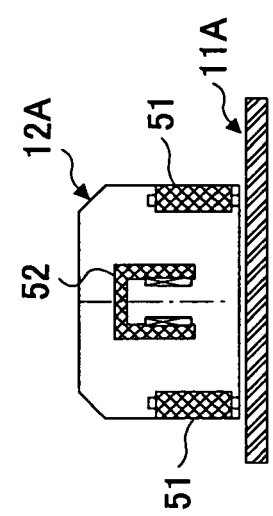

The bold solid line denoted by A in FIG. 17 represents the ideal moving velocity in an reciprocation movement of the processing base 13A with respect to the fixed base 11A. In FIG. 17, the ordinate axis indicates velocity, while the abscissa axis indicates time. The region between time t0 and time t1 is an acceleration region in which the processing base 13A accelerates in the X1 direction. The region between time t1 and time t2 is a uniform velocity region in which the processing base 13A moves in the X1 direction at a uniform velocity. The region between time t2 and time t3 is a deceleration region in which the processing base 13A decelerates in the X1 direction.

In FIG. 17, the region between time t3 and time t4 is an acceleration region in which the processing base 13A accelerates in the X2 direction. The region between time t4 and time t5 is a uniform velocity region in which the processing base 13A moves in the X2 direction at a uniform velocity. The region between time t5 and time t6 is a deceleration region in which the processing base 13A decelerates in the X2 direction.

The moving velocity of the processing base 13A with respect to the fixed base 11A is controlled to conform to the velocity setting trapezoid A shown in FIG. 17, so that the uniform velocity region of the processing base 13A can be maximized while the processing base 13A smoothly reciprocates.

The acceleration correcting value ,,1 used in the acceleration control process for the processing base 13A is used for correcting the positional deviation of the processing base 13A from a predetermined reference position. As mentioned earlier, the F-P software origin is determined through the origin return process in step S16 in FIG. 7, and a movement control operation is performed on the processing base 13A based on the F-P software origin as the reference point.

However, the processing base 13A might deviate from the reference position due to an external disturbance, such as errors in the linear motors 14 and 15, or loads on the cable bearings 46A and 46B. If the positional deviation is not corrected, the accuracy in the movement control operation for the processing base 13A decreases. Therefore, if the processing base 13A deviates from the reference position, the positional deviation needs to be corrected. However, if the positional deviation is corrected in the uniform velocity region of the processing base 13A, the moving velocity is changed, and the processing base 13A cannot move at a uniform velocity.

In view of this, the positional deviation of the processing base 13A is corrected in the acceleration region in this embodiment. More specifically, the positional deviation of the processing base 13A from the predetermined reference position is measured, and the acceleration correcting value ,,1 is determined based on the measured positional deviation. Using the acceleration correcting value ,,1, the velocity setting trapezoid A is corrected. In this manner, acceleration control is performed on the processing base 13A, so that the moving velocity of the processing base 13A corresponds to the velocity setting trapezoid A, and that the positional deviation of the processing base 13A can be automatically corrected. For convenience of explanation, the process of determining the acceleration correcting value ,,1 will be described later.

After the procedure of step S218 is completed, the moving velocity of the processing base 13A with respect to the fixed base 11A determined in step S216 is compared with the velocity setting trapezoid A (which is corrected with the acceleration correcting value ,,1, if the processing base 13A has deviated from the reference position) in step S220. Through the comparison, it is determined whether there is a difference between the moving velocity of the processing base 13A and the velocity setting trapezoid A.

If there is not a difference detected in step S220, the operation moves on to step S222. In step S222, "0" is set in a deviation correcting value ,,1 (,,1=0). If there is a difference detected in step S220, the operation moves on to step S224. In step S224, the deviation correcting value ,,1 to be used for returning the moving velocity of the processing base 13A to the velocity setting trapezoid A is calculated. The deviation correcting value ,,1 calculated in step S224 is a value to be reflected in the acceleration control process (step S326 in FIG. 10) for the movable base 12A that will be described later.

In step S226, the control device 80 determines whether the processing base 13A has entered the uniform velocity region. If the processing base 13A has entered the uniform velocity region ("YES" in step S226), the acceleration control process comes to an end, and the velocity control operation for the processing base 13A switches to the uniform velocity control process of step S28 in FIG. 7. If the control device 80 determines that the processing base 13A has not entered the uniform velocity region ("NO" in step S226), the operation moves on to step S228. In step S228, the control device 80 determines whether the moving velocity of the processing base 13A has reached a predetermined uniform velocity.

If the control device 80 determines that the moving velocity of the processing base 13A has not reached the predetermined uniform velocity ("NO" in step S228), the procedures of steps S212 through S228 are repeated. If the control device 80 determines that the moving velocity of the processing base 13A has reached the predetermined uniform velocity ("YES" in step S228), the acceleration control process comes to an end, and the velocity control operation for the processing base 13A switches to the uniform velocity control process of step S28. In this manner, the acceleration control process for the processing base 13A continues until the processing base 13A enters the uniform velocity region or the moving velocity of the processing base 13A reaches the predetermined uniform velocity.

Referring now to FIG. 10, the acceleration control process for the movable base 12A will be described. When the acceleration control process for the movable base 12A starts, the control device 80 drives the sub linear motor 15 to start an acceleration process for the movable base 12A in step S310. In step S312, the control device 80 determines whether there has been an output from the F-M overrun sensor 19.

The F-M overrun sensor 19 transmits an output signal to the control device 80 when the movable base 12A moves beyond the allowable reciprocation movement range (or overruns the allowable reciprocation movement range) due to adverse influence of an external disturbance or the like. If the control device 80 determines that there has been an output from the F-M overrun sensor 19 in step S312, the procedures of steps S314 through S332 are not carried out, and the acceleration control process comes to an end.

If the control device 80 determines that there has not been an output from the F-M overrun sensor 19 ("NO" in step S312), the operation moves on to step S314. In step S314, the output of the F-M sensor 17 is read. In step S316, based on the output of the F-M sensor 17 read in step S314, the control device 80 performs an arithmetic operation to determine the moving velocity of the movable base 12A with respect to the fixed base 11A.

In step S318, the control device 80 performs acceleration control based on an acceleration correcting value ,,2 and the velocity setting trapezoid (indicated by the thin solid line B in FIG. 17) that represents the ideal moving velocity of the movable base 12A and has been input in advance in step S10. Here, the acceleration control based on the velocity setting trapezoid B is performed to control the moving velocity of the movable base 12A, so that the moving velocity of the movable base 12A conforms to the acceleration region of the velocity setting trapezoid B shown in FIG. 17.

The thin solid line denoted by B in FIG. 17 represents the ideal moving velocity in one reciprocation movement of the movable base 12A with respect to the fixed base 11A. The region between time t0 and time t1 is an acceleration region in which the movable base 12A accelerates in the X2 direction. The region between time t1 and time t2 is a uniform velocity region in which the movable base 12A moves in the X2 direction at a uniform velocity. The region between time t2 and time t3 is a deceleration region in which the movable base 12A decelerates in the X2 direction.

In FIG. 17, the region between time t3 and time t4 is an acceleration region in which the movable base 12A accelerates in the X1 direction. The region between time t4 and time t5 is a uniform velocity region in which the movable base 12A moves in the X1 direction at a uniform velocity. The region between time t5 and time t6 is a deceleration region in which the movable base 12A decelerates in the X1 direction. The moving velocity of the movable base 12A with respect to the fixed base 11A is controlled to conform to the velocity setting trapezoid B shown in FIG. 17, so that the movable base 12A can smoothly reciprocate.

In this embodiment, the velocity setting trapezoid A of the processing base 13A and the velocity setting trapezoid B of the movable base 12A are designed to synchronize with each other, as shown in FIG. 17. More specifically, each switching point from an acceleration region to a uniform velocity region in the velocity setting trapezoid A of the processing base 13A synchronizes with each corresponding switching point from an acceleration region to a uniform velocity region in the velocity setting trapezoid B of the movable base 12A (at time t1 and time t4). Also, each switching point from a uniform velocity region to a deceleration region in the velocity setting trapezoid A of the processing base 13A synchronizes with each corresponding switching point from a uniform velocity region to a deceleration region in the velocity setting trapezoid B of the movable base 12A (at time t2 and time t5).

In this structure, the processing base 13A and the movable base 12A change the moving states at the same time (for example, a change from an acceleration state to a uniform velocity state). Accordingly, at each transition point in the moving state, the processing base 13A and the movable base 12A interact with each other to prevent positional deviations. Also, accurate movement control operations can be performed on the processing base 13A and the movable base 12A.

The moving velocity of the processing base 13A is controlled to conform to the velocity setting trapezoid A, while the moving velocity of the movable base 12A is controlled to conform to the velocity setting trapezoid B. As a result, the moving velocity of the processing base 13A can be quickly adjusted to the predetermined uniform velocity, and the processing base 13A can be promptly stopped. Accordingly, the uniform velocity region of the processing base 13A can be widened, and a longer processing time can be reserved for each wafer to be placed on the processing base 13A. Thus, the throughput in the wafer processing can be increased.

The velocity setting trapezoids A and B are employed as the representation of the ideal velocities for the processing base 13A and the movable base 12A. As can be seen from FIG. 17, the acceleration regions and the deceleration regions show linear changes in this embodiment. However, the acceleration regions and the deceleration regions may represent other types of changes, such as quadric changes, S-shaped changes, or exponential changes.

Referring back to step S318 in FIG. 10, the acceleration correcting value ,,2 used in the acceleration control process for the movable base 12A is used for correcting the positional deviation of the movable base 12A from a predetermined reference position. As mentioned earlier, the F-M software origin is determined through the origin return process in step S16 in FIG. 7, and a movement control operation is performed on the movable base 12A based on the F-M software origin as the reference point.

However, the movable base 12A might deviate from the reference position due to an external disturbance, such as errors in the linear motors 14 and 15, or loads on the cable bearings 46A and 46B. If the positional deviation is not corrected, the accuracy in the movement control operation for the movable base 12A decreases.

Therefore, if the movable base 12A deviates from the reference position, the positional deviation needs to be corrected. However, if the positional deviation is corrected in the uniform velocity region of the processing base 13A, the moving velocity is changed, and the processing base 13A cannot move at a uniform velocity, as already earlier. In view of this, the positional deviation of the movable base 12A is also corrected in the acceleration region of the processing base 13A in this embodiment.

More specifically, the positional deviation of the movable base 12A from the predetermined reference position is measured, and the acceleration correcting value ,,2 is determined based on the measured positional deviation. Using the acceleration correcting value ,,2, the velocity setting trapezoid B is corrected. In this manner, acceleration control is performed on the movable base 12A, so that the moving velocity of the movable base 12A corresponds to the velocity setting trapezoid B, and that the positional deviation of the movable base 12A can be automatically corrected. For convenience of explanation, the process of determining the acceleration correcting value ,,2 will be described later.

After the procedure of step S318 is completed, the moving velocity of the movable base 12A with respect to the fixed base 11A determined in step S316 is compared with the velocity setting trapezoid B (which is corrected with the acceleration correcting value ,,2, if the movable base 12A has deviated from the reference position) in step S320. Through the comparison, it is determined whether there is a difference between the moving velocity of the movable base 12A and the velocity setting trapezoid B.

If there is not a difference detected in step S320, the operation moves on to step S322. In step S322, "0" is set in a deviation correcting value ,,1 (,,1=0). If there is a difference detected in step S320, the operation moves on to step S324. In step S324, the deviation correcting value ,,1 to be used for returning the moving velocity of the movable base 12A to the velocity setting trapezoid B is calculated.

In step S326, the deviation correcting value ,,1 of the processing base 13A determined in steps S222 and S224 and the deviation correcting value ,,1 of the movable base 12A determined in steps S322 and 324 are added to obtain a target correcting value ,,1. This target correcting value ,,1 is a correcting value to be used for correcting a positional deviation of the movable base 12A and a positional deviation of the processing base 13A at the same time.

In step S328, the control device 80 controls the driving of the sub linear motor 15, using the target correcting value ,,1 determined in step S326. In this manner, the control device 80 controls the driving of the sub linear motor 15 using the target correcting value ,,1, so that a positional deviation of the movable base 12A and a positional deviation of the processing base 13A are corrected in the acceleration region of the movable base 12A.

Since the processing base 13A moves on the movable base 12A, the processing base 13A moves with respect to the fixed base 11A when the movable base 12A moves with respect to the fixed base 11A. Accordingly, the drive control based on the target correcting value ,,1 is performed on the sub linear motor 15 to correct movements of the movable member 12A with respect to the fixed base 11A, and to correct deviations of the movable member 12A and the processing base 13A.

The mover device 10A of this embodiment has a positional deviation correcting means that is formed by the procedures of steps S220 through S224 and steps S320 through S328, as described above. With the positional deviation correcting means, a positional deviation of the processing base 13A from the reference position with respect to the fixed base 11A can be corrected. Thus, a decrease of the moving accuracy of the processing base 13A can be prevented.

Since the sub linear motor 15 is used to correct location deviations of the movable base 12A and the processing base 13A, the device structure of this embodiment is simpler than a structure in which a positional deviation correcting means is employed as well as the sub linear motor 15.

Furthermore, the main linear motor 14 moves the processing base 13A, and the sub linear motor 15 controls the moving velocity of the processing base 13A. Accordingly, the moving operation and the moving velocity control operation can be performed separately from each other in this embodiment. Thus, a greater degree of freedom can be allowed in control operations to be performed on the processing base 13A.

After the position correcting processes on positional deviations of the movable base 12A and the processing base 13A with respect to the fixed base 11A are completed in step S328, the operation moves on to step S330. In step S330, the control device 80 determines whether the movable base 12A has entered the uniform velocity region. If the control device 80 determines that the movable base 12A has entered the uniform velocity region ("YES" in step S330), the acceleration control process comes to an end, and the velocity control operation for the movable base 12A switches to the uniform velocity control process of step S28 shown in FIG. 7. If the control device 80 determines that the movable base 12A has not entered the uniform velocity region ("NO" in step S330), the operation moves on to step S332. In step S332, the control device 80 determines whether the moving velocity of the movable base 12A has reached a predetermined uniform velocity.

If the control device 80 determines that the moving velocity of the movable base 12A has not reached the predetermined uniform velocity ("NO" in step S332), the procedures of steps S312 through S332 are repeated. If the control device 80 determines that the moving velocity of the movable base 12A has reached the predetermined uniform velocity ("YES" in step S332), the acceleration control process comes to an end, and the velocity control operation for the movable base 12A switches to the uniform velocity control process of step S28. In this manner, the acceleration control process for the movable base 12A continues until the movable base 12A enters the uniform velocity region or the moving velocity of the movable base 12A reaches the predetermined uniform velocity.

Figure 11:
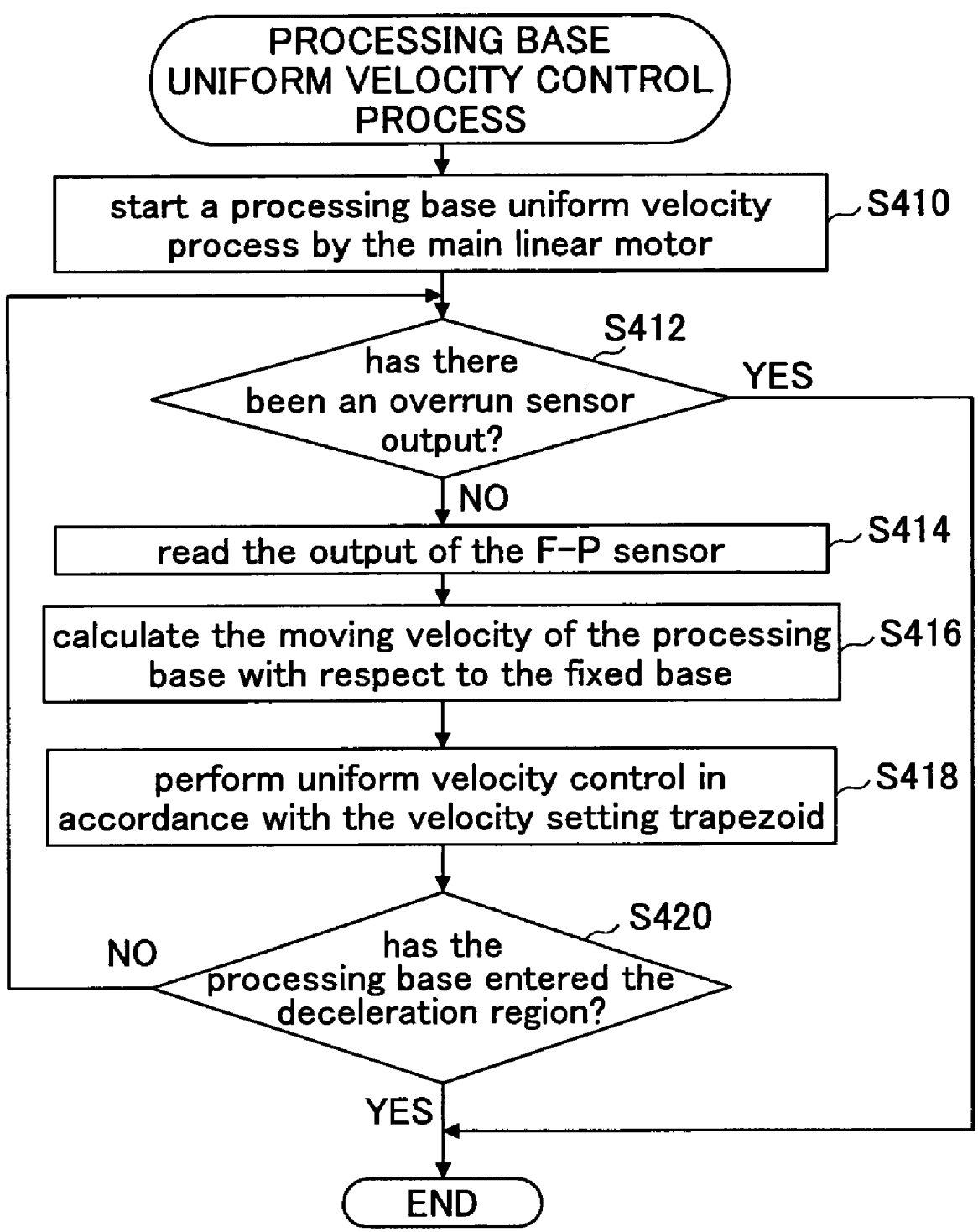
FIG. 11 is a flowchart of a uniform velocity control process to be carried out for the processing base.
Figure 12:
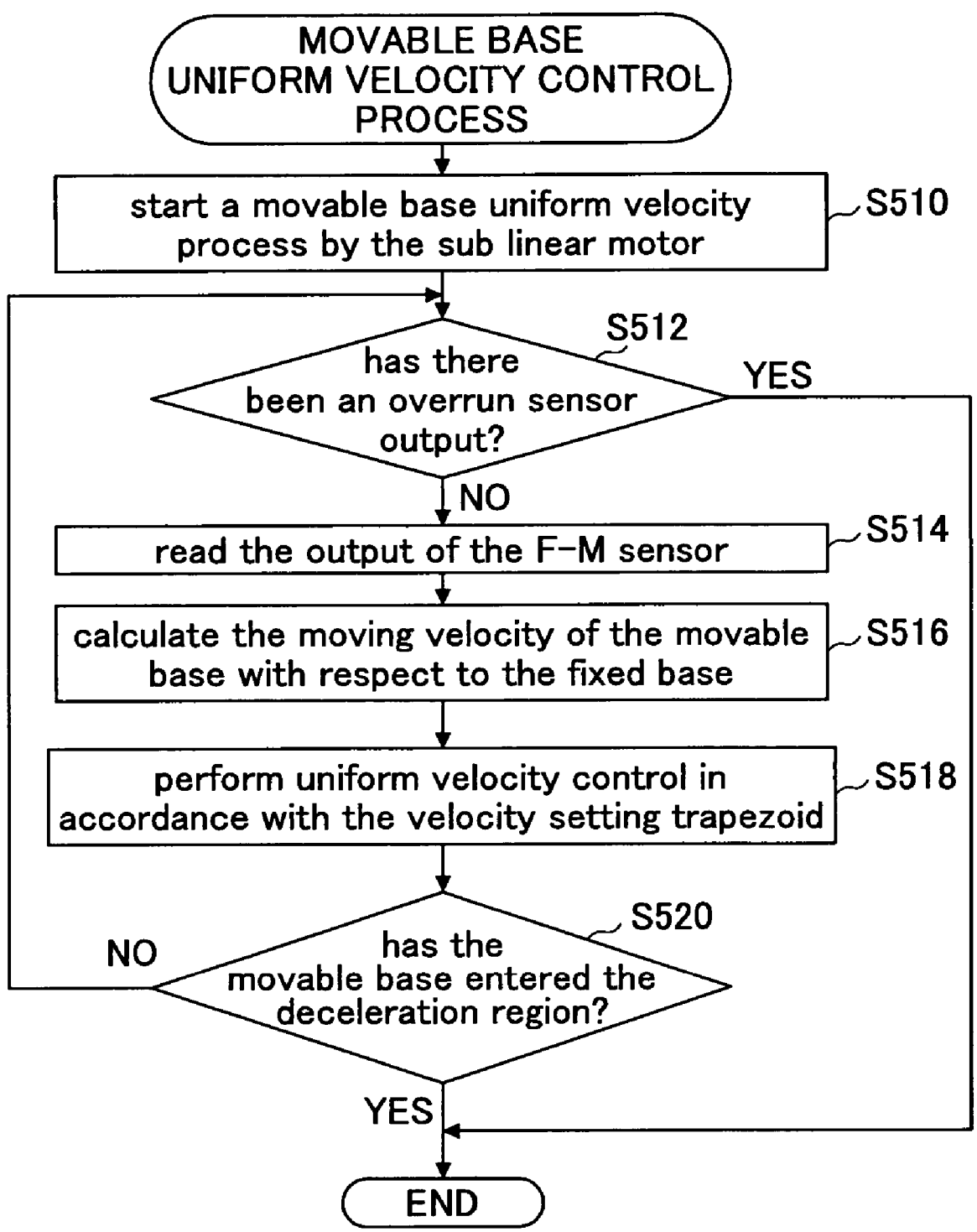
FIG. 12 is a flowchart of a uniform velocity control process to be carried out for the movable base.

The uniform velocity control process of step 28 shown in FIG. 7 will now be described. FIG. 11 is a flowchart of the uniform velocity control process to be carried out for the processing base 13A. FIG. 12 is a flowchart of the uniform velocity control process to be carried out for the movable base 12A.

When the uniform velocity control process for the processing base 13A starts, the control device 80 controls the driving of the main linear motor 14 to move the processing base 13A at a uniform velocity in step S410. In step S412, the control device 80 determines whether there has been an output from the F-P overrun sensor 20. If the control device 80 determines that there has been an output from the F-P overrun sensor 20 in step S412, the procedures of steps S414 through S420 are not carried out, and the uniform velocity control process comes to an end.

If the control device 80 determines that there has not been an output from the F-P overrun sensor 20 ("NO" in step S412), the operation moves on to step S414. In step S414, the output of the F-P sensor 16 is read. In step S416, based on the output of the F-P sensor 16 read in step S414, the control device 80 calculates the moving velocity of the processing base 13A with respect to the fixed base 11A.

In step S418, the control device 80 performs uniform velocity control based on the velocity setting trapezoid A (see FIG. 17) that has been input and stored in advance in step S10 and represents the ideal moving velocity of the processing base 13A. Here, the uniform velocity control based on the velocity setting trapezoid A is performed to control the moving velocity of the processing base 13A to conform to the uniform velocity region of the velocity setting trapezoid A shown in FIG. 17. The moving velocity of the processing base 13A with respect to the fixed base 11A is controlled to conform to the velocity setting trapezoid A shown in FIG. 17, so that the processing base 13A smoothly moves at a uniform velocity.

Specific control methods to be employed by the control device 80 to smoothly move the processing base 13A at a uniform velocity involve smooth feed correction control, feed control using an extended Kalman filter (both being introduced in "Mechanical Design", Vol. 43, No. 16, December 1999, pp. 24-25), robust control (introduced in "Mechanical Design", Vol. 34, No. 17, December 1990, pp. 145-157), or a disturbance observer (introduced in "Mechanical Design", Vol. 43, No. 1, January 1999, pp. 26-27). By any of those methods, the processing base 13A can be smoothly moved at a uniform velocity, and the processor can perform the same processing on each wafer to be placed on the platen 72.

In step S420, the control device 80 determines whether the processing base 13A has entered the deceleration region. If the control device 80 determines that the processing base 13A has not entered the deceleration region ("NO" in step S420), the operation returns to step S412, and the procedures of steps S412 through S420 are repeated.

If the control device 80 determines that the processing base 13A has entered the deceleration region ("YES" in step S420), the uniform velocity control process comes to an end, and the velocity control operation for the processing base 13A switches to the deceleration control process of step S30 shown in FIG. 7. In this manner, the uniform velocity control process for the processing base 13A continues until the processing base 13A enters the deceleration region.

Referring now to FIG. 12, the uniform velocity control process for the movable base 12A will be described. When the uniform velocity control process for the movable base 12A starts, the control device 80 controls the driving of the sub linear motor 15 to move the movable base 12A at a uniform velocity in step S510.

In step S512, the control device 80 determines whether there has been an output from the F-M overrun sensor 19. If the control device 80 determines that there has been an output from the F-M overrun sensor 19 in step S512, the procedures of steps S514 through S520 are not carried out, and the uniform velocity control process comes to an end.

If the control device 80 determines that there has not been an output from the F-M overrun sensor 19 ("NO" in step S512), the output of the F-M sensor 17 is read. In step S516, based on the output of the F-M sensor 17 read in step S514, the control device 80 calculates the moving velocity of the movable base 12A with respect to the fixed base 11A.

In step S518, the control device 80 performs uniform velocity control based on the velocity setting trapezoid B (indicated by the thin solid line in FIG. 17) that has been input and stored in advance in step S10 and represents the ideal moving velocity of the movable base 12A. Here, the uniform velocity control based on the velocity setting trapezoid B is performed to control the moving velocity of the movable base 12A to conform to the uniform velocity region of the velocity setting trapezoid B shown in FIG. 17. The moving velocity of the movable base 12A with respect to the fixed base 11A is controlled to conform to the velocity setting trapezoid B shown in FIG. 17, so that the movable base 12A can smoothly move at a uniform velocity.

The specific control methods that are employed here by the control device 80 to smoothly move the movable base 12A at a uniform velocity are the same as the above described control methods that are employed in the uniform velocity control process for the processing base 13A (smooth feed correction control, feed control using an extended Kalman filter, robust control, and a disturbance observer). In this manner, the movable base 12A can be smoothly moved at a uniform velocity, and accordingly, the processing base 13A can be stably moved at a uniform velocity. Thus, the processor can perform the same processing on each wafer to be placed on the platen 72.

In step S520, the control device 80 determines whether the movable base 12A has entered the deceleration region. If the control device 80 determines that the movable base 12A has not entered the deceleration region ("NO" in step S520), the operation returns to step S512, and the procedures of steps S512 through S520 are repeated.

If the control device 80 determines that the movable base 12A has entered the deceleration region ("YES" in step S520), the uniform velocity control process comes to an end, and the velocity control operation for the movable base 12A switches to the deceleration control process of step S30 shown in FIG. 7. In this manner, the uniform velocity control process for the movable base 12A continues until the movable base 12A enters the deceleration region.

Figure 13:
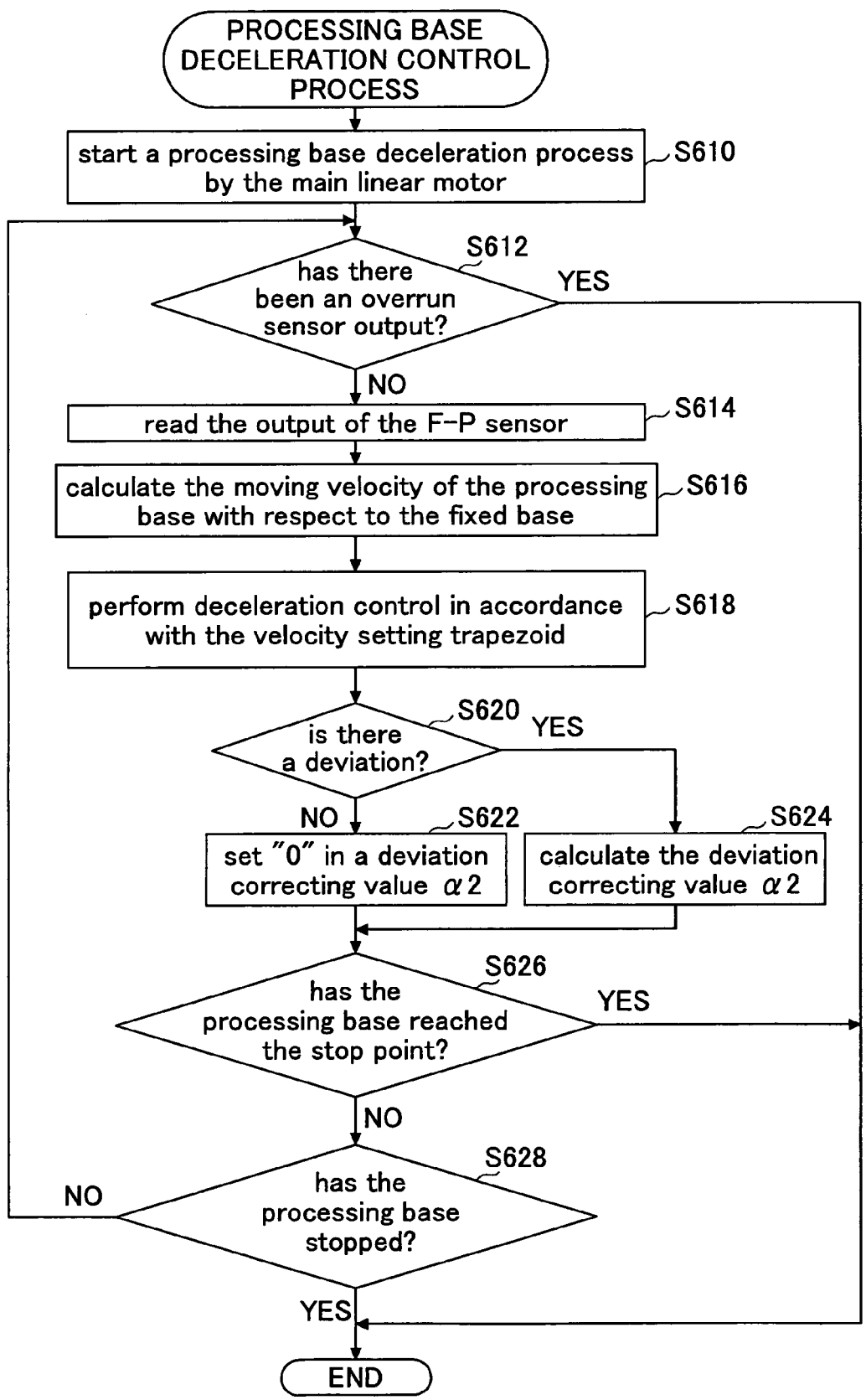
FIG. 13 is a flowchart of a deceleration control process to be carried out for the processing base.
Figure 14:
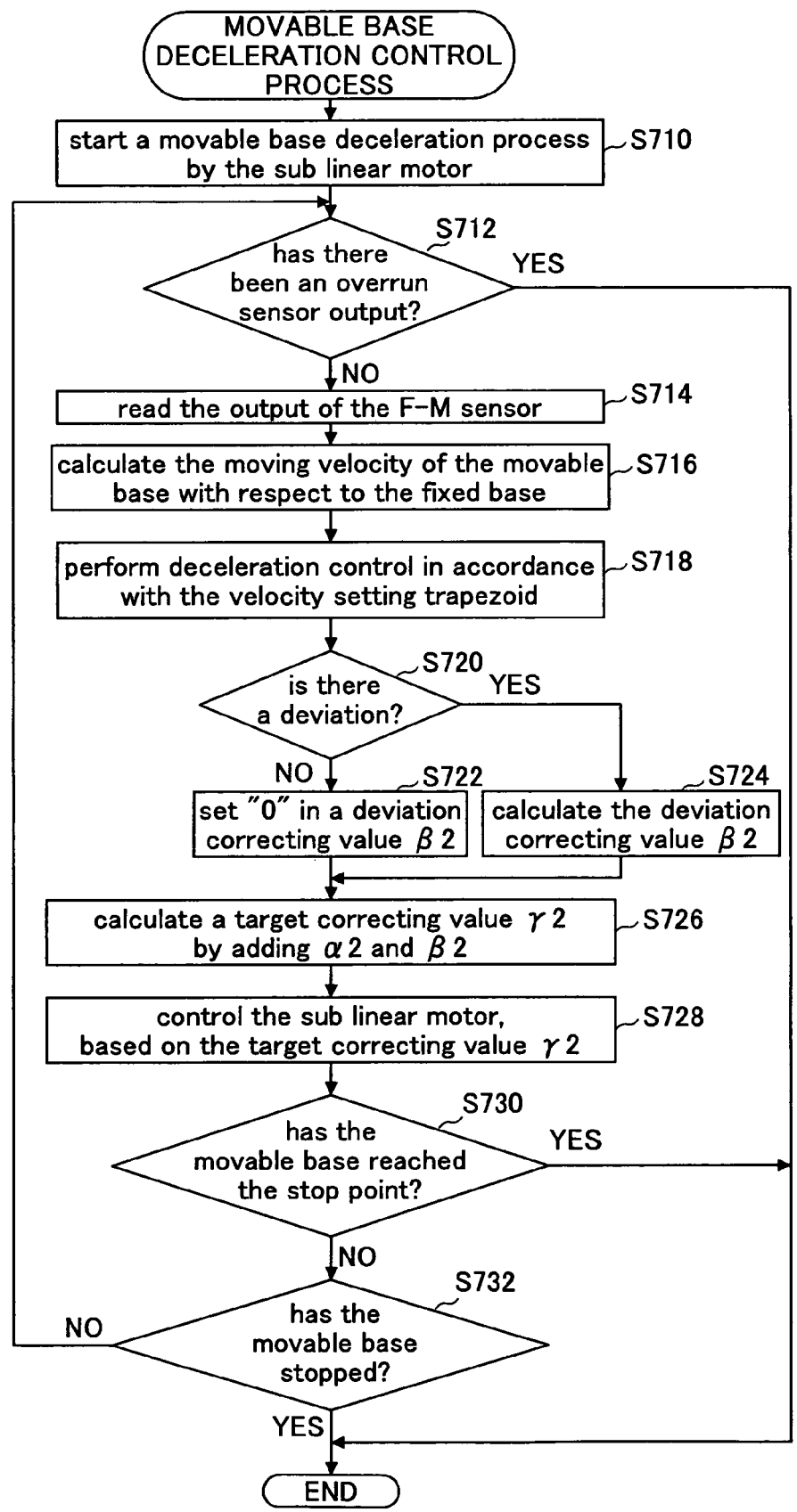
FIG. 14 is a flowchart of a deceleration control process to be carried out for the movable base.

The deceleration control process to be carried out in step S30 in FIG. 7 will now be described. FIG. 13 is a flowchart of a deceleration control process to be carried out for the processing base 13A. FIG. 14 is a flowchart of a deceleration control process to be carried out for the movable base 12A.

When the deceleration control process for the processing base 13A starts, the control device 80 controls the main linear motor 14 to start a deceleration process for the processing base 13A in step S610. In step S612, the control device 80 determines whether there has been an output from the F-P overrun sensor 20. If the control device 80 determines that there has been an output from the F-P overrun sensor 20 in step S612, the procedures of steps S614 through S628 are not carried out, and the deceleration control process comes to an end.

If the control device 80 determines that there has been an output from the F-P overrun sensor 20 ("NO" in step S612), the operation moves on to step S614. In step S614, the output of the F-P sensor 16 is read. In step S616, based on the output of the F-P sensor 16 read in step S614, the control device 80 calculates the moving velocity of the processing base 13A with respect to the fixed base 11A.

In step S618, the control device 80 performs deceleration control based on the velocity setting trapezoid A shown in FIG. 17 that has been input and stored in advance in step S10 and represents the ideal moving velocity of the processing base 13A. Here, the deceleration control based on the velocity setting trapezoid A is performed to control the moving velocity of the processing base 13A to conform to the deceleration region of the velocity setting trapezoid A shown in FIG. 17. In this manner, the moving velocity of the processing base 13A with respect to the fixed base 11A is controlled to conform to the velocity setting trapezoid A shown in FIG. 17, so that the processing base 13A can promptly and smoothly start decelerating.

After the procedure of step S618 is completed, the operation moves on to step S620. In step S620, the moving velocity of the processing base 13A with respect to the fixed base 11A calculated in step S616 is compared with the velocity setting trapezoid A, so as to determine whether there is a difference between the moving velocity of the processing base 13A and the velocity setting trapezoid A.

If there is not a difference detected in step S620, the operation moves on to step S622. In step S622, "0" is set in a deviation correcting value „2 („2=0). If there is a difference detected in step S620, the operation moves on to step S624. In step S624, the deviation correcting value „2 to be used for returning the moving velocity of the processing base 13A to the velocity setting trapezoid A is calculated. The deviation correcting value „2 calculated in step S624 will be reflected in step S726 in the later described deceleration control process for the movable base 12A (see FIG. 14).

In step S626, the control device 80 determines whether the processing base 13A has reached a predetermined stop point. If the control device 80 determines that the processing base 13A bas reached the predetermined stop point ("YES" in step S622), the deceleration control process comes to an end. If the control device 80 determines that the processing base 13A has not reached the predetermined stop point ("NO" in step S626), a forced stop process is carried out to stop the processing base 13A immediately. The operation then moves on to step S628, and the control device 80 determines whether the processing base 13A has stopped (whether the moving velocity has becomes zero).

If the control device 80 determines that the processing base 13A has not stopped ("NO" in step S628), the operation returns to step S612, and the procedures of steps S612 through S628 are repeated. If the control device 80 determines that the processing base 13A has stopped ("YES" in step S628), the deceleration control process comes to an end. In this manner, the deceleration control process for the processing base 13A continues until the processing base 13A reaches the predetermined stop point or comes to a stop.

Referring now to FIG. 14, the deceleration control process to be carried out for the movable base 12A will be described. When the deceleration control process for the movable base 12A starts, the control device 80 controls the driving of the sub linear motor 15 in step S710, so that the movable base 12A starts decelerating. In step S712, the control device 80 determines whether there has been an output from the F-M overrun sensor 19. If the control device 80 determines that there has been an output from the F-M overrun sensor 19, the procedures of steps S714 through S732 are not carried out, and the deceleration control process comes to an end.

If the control device 80 determines that there has not been an output from the F-M overrun sensor 19 ("NO" in step S712), the operation moves on to step S714. In step S714, the output of the F-M sensor 17 is read. In step S716, based on the output of the F-M sensor 17 read in step S714, the control device 80 calculates the moving velocity of the movable base 12A with respect to the fixed base 11A.

In step S718, the control device 80 performs deceleration control based on the velocity setting trapezoid B shown in FIG. 17 that has been input and stored in advance in step S10, and represents the ideal moving velocity of the movable base 12A. Here, the deceleration control based on the velocity setting trapezoid B is performed to control the moving velocity of the movable base 12A to conform to the deceleration region of the velocity setting trapezoid B shown in FIG. 17. In this manner, the moving velocity of the movable base 12A with respect to the fixed base 11A is controlled to conform to the velocity setting trapezoid B, so that the movable base 12A can promptly and smoothly start decelerating.

After the procedure of step S718 is completed, the operation moves on to step S720. In step S720, the moving velocity of the movable base 12A with respect to the fixed base 11A calculated in step S716 is compared with the velocity setting trapezoid B, so as to determine whether there is a difference between the moving velocity of the movable base 12A and the speed setting trapezoid B.

If there is not a difference detected in step S720, the operation moves on to step S722. In step S722, "0" is set in a deviation correcting value „2 („2=0). If there is a difference detected in step S720, the operation moves on to step S724. In step S724, the deviation correcting value „2 to be used for returning the moving velocity of the movable base 12A to the velocity setting trapezoid B is calculated.

In step S726, the deviation correcting value „2 of the processing base 13A obtained in steps S622 and S624 in FIG. 13 is added to the deviation correcting value „2 of the movable base 12A obtained in steps S722 and S724, so as to obtain a target correcting value „2. The target correcting value „2 is a correcting value to be used for correcting a positional deviation of the movable base 12A and a positional deviation of the processing base 13A at the same time.

In step S728, based on the target correcting value „2 obtained in step S726, the control device 80 controls the driving of the sub linear motor 15. Accordingly, based on the target correcting value „2, the control device 80 controls the driving of the sub linear motor 15 in the deceleration region of the movable base 12A, so as to correct a positional deviation of the movable base 12A and a positional deviation of the processing base 13A. In this manner, the driving of the sub linear motor 15 is controlled based on the target correcting value „2, so that movements of the movable base 12A with respect to the fixed base 11A are corrected. Thus, deviations of the movable base 12A and the processing base 13A can be corrected at the same time.

Since the mover device 10A of this embodiment has a positional deviation correcting means formed by the procedures of steps S620 through S624 and steps S720 through S728, any positional deviation of the processing base 13A with respect to the fixed base 11A can be readily corrected, and a decrease of the moving accuracy of the processing base 13A can be prevented. Furthermore, the main linear motor 14 moves the processing base 13A in the deceleration region, and the sub linear motor 15 controls the moving velocity of the processing base 13A. Accordingly, the moving operation and the movement control operation can be performed separately. Thus, a greater degree of freedom can be allowed in control operations to be performed on the processing base 13A.

After positional deviations of the movable base 12A and the processing base 13A with respect to the fixed base 11A are corrected in step S728, the operation moves to step S730. In step S730, the control device 80 determines whether the movable base 12A has reached a predetermined stop point. If the control device 80 determines that the movable base 12A has reached the predetermined stop point ("YES" in step S730), the deceleration control process comes to an end. If the control device 80 determines that the movable base 12A has not reached the predetermined stop point ("NO" in step S730), a forced stopping process is carried out, and the operation moves on to step S732. In step S732, the control device 80 determines whether the movable base 12A has stopped.

If the control device 80 determines that the movable base 12A has not stopped ("NO" in step S732), the operation returns to step S712, and the procedures of steps S712 through S732 are repeated. If the control device 80 determines that the movable base 12A has stopped ("YES" in step S732), the deceleration control process comes to an end. In this manner, the deceleration control process for the movable base 12A continues until the movable base 12A comes to a stop.

Referring back to FIG. 7, the movement control operation to be performed on the processing base 13A will be further described. After the acceleration control process of step S26 (the procedures shown in FIGS. 9 and 10), the uniform velocity control process of step S28 (the procedures shown in FIGS. 11 and 12), and the deceleration control process of step S30 (the procedures shown in FIGS. 13 and 14) are completed, the operation moves on to step S32. In step S32, a deviation correcting process is carried out for the movable base 12A.

Therefore, in the control method of the mover device 10A, the sub linear motor 15 as the auxiliary driving unit is provided between the fixed base 11A and the movable base 12A. In the uniform velocity control interval of the processing base 13A driven by the main linear motor 14, the movable base 12A against the fixed base 11A is controlled by the sub linear motor 15 so as to have the uniform velocity. In the acceleration and deceleration interval of the processing base 13A, a gap of the movable base 12A against the fixed base 11A is adjusted by the sub linear motor 15.

Figure 15:
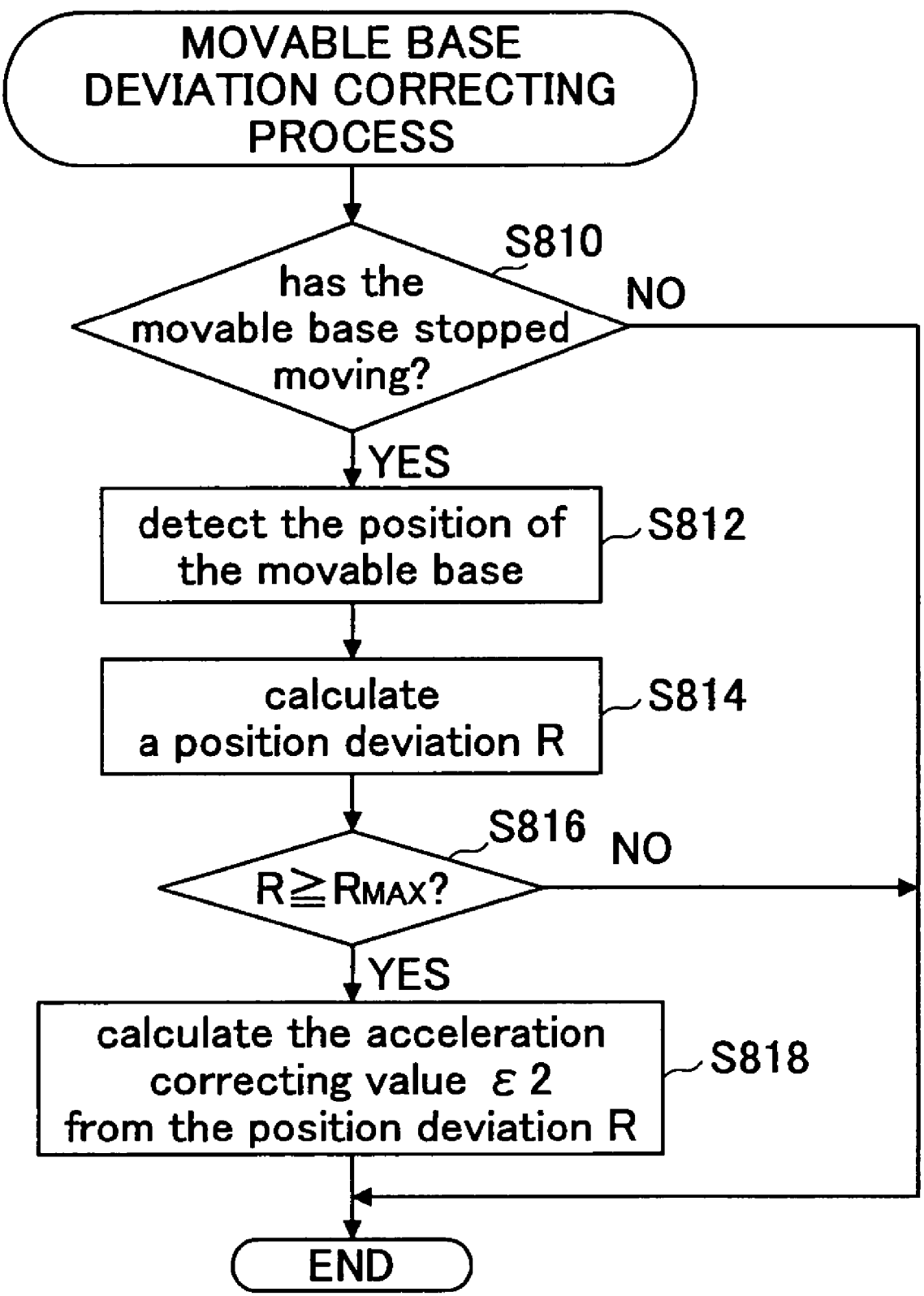
FIG. 15 is a flowchart of a deviation correcting process to be carried out for the movable base.

FIG. 15 is a flowchart of the deviation correcting process for the movable base 12A to be carried out in step S32 in FIG. 7. When the deviation correcting process is started, the control device 80 determines whether the movable base 12A has stopped moving in step S810, based on the determination result of step 732 shown in FIG. 14. If the control device 80 determines that the movable base 12A has not stopped moving ("NO" in step S810), the deviation correcting process comes to an end, because a positional deviation of the movable base 12A that is still moving cannot be measured with accuracy.

If the control device 80 determines that the movable base 12A has stopped moving ("YES" in step S810), the operation moves on to step S812. In step S812, the position of the movable base 12A is detected. More specifically, the position of the movable base 12A with respect to the fixed base 11A is calculated from the output of the F-M sensor 17.

In step S814, the positional deviation R of the movable base 12A from the normal position with respect to the fixed base 11A is calculated. More specifically, so as to calculate the positional deviation R, the actual stopping position of the movable base 12A detected in step S812 is compared with a predetermined stopping position. If the actual stopping position is the same as the predetermined stopping position, there is not a positional deviation. If the actual stopping position is different from the predetermined stopping position, the difference is regarded as the positional deviation R.

In step S816, the control device 80 determines whether the positional deviation R calculated in step S814 is equal to or greater than a predetermined allowable positional deviation RMAX. If the control device 80 determines that the positional deviation R is not equal to or greater than the predetermined allowable positional deviation RMAX ("NO" in step S816), the procedure of step S818 is not carried out, and the positional deviation correcting process for the movable base 12A comes to an end, because the positional deviation R in this case is too small to be corrected.

If the control device 80 determines that the positional deviation R is equal to or greater than the predetermined allowable positional deviation RMAX ("YES" in step S816), the operation moves on to step S818, because the positional deviation R in this case is so large as to hinder accurate movements of the movable base 12A.

In step S818, the acceleration correcting value „2 is calculated based on the positional deviation R calculated in step S814. The calculation of the acceleration correcting value „2 is performed in the following manner. First, the stopping position of the movable base 12A is determined whether to be before or after the predetermined stopping position, so as to decide the sign of the acceleration correcting value „2. The absolute value of the acceleration correcting value „2 is then decided from the distance between the actual stopping position and the predetermined stopping position.

The acceleration correcting value „2 calculated in step S818 is temporarily stored in the control device 80, and is reflected in the acceleration control performed on the movable base 12A in step S318 in the acceleration control process for the movable base 12A shown in FIG. 10.

Figure 16:
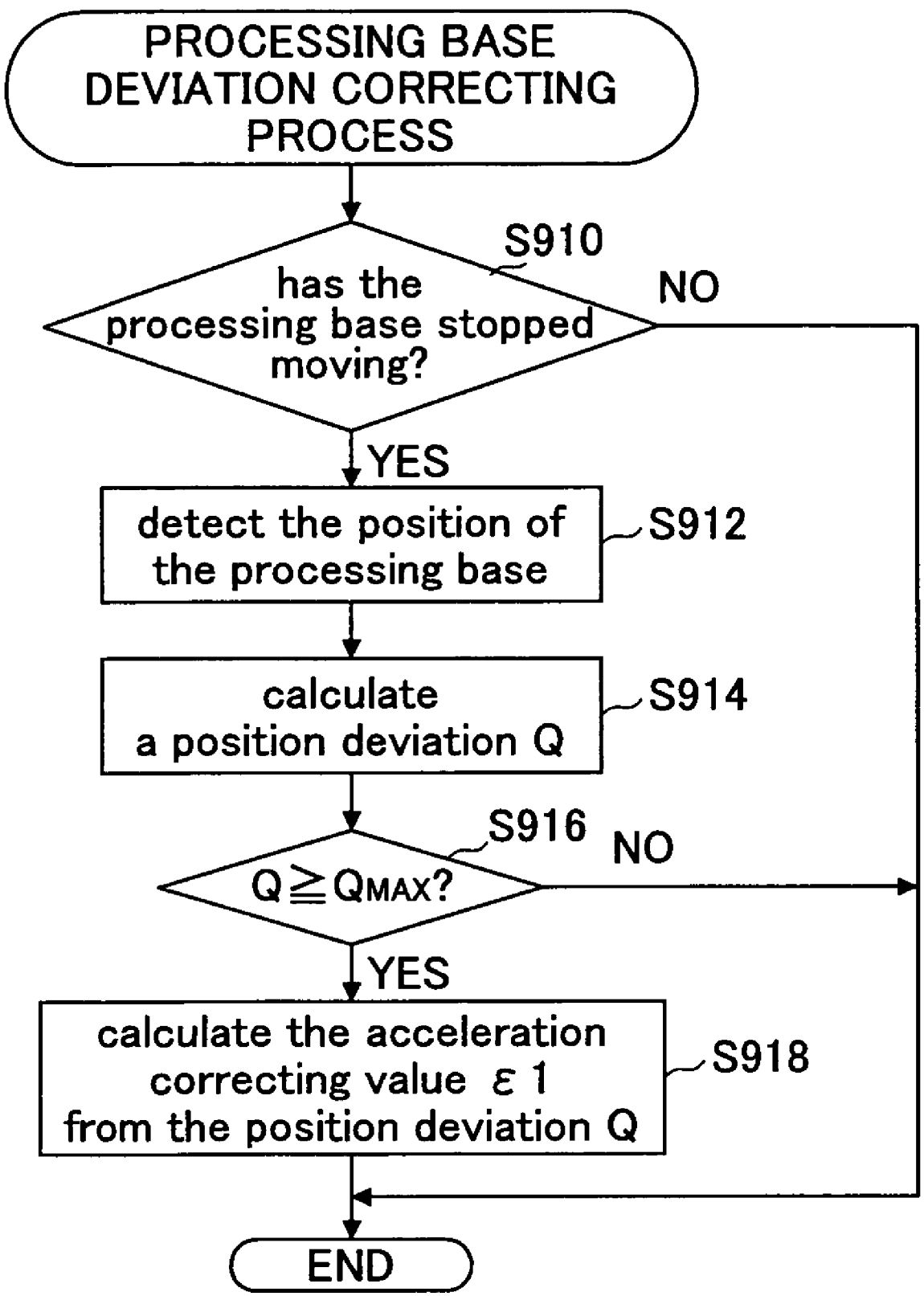
FIG. 16 is a flowchart of a deviation correcting process to be carried out for the processing base.

After the deviation correcting process for the movable base 12A in step S32 is completed, the operation moves on to step S34. In step S34, a deviation correcting process is carried out for the processing base 13A. FIG. 16 is a flowchart of the deviation correcting process to be carried out for the processing base 13A in step S34 in FIG. 7.

When the deviation correcting process is started, the control device 80 determines whether the processing base 13A has stopped moving in step S910, based on the determination result of step S628 shown in FIG. 13. If the control device 80 determines that the processing base 13A has not stopped moving ("NO" in step S910), the deviation correcting process comes to an end, because a positional deviation of the processing base 13A that is still moving cannot be measured with accuracy.

If the control device 80 determines that the processing base 13A has stopped moving ("YES" in step S910), the operation moves on to step S912. In step S912, the position of the processing base 13A is detected. More specifically, based on the output of the P-M sensor 18, the control device 80 calculates the position of the processing base 13A with respect to the movable base 12A.

In step S914, a positional deviation Q of the processing base 13A from the normal position with respect to the movable base 12A is calculated. More specifically, the positional deviation Q is calculated by comparing the actual stopping position of the processing base 13A detected in step S912 with a predetermined stopping position. If the actual stopping position is the same as the predetermined stopping position, there is not a positional deviation. If the actual stopping position is different from the predetermined stopping position, the difference is regarded as the positional deviation Q.

In step S916, the control device 80 determines whether the positional deviation Q calculated in step S914 is equal to or greater than a predetermined allowable positional deviation QMAX. If the control device 80 determines that the positional deviation Q is not equal to or greater than the predetermined allowable positional deviation QMAX ("NO" in step S916), the procedure of step S918 is not carried out, and the positional deviation correcting process for the processing base 13A comes to an end, because the positional deviation Q in this case is too small to be corrected.

If the control device 80 determines that the positional deviation Q is equal to or greater than the predetermined allowable positional deviation QMAX ("YES" in step S916), the operation moves on to step S918, because the positional deviation Q in this case is so large as to hinder accurate movements of the processing base 13A.

In step S918, the acceleration correcting value „1 is calculated based on the positional deviation Q calculated in step S914. The calculation of the acceleration correcting value „1 is performed in the following manner. First, the stopping position of the processing base 13A is determined whether to be before or after the predetermined stopping position, so as to decide the sign of the acceleration correcting value „1. The absolute value of the acceleration correcting value „1 is then decided from the distance between the actual stopping position and the predetermined stopping position.

The acceleration correcting value „1 calculated in step S918 is temporarily stored in the control device 80, and is reflected in the acceleration control performed on the processing base 13A in step S218 in the acceleration control process for the processing base 13A shown in FIG. 9.

As described above, in the mover device 10A of this embodiment, the positional deviations R and Q of the movable base 12A and the processing base 13A are detected, and the acceleration correcting values „2 and „1 are determined from the positional deviations R and Q. The acceleration correcting values „2 and „1 are reflected in the acceleration control to be performed in accordance with the velocity setting trapezoids A and B, so that positional deviations of the movable base 12A and the processing base 13A can be automatically corrected at the time of the acceleration control. Thus, positional deviations of the movable base 12A and the processing base 13A can be readily corrected with accuracy.

In the acceleration region, the processor does not perform processing on wafers. Therefore, positional deviations of the movable base 12A and the processing base 13A are corrected at the time of the acceleration control. By doing so, the precision in wafer processing is not adversely affected by a change of the moving velocity from the ideal moving velocity in the acceleration region.

In this embodiment, positional deviations of the movable base 12A and the processing base 13A are detected by the F-M sensor 17 and the P-M sensor 18 that are also used for movement control operations. Accordingly, the mover device 10A has a simpler structure and requires fewer components than a structure in which a positional deviation detector is employed as well as the sensors 17 and 18.

The method of detecting positional deviations of the movable base 12A and the processing base 13A is not limited to the above described method. It is possible to employ a method of detecting positional deviations of the movable base 12A and the processing base 13A based on the phases of the coils and the magnets of the linear motors 14 and 15. By such a method, the mover device 10A can have a simpler structure and requires fewer components than a structure in which a positional deviation detector is employed separately from other components.

Referring now to FIGS. 18A through 20C, mover devices 10B through 10D in accordance with second through fourth embodiments of the present invention will be described. In FIGS. 18A through 20C, the same components as those shown in FIGS. 1A through 5H are denoted by the same reference numerals as those in FIGS. 1A through 5H, and explanation of them will be omitted.

In the control method of the mover device 10A, the main linear motor 14 as moving force generation means performs asynchronous driving so as to shift timings of pulse driving to a coil unit for the main linear motor 14 as a main moving device and pulse driving of the coil unit 56 for the sub linear motor 15 as auxiliary driving means to achieve non-driving interference.

In this control method, a management adjustment device of the pulse is provided at the control device 80. The management adjustment device watches a pulse cycle for preventing the coil unit 74 for the main linear motor 14 and the coil unit 56 for the sub linear motor 15 from simultaneously driving for a minute time and preventing the driving pulse from synchronizing. For example, in a case of the same cycle and same pulse width, the management adjustment device manages so as to shift the cycle, so that when one is a mountain (maximum) of the pulse and the other is a value of zero.

Second Embodiment

FIGS. 18A through 18F illustrate the mover device 10B in accordance with the second embodiment.

The mover device 10A of the first embodiment has only one moving force generator, which is the main linear motor 14. The mover device 10B of this embodiment, on the other hand, has two main linear motors 14A and 14B. With the two main linear motors 14A and 14B that function as moving force generators, the acceleration and the deceleration of the processing base 13A can be increased. Also, even if the weight of the processing base 13A increases as the parts of the processing base 13A become larger to accommodate larger wafers, the processing base 13A of this embodiment can stably reciprocate with precision.

Third Embodiment

FIGS. 19A through 19F illustrate the mover device 10C in accordance with the third embodiment.

In the mover device 10A of the first embodiment, the wafer attaching face of the platen 72 is perpendicular to the fixed base 11A. In the mover device 10C of this embodiment, on the other hand, the wafer attaching face of the platen 72 provided on the processing base 13A is in parallel with the fixed base 11A. With this structure, each wafer can be processed in a laid state.

Fourth Embodiment

FIGS. 20A through 20C illustrate the mover device 10D in accordance with the fourth embodiment. The mover device 10A in accordance with the first embodiment has the sub linear motor 15. On the other hand, the mover device 10D of this embodiment does not include the sub linear motor 15.

Since a driving means for moving the movable base 12A with respect to a fixed base 11B does not exist in this embodiment, the movable base 12A is moved by the repulsion force generated from the processing base 13A moving with respect to the movable base 12A. Also, in the first embodiment, the sub linear motor 15 is used for correcting a positional deviation of the movable base 12A in the first embodiment. In the mover device 10D of this embodiment, however, the sub linear motor 15 does not exist, and deviation correcting operations cannot be performed. Therefore, the mover device 10D of this embodiment is equipped with positional deviation correcting mechanisms 81 instead.

The positional deviation correcting mechanisms 81 are provided on sideboards 84 that stand at the X1-side end and the X2-side end of the fixed base 11B. Each of the positional deviation correcting mechanisms 81 includes a spring 82 and an adjuster 83 that shifts the spring 82 to the X1 side or the X2 side.

Each spring 82 faces the outer face of the corresponding sideboard 84 attached to the movable base 12A. Each adjuster 83 has a rotation lever that is rotated by an operator to shift the corresponding spring 82 to the X1 side or the X2 side. The movable base 12A reciprocates between the pair of springs 82.

In this structure, the movable base 12A might deviate from the predetermined position due to the load of the cable bearings 46A and 46B, for example. More specifically, if the movable base 12A deviates to the X1 side from the predetermined stopping position shown in FIG. 20A, the movable base 12A moves in the X1 direction and comes in contact with the spring 82 on the X1 side.

When the movable base 12A comes in contact with the spring 82, the positional deviation correcting mechanism 81 on the X1 side pushes the movable base 12A to the X2 side (pushes the movable base 12A back) by virtue of the elasticity of the spring 82. In this manner, a positional deviation of the movable base 12A is corrected. In this embodiment that does not include the sub linear motor 15, the positional deviation correcting mechanisms 81 directly correct positional deviations of movable base 12A.

Each of the positional deviation correcting mechanisms 81 can also adjust the position of the spring 82 with the adjuster 83, so as to control a positional deviation correcting range. Accordingly, the positional deviation correcting mechanisms 81 can readily cope with a case where the moving force generated from the main linear motor 14 increases or decreases, or a case where the condition setting of the mover device 10D is changed.

Fifth Embodiment

FIGS. 21A through 21C illustrate a mover device 10E in accordance with a fifth embodiment of the present invention. In each of the foregoing embodiments, the main linear motor 14 is used as a moving force generator to move the processing base 13A with respect to the movable base 12A. In the mover device 10E of this embodiment, however, a fluid actuator 90 is employed instead of the main linear motor 14. Although the fluid actuator 90 of this embodiment is an air pressure actuator, it is possible to employ an actuator using a fluid other than air.

The fluid actuator 90 includes a guide shaft that has both ends fixed to a movable base 12C and is formed integrally with the center part connecting body 52, and a slider that is formed integrally with a processing base 13C that moves along the center part connecting body 52. The slider is a cylindrical body that surrounds the guide shaft. A space to be used as a pressure chamber is formed between the outer surface of the guide shaft and the slider.

Also, a static pressure air bearing is provided at either end of the slider (the processing base 13C). Further, either end of the slider is connected to a cylinder air supply system, so that compressed air can leave and enter two cylinder chambers formed in the slider. The pair of cylinder air supply systems each has a servo valve that is connected to a compressed air supply source.

When compressed air is supplied to the static pressure air bearings in this structure, the processing base 13C (the slider) slightly lifts off the center part connecting body 52 (the guide shaft). Here, one of the servo valves is opened to the air while the other one is connected to the compressed air supply source. As a result, the processing base 13C (the slider) moves in one direction on the movable base 12C. If the connection to the compressed air supply source is switched between the servo valves, the processing base 13C moves in the opposite direction. The opening of the pair of servo valves is controlled in such a manner that the processing base 13C can reciprocate with respect to the movable base 12C.

With the fluid actuator 90 as a moving force generator, a driving force generated from the compressed air supply source for the processing base 13C can be greater than a driving force generated from the main linear motor 14. Thus, the mover device 10E of this embodiment can move the processing base 13C at high speed.

In some of the foregoing embodiments, the springs 82 are employed to directly correct positional deviations of the movable base 12A (12C). However, it is also possible to employ magnets to correct positional deviations. In such a case, positional deviations of the movable base 12A (12C) can also be corrected with a simple mechanism.

Also, in some of the foregoing embodiments, linear motors are employed as moving force generators. However, it is possible to employ a fluid actuator (or an air actuator) as a moving force generator, instead of a linear motor.

In the following, semiconductor manufacturing devices in the form of ion implanter apparatuses to which the mover devices 10A through 10D are incorporated will be described.

Sixth Embodiment

Figure 22C:
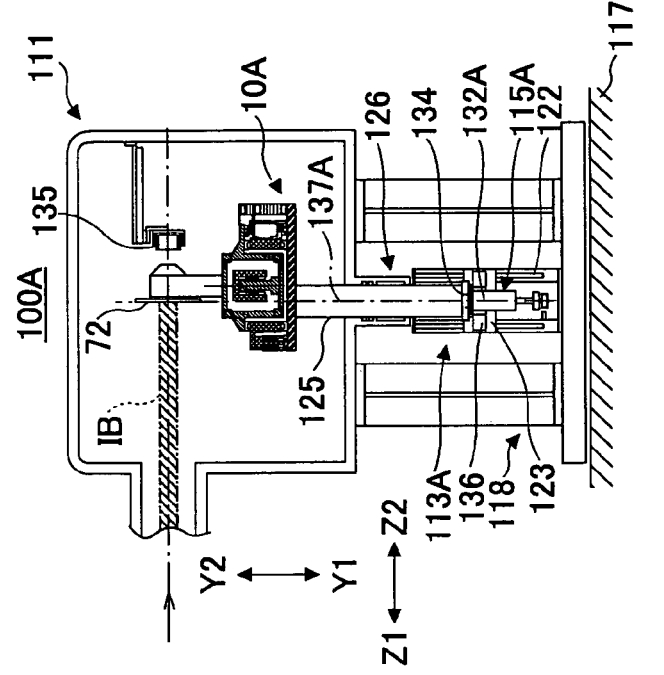
FIG. 22C is a right side view illustrating the ion implanter apparatus in accordance with the sixth embodiment.
Figure 22A:
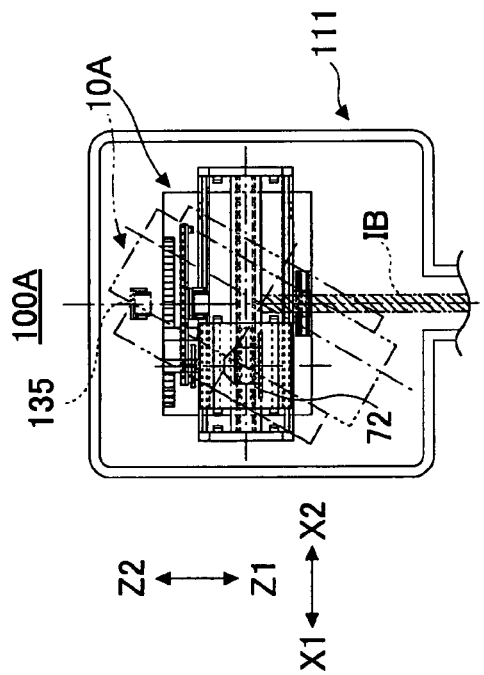
FIG. 22A is a plan view illustrating the hardware structure of an ion implanter apparatus in accordance with a sixth embodiment of the present invention.
Figure 22B:
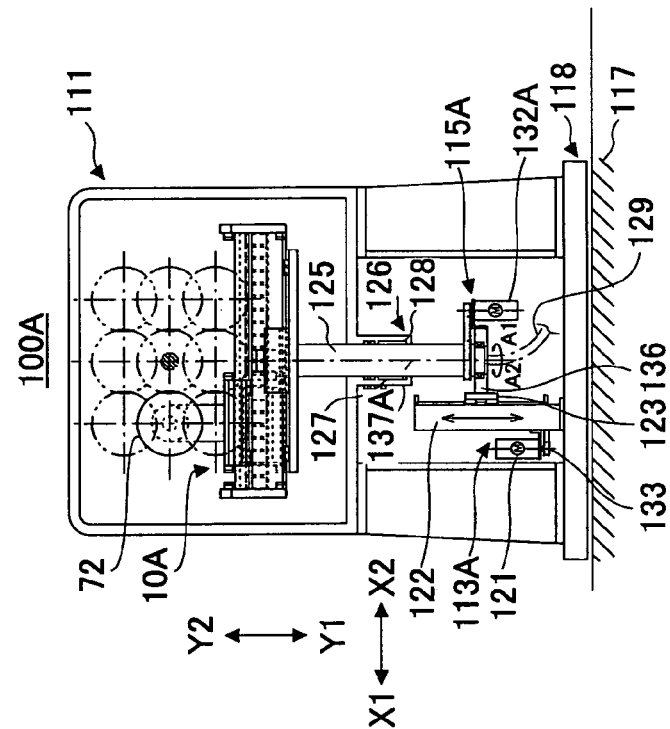
FIG. 22B is a front view illustrating the ion implanter apparatus in accordance with the sixth embodiment.
Figure 23C:
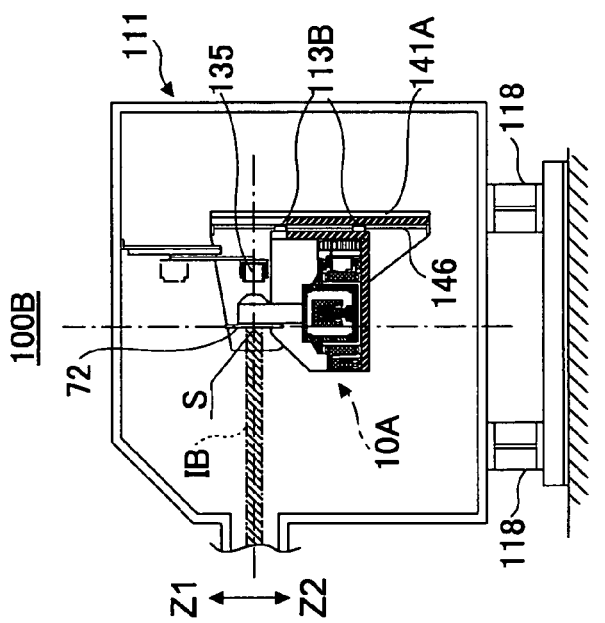
FIG. 23C is a right side view illustrating the ion implanter apparatus in accordance with the seventh embodiment.
Figure 23A:
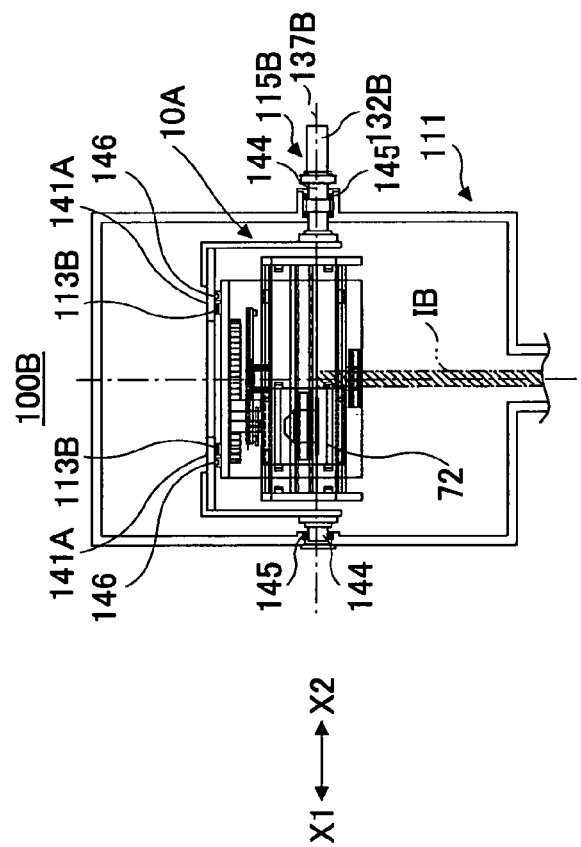
FIG. 23A is a plan view illustrating the hardware structure of an ion implanter apparatus in accordance with a seventh embodiment of the present invention.
Figure 23B:
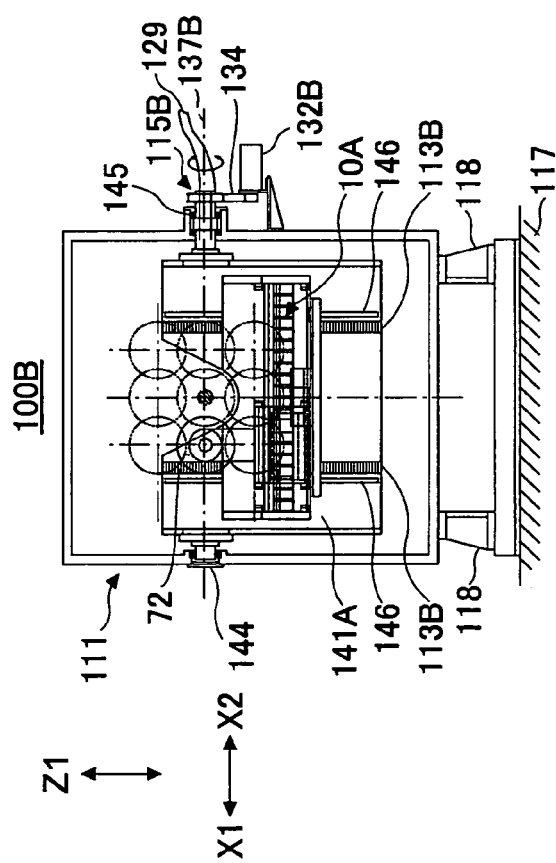
FIG. 23B is a front view illustrating the ion implanter apparatus in accordance with the seventh embodiment.

FIGS. 22A through 22C illustrate an ion implanter apparatus 100A in accordance with a sixth embodiment of the present invention. The ion implanter apparatus 100A includes the mover device 10A.

More specifically, the ion implanter apparatus 100A includes the mover device 10A, a vacuum processing chamber 111, and driving mechanisms 113A and 115A. The driving mechanism 113A moves the mover device 10A in the directions of the arrows Y1 and Y2 shown in the drawings. The driving mechanism 115A tilts the mover device 10A.

In the ion implanter apparatus 100A of this embodiment, the mover device 10A is provided inside the vacuum processing chamber 111, and the driving mechanisms 113A and 115A are provided outside the vacuum processing chamber 111.

When the platen 72 of the mover device 10A is in the reference attachment position (in the initial state prior to the start of an operation), the wafer attaching face 12 is vertical. Accordingly, ion beams (hereinafter referred to as IB) are horizontally emitted to the platen 72. In this structure, even if there is dust laid on a wafer attached to the platen 72, the dust naturally falls off as a result of gravity.

Further, a Faraday cup 135 is provided behind the platen 72 (on the side of the arrow Z2 in FIGS. 22A and 22C). The Faraday cup 135 measures the current of the IB emitted to each wafer attached to the platen 72, and is located at the IB impinging point, facing the emitted IB.

As the mover device 10A is provided inside the vacuum processing chamber 111, a power source for the mover device 10A and cooling media for the coil units 56 and 74 need to be drawn into the vacuum chamber 111 from the outside. In this embodiment, these components are collectively provided through a collective cable 129, and the collective cable 129 is connected to the movable device 10A in the vacuum chamber via a hollow pillar 125. The hollow pillar 125 rotates in the directions of the arrows A1 and A2 (shown in FIG. 22B) and moves up and down in the directions of the arrows Y1 and Y2.

The driving mechanism 113A moves the mover device 10A in the directions of the arrows Y1 and Y2 shown in the drawings. In this embodiment, the driving mechanism 113A is provided outside the vacuum processing chamber 111. The driving mechanism 113A includes a Y-direction driving motor 121, an elevating mechanism 122, a table 124, and the pillar 125.

The Y-direction driving motor 121 drives the elevating mechanism 122. The elevating mechanism 122 is formed by a ball screw, or the like. The lower end of the ball screw is connected to the Y-direction driving motor 121 with a belt 133. The ball screw is engaged with an engaging part 123, and a flange 136 fixed to the lower end of the pillar 125 is integrally joined to the engaging part 123.

In this structure, when the Y-direction driving motor 121 is driven, the ball screw of the elevating mechanism 122 rotates, and the engaging part 123 selectively moves up and down in the directions of the arrows Y1 and Y2 in accordance with the rotational direction of the Y-direction driving motor 121. Since the flange 136 fixed to the lower end of the pillar 125 is integrally joined to the engaging part 123, the pillar 125 moves up and down with the flange 136 as the engaging part 123 moves up and down.

The upper part (a part on the Y2 side) of the pillar 125 is located inside the vacuum processing chamber 111, and the lower part (a part on the Y1 side) of the pillar 125 is located outside the vacuum processing chamber 111. The vacuum processing chamber 111 is provided above a base 118 placed on an installation board 117. The inside of the vacuum processing chamber 111 is maintained at a predetermined degree of vacuum by a vacuum pump (not shown).

The pillar 125 is inserted in the vacuum processing chamber 111 via an air bearing 126. The air bearing 126 is formed by a differential exhaust part 127 and a jetting part 128. With this structure, the degree of vacuum in the vacuum processing chamber 11 does not drop, even though the pillar 125 is inserted in the vacuum processing chamber 111.

The pillar 125 is designed to rotate, with respect to the vacuum processing chamber 111, in the directions of A1 and A2 on an axis (denoted by reference numeral 137A) that is perpendicular to the moving directions (the X1 and X2 directions) of the processing base 13A. The pillar 125 is also designed to move in the directions of the arrows Y1 and Y2. The mover device 10A is provided at the upper end (the Y2-side end) of the pillar 125.

As the mover device 10A is contained in the ion implanter apparatus 100A, the processing base 13A having the platen 72 can be smoothly moved at high speed. Accordingly, each wafer that is attached to the platen 72 can be moved with IB at high speed. Thus, the throughput of ion implanting into each wafer can be increased.

In the ion implanter apparatus 100A, the mover device 10A can be tilted, and can rotate on the axis 137A that is perpendicular to the moving directions of the processing base 13A. With this structure, the processing base 13A can be arbitrarily moved with the IB impinging direction with respect to each wafer attached to the platen 72. Thus, the ion implanting condition for each wafer can be arbitrarily set.

The ion implanter apparatus 100B in accordance with a seventh embodiment of the present invention will now be described.

Seventh Embodiment

FIGS. 23A through 24B illustrate the ion implanter apparatus 100B in accordance with the seventh embodiment. In FIGS. 23A through 24B and 25A through 25C, the same components as those shown in FIGS. 22A through 22C are denoted by the same reference numerals as those in FIGS. 22A through 22C, and explanation of them will be omitted in the following description.

In the ion implanter apparatus 100A of the sixth embodiment, the driving mechanism 113A is provided outside the vacuum processing chamber 111. In the ion implanter apparatus 100B of this embodiment, however, a driving mechanism 113B that moves the mover device 10A in the directions of the arrows Y1 and Y2 is also provided inside the vacuum processing chamber 111.

The mover device 10A is provided on a base board 141A that is axially held by a rotational shaft 144 in the vacuum processing chamber 111. The driving mechanism 113B moves the mover device 10A in the directions of the arrows Y1 and Y2 with respect to the base board 141A. Accordingly, the platen 72, to which each wafer is to be attached, is moved in the directions of the arrows X1 and X2 at high speed by the mover device 10A, and is also moved in the directions of the arrows Y1 and Y2 by the driving mechanism 113B. Thus, IB can be emitted onto the entire surface of each wafer that is attached to the platen 72.

The mover device 10A is moved in the directions of the arrows Y1 and Y2 by a linear guide 146 that is provided between the mover device 10A and the base board 141A. In this structure, the mover device 10A, which is a heavy device, can be smoothly moved in the directions of Y1 and Y2 with precision.

A driving mechanism 115B will now be described. The driving mechanism 115B is formed by a tilting motor 132B and the base board 141A. The base board 141A has the rotational shaft 144 at either end. The rotational shaft 144 is axially held by bearings 145 provided on the vacuum processing chamber 111. In this manner, the base board 141A is axially and movable held by the vacuum processing chamber 111.

The X2-side end of the rotational shaft 144 extends outward from the vacuum processing chamber 111, and the extending part of the rotational shaft 144 is connected to the tilting motor 132B with a belt 134. When the tilting motor 132B is driven, the base board 141A swings about the rotational shaft 144.

The rotation center of the rotational shaft 144 is designed to pass through the center S of each wafer to be attached to the platen 72. When the tilting motor 132B is driven, the platen 72 (each wafer) tilts with respect to the center axis of the rotational shaft 144 (the center axis being a tilting axis 137B). The tilting axis 137B lies in parallel with the moving directions (the directions of the arrows X1 and X2 in this embodiment) of the platen 72.

In FIG. 24D, the arrow D1 indicates a situation in which the driving mechanism 115B tilts the platen 72 through an angle of 60 degrees. The driving mechanism 115B rotates (tilts) the mover device 10A, so that the IB impinging angle with respect to each wafer can be arbitrarily set.

In FIG. 24B, the arrow D2 indicates a situation in which the driving mechanism 115B tilts the platen 72 through an angle of approximately 90 degrees. In this situation, the platen 72 faces upward, and a wafer is attached to or detached from the platen 72.

Eighth Embodiment

The ion implanter apparatus 100C in accordance with an eighth embodiment of the present invention will now be described. FIGS. 25A through 25C illustrate the ion implanter apparatus 100C in accordance with the eighth embodiment. The ion implanter apparatus 100C is characterized by the mover device 10C of the third embodiment. The mover device 10C is designed to have the wafer attaching face of the platen 20 in parallel with the fixed base 11A, as described earlier.

Since the mover device 10C of the ion implanter apparatus 100C does not include the stay frame 71, the moment generated at the platen 72 in the reciprocation movements (in the directions of X1 and X2) is smaller. For the same reason, the vacuum processing chamber 111 can be made smaller, and accordingly, the ion implanter apparatus 100C and the vacuum pump to be connected to the vacuum processing chamber 111 can be made smaller.

Ninth Embodiment

Next, a mover device 10F of the ninth embodiment of the present invention is discussed. In the above-discussed embodiments, the movable base 12A is driven by the main linear motor 14 and the processing base 13 is driven by the sub linear motor 15. As a result of this, the movable base 12A is moved by virtue of the reaction force caused by the moving force to move the processing base 13A. The reaction force generated at the time of accelerating or decelerating the processing base 13A is absorbed by the movement of the movable base 12A, and does not reach the fixed base 11A. In the ninth embodiment, the mover device 10F having a pulley driving type cooperative device is used.

Figure 26:
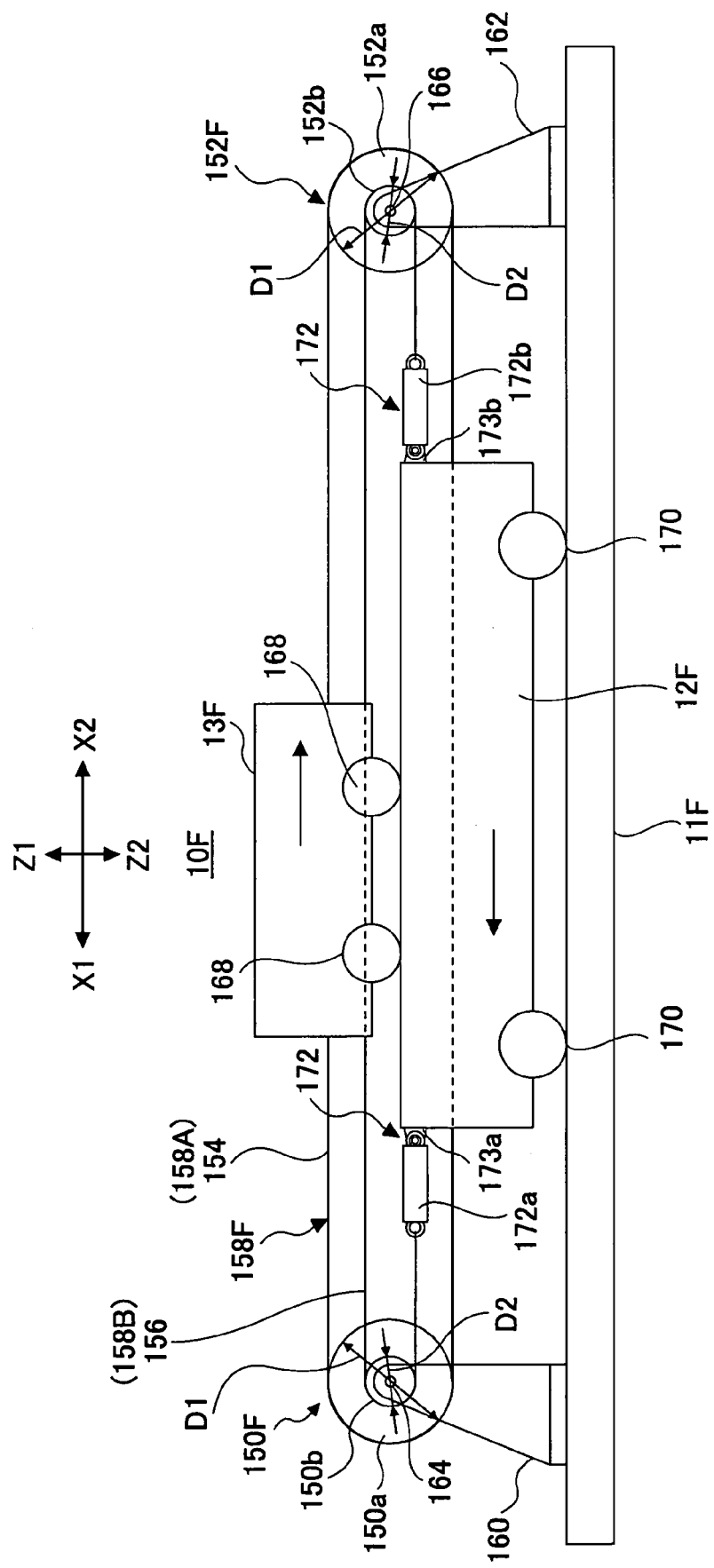
FIG. 26 is a schematic view of details of a structure of a mover device in accordance with a ninth embodiment.
Figure 27:
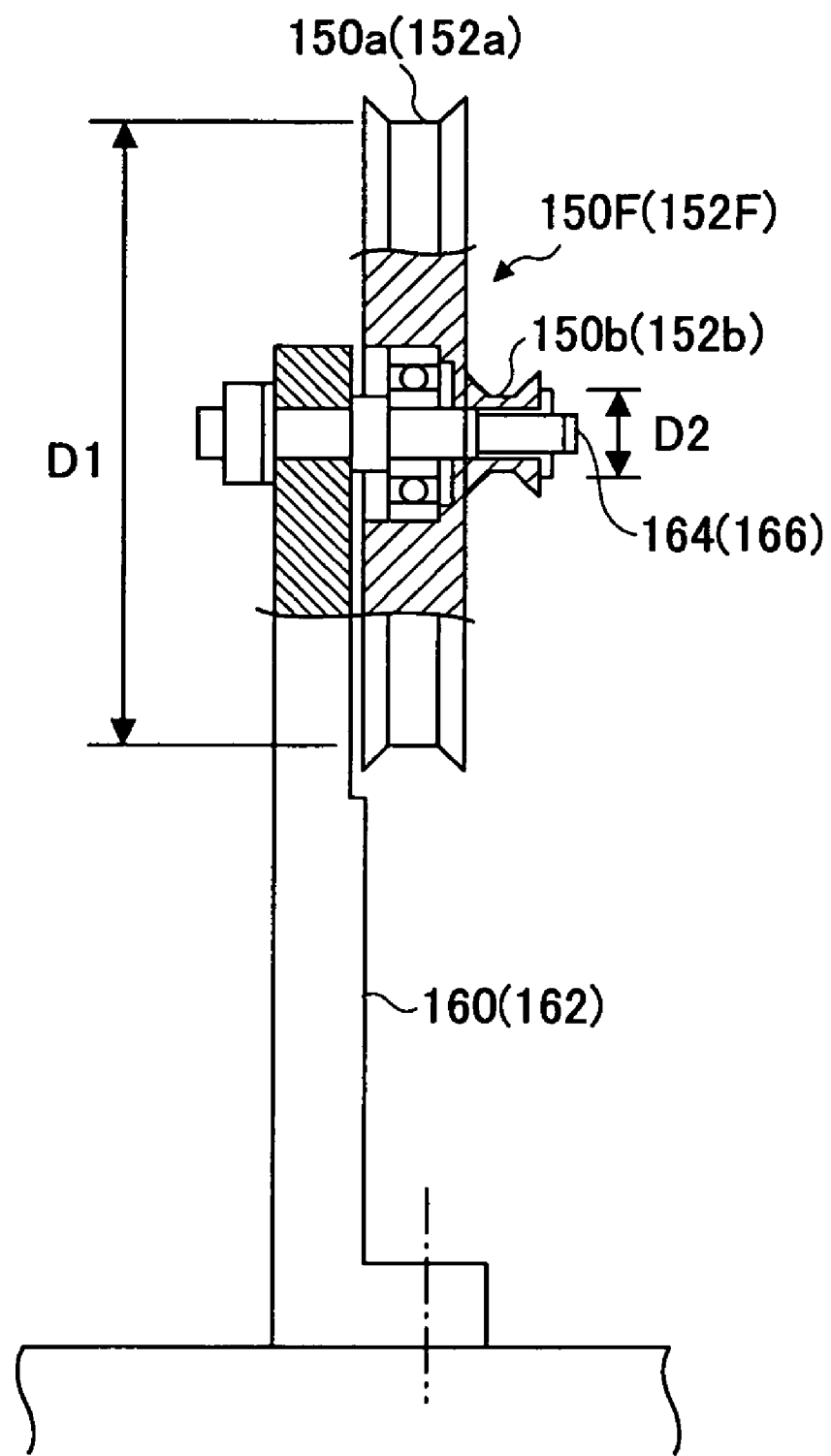
FIG. 27 is a side cross-sectional view of a support structure of a pulley seen from a side.
Figure 28F:
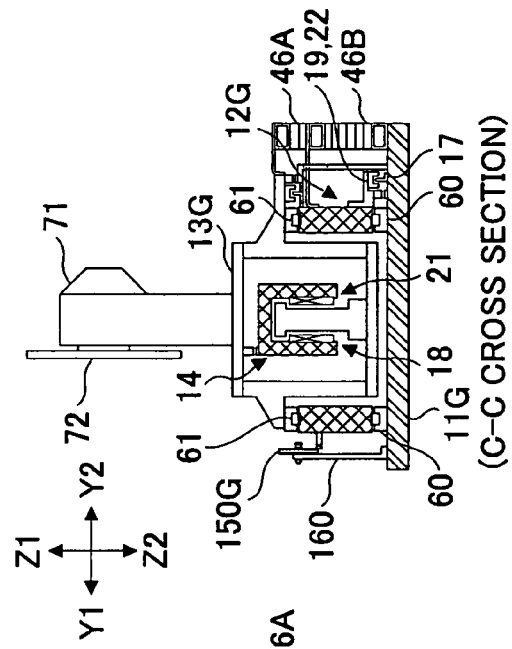
FIG. 28F is a section view of the mover device, taken along the line C-C of FIG. 28B.
Figure 28E:
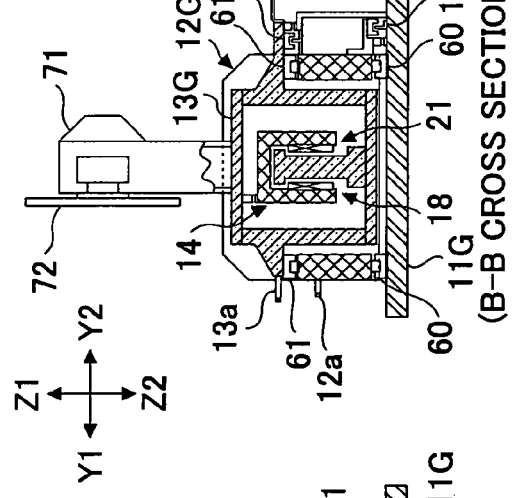
FIG. 28E is a section view of the mover device, taken along the line B-B of FIG. 28B.
Figure 28D:
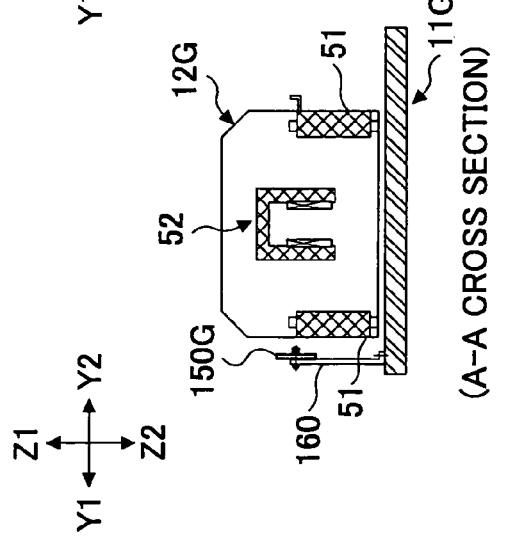
FIG. 28D is a section view of the mover device, taken along the line A-A of FIG. 28B.

FIG. 26 is a schematic view of details of a structure of the mover device 10F in accordance with the ninth embodiment. FIG. 27 is a side cross-sectional view of a support structure of a pulley seen from a side.

As shown in FIG. 26, the mover device 10F of the ninth embodiment includes an cooperative device 158F formed by two-step pulleys 150F and 152F (first pulley 150F and second pulley 152F) and two belts 154 and 156. The two-step pulleys 150F and 152F are provided in the vicinity of corresponding ends in X1-X2 directions of a fixed base 11F. The belts 154 and 156, made of resin, wind around pulley step parts formed by a trapezoid-shaped concave part of the two-step pulleys 150F and 152F. Although not shown in FIG. 26, a movable base 12F is driven by the above-mentioned main linear motor 14.

Low friction members 168 and 170, shown like wheels in FIG. 26, having linear guides, are respectively provided at lower surfaces of the movable base 12F and a processing base 13F. Accordingly, the processing base 13F is guided so as to move on an upper surface of the movable base 12F with low friction due to the low friction members 168. The movable base 12F is guided so as to move on an upper surface of the fixed base 11F with low friction due to the low friction members 170. Mass M1 of the processing base 13F is set to be lower than mass M2 of the movable base 12F (M1<M2).

Both ends of the processing base 13F are connected to each other by the first belt 154. Both ends of the movable base 12F are connected to each other by the second belt 156. The first belt 154 and the second belt 156 wind around the pulley step parts of the two-step pulleys 150F and 152F in opposite directions from each other. Under this structure, it is possible to make a moving direction of the processing base 13F opposite to a moving direction of the movable base 12F. As described below, it is possible to ease an impact at the time of a contra-rotating motion of movement of a center of gravity due to reciprocating motion in the X1-X2 directions of the processing base 13F and the movable base 12F.

The fixed base 11F, having a plane plate shaped configuration, is formed so as to extend in the X1-X2 directions. Support members 160 and 162 stand at corresponding ends in the X1-X2 directions of an upper surface of the fixed base 11F. The support members 160 and 162 support the two-step pulleys 150 and 152 rotatably at designated heights. Shafts 164 and 166 are bridged in a horizontal direction in the vicinities of upper ends of the support members 160 and 162, respectively. The shafts 160 and 162 pierce centers of rotation of the two-step pulleys 150F and 152F. The two-step pulleys 150F and 152F are supported so as to rotate around the shafts 164 and 166.

As shown in FIG. 27, bearings 164a and 166a, permitting the shafts 164 and 166 rotate, are engaged with the centers of rotation of the two-step pulleys 150F and 152F. The two-step pulleys 150 and 152 have unified structures where large diameter pulleys 150a and 152a and small diameter pulleys 150b and 152b are provided in concentric states. The large diameter pulleys 150a and 152a form the pulley step parts where the first belt connected to the processing base 13F is wound. The small diameter pulleys 150b and 152b form the pulley step parts where the second belt 156 is wound. Diameters D1 of the large diameter pulleys 150a and 152a are set to be larger than diameters D2 of the small diameter pulleys 150b and 152b (D1>D2).

The ratio of the diameters D1 of the large diameter pulleys 150a and 152a to the diameters D2 of the small diameter pulleys 150b and 152b, namely D1:D2, is set to be equal to the ratio of the mass M1 of the processing base 13F and the mass M2 of the movable base 12F, namely M2:M1 (D1:D2=M2: M1). The mass M2 of the movable base 12F is set to be much greater than the mass M1 of the fixed base 13F and may not be influenced by a reaction force when the movement of the processing base 13F is accelerated or decelerated. Since the mass M1 of the processing base 13F is smaller the mass M2 of the movable base 12F (M1<M2), the ratio of the diameters D1 of the large diameter pulleys 150a and 152a to the diameters D2 of the small diameter pulleys 150b and 152b, namely D1:D2, is set so that the movable base 12F is prevented from resisting the motion of the processing base 13F due to this mass difference.

A tooth non-slide belt, wire, chain, or the like can be used as the belts 154 and 156 which respectively wind around the large diameter pulleys 150a and 152a and the small diameter pulleys 150b and 152b.

One end of the first belt 154 winding around the large diameter pulley 150a and 152a is connected to an end part of an X1 direction side of the processing base 13F and other end of the first belt 154 is connected to an end part of an X2 direction side of the processing base 13F. Therefore, the large diameter pulleys 150a and 152a are rotated counter-clockwise by driving the processing base 13F in the X1 direction with the main linear motor 14. The large diameter pulleys 150a and 152a are rotated clockwise by driving the processing base 13F in the X2 direction with the main linear motor 14.

In addition, one end of the second belt 156 winding around the small diameter pulley 150b and 152b is connected to an end part of an X1 direction side of the movable base 12F and other end of the second belt 156 is connected to an end part of an X2 direction side of the movable base 12F. Therefore, by the movement in the X1 direction of the processing base 13F, the large diameter pulleys 150a and 152a are rotated counter-clockwise and the small diameter pulleys 150b and 152b are also rotated counter-clockwise. As a result of this, the movable base 12F is moved in the X2 direction opposite to the direction of the movement of the processing base 13F, via the second belt 156.

By the movement in the X2 direction of the processing base 13F, the large diameter pulleys 150a and 152a are rotated clockwise and the small diameter pulleys 150b and 152b are also rotated clockwise. As a result of this, the movable base 12F is moved in the X1 direction opposite to the direction of the movement of the processing base 13F, via the second belt 156.

Thus, the cooperative device 158 includes a first transfer system 158A and a second transfer system 158B. Here, the first transfer system 158A transfers the movement of the processing base 13F to the large diameter pulleys 150a and 152a via the first belt 154. The second transfer system 158B transfers the rotations of the small diameter pulleys 150b and 152b to the movable base 12F via the second belt 156. The second transfer system 158B includes an adjustment mechanism 172 for adjusting tension applied the second belt 156.

The adjustment mechanism 172 is formed by first and second excess tension adjustment members 172a and 172b. The first and second excess tension adjustment members 172a and 172b elastically expand and contract so as to absorb (damp) excess tension when the tension applied to the second belt 156 is increased more than a designated value. For example, a coil spring, an oil damper, an air damper, an expansion and contraction mechanism having an excess tension adjustment detection control function, or the like can be used as the first and second excess tension adjustment members 172a and 172b. The first and second excess tension adjustment members 172a and 172b are buffer members having a tensile limiter function, namely function for elastically deforming and generating the tension if a force exceeds a designated tensile force. Accordingly, the first and second excess tension adjustment members 172a and 172b expand and contract so that the excess tension is eased when the impact, due to acceleration at the time of the contra-rotating motion whereby the movement direction of the processing base 13F is changed, has a value more than a designated value.

In a case where a spring element such as a coil spring is used as the first and second excess tension adjustment members 172a and 172b, it is possible to provide the first and second excess tension adjustment members 172a and 172b so that a designated tension can be given to the second belt 156. In this case, the first and second excess tension adjustment members 172a and 172b can work as energizing means for energizing so that the second belt 156 is prevented from slackening. In addition, by combining the first and second excess tension adjustment members 172a and 172b formed by the spring element and a turn buckle for adjusting the length of the second belt 156 by turning a screw, it is possible to energize the second belt 156 with an optional spring force (tension).

In this embodiment, the first excess tension adjustment member 172a is connected to a connection part 173a of the end part of the X1 direction side of the movable base 12F. The second excess tension adjustment member 172b is connected to a connection part 173b of the end part of the X2 direction side of the movable base 12F. An end of the second belt 156 is connected to an end of the movable base 12F via the first excess tension adjustment member 172a. The other end of the second belt 156 is connected to the other end of the movable base 12F via the second excess tension adjustment member 172b.

In a case where the acceleration in the X1 direction exceeding a designated value is applied to the movable base 12F, the two-step pulleys 150F and 152F are rotated clockwise. Hence, the second excess tension adjustment member 172b generates a damping force accompanied with an expansion motion so that the tension applied to the second belt 156 is adjusted to prevent it from exceeding the designated value. In addition, it is possible to ease the impact due to the acceleration in the X1 direction. In a case where the acceleration in the X2 direction exceeding a designated value is applied to the movable base 12F, the two-step pulleys 150F and 152F are rotated counter-clockwise. Hence, the first excess tension adjustment member 172a generates a damping force accompanied with an expansion motion so that the tension applied to the second belt 156 is adjusted to prevent it from exceeding the designated value. In addition, it is possible to ease the impact due to the acceleration in the X2 direction.

The adjustment mechanism 172 may be provided in the first transfer system 158A and both ends of the first belt 154 may be connected to the corresponding end parts of the processing base 13F via the first and second excess tension adjustment members 172a and 172b. In this case, since the impact due to acceleration and deceleration motions of the processing base 13F are eased by the first and second excess tension adjustment members 172a and 172b, it is possible to move the processing base 13F stably.

Thus, in the cooperative device 158F, when the processing base 13F is driven in the X1 or X2 direction by the linear motor 14, the first and second belts 154 and 156 and the two-step pulleys 150F and 152F are rotated so that the movable base 12F is moved in the opposite direction. As a result of this, the reaction force generated when the movement of the processing base 13F is accelerated or decelerated is not transferred to the fixed base 11F but absorbed by the movement of the movable base 12F. Thus, the cooperative device 158F, formed by combining the first and second belts 154 and 156 and the two-step pulleys 150F and 152F, can be manufactured more economically than the first embodiment having the sub linear motor and therefore it is possible to reduce the manufacturing cost.

In the mover device 10F of this embodiment, due to the ratio of the diameters D1 of the large diameter pulleys 150a and 152a to the diameters D2 of the small diameter pulleys 150b and 152b, namely D1:D2, the distance of the movement of the movable base 12F is shorter than the distance of the movement of the processing base 13F. However, when the direction of the movement of the processing base 13F is contra-rotated, although the contra-rotating motion of the movable base 12F is delayed due to an inertial force, the first and second excess tension adjustment members 172a and 172b expand so that the excess tension of the second belt 156 is absorbed and the movable base 12F is decelerated.

In the mover device 10F of this embodiment, as well as the mover device 10A, it is possible to perform the motion accompanying the above-mentioned motion of the center of gravity as a motion whereby the movable base 12F is moved in an opposite direction against the movement of the processing device 13F, by the cooperative device 158 formed by two-step pulleys 150 and 152, the first and second belts 154 and 156, and the adjustment mechanism 172. That is, in the mover device 10F, although the movement of the movable base 12F is delayed against the movement of the processing base 13F, since either first or second excess tension adjustment members 172a or 172b is extended so that a relative displacement distance between the movable base 12F and the processing base 13F increases when the processing base 13F is contra-rotated, a motion the same as the motion of the center of gravity shown in FIG. 5A through FIG. 5D is carried out.

In this embodiment, at the time of contra-rotating motions of the movable base 12F and the processing base 13F, the center of composite gravity G3 of the center of gravity G1 of the processing base 13F and the center of gravity G2 of the movable base 12F remains at the predetermined point over the fixed base 11F. Accordingly, the fixed base 11F can be prevented from vibrating due to shifting of the center of composite gravity G3. Thus, vibration and noise can be eliminated from the mover device 10F, and the processing base 13F can be steadily moved with high precision.

In the mover device 10F of this embodiment, the center of composite gravity G3 of the center of gravity G1 of the processing base 13F and the center of gravity G2 of the movable base 12F is substantially the same as a composite application point at which the main linear motor 14 and the sub linear motor 15 cooperate to apply a moving force to the processing base 13F.

In other words, the location of the center of composite gravity G3 is substantially the same as the location at which the composite force of the moving force of the main linear motor 14 moving the processing base 13F and the moving force of the cooperative device 158 moving the processing base 13F through the movable base 12F is applied to move the processing base 13F (this location will be hereinafter referred to as the composite moving force application point).

With this structure, unnecessary moment generation in the processing base 13F can be prevented when the linear motor 14 applies the moving forces to the processing base 13F. Thus, the processing base 13F can be smoothly moved with high precision.

The mover device 10F of this embodiment can be provided in a perpendicular state. That is, the mover device 10F having the pulley transfer type cooperative device 158F is provided in the perpendicular state so as to be used for a semiconductor manufacturing device. In this case, since the X1 or X2 direction is an upper or lower direction of the mover device 10F, the processing base 13F holding a wafer can be raised and lowered. In a process wherein the processing base 13F is raised, the movable base 12F is lowered. In the processes wherein the processing base 13F is raised and lowered, moving velocities are different in a case where the same driving force is given.

The movable base 12F and the processing base 13F are connected to each other by the cooperative device 158F. When the processing base 13F is raised, the movable base 12F is lowered. When the processing base 13F is lowered, the movable base 12F is raised. Therefore, although there is a mass difference between the movable base 12F and the processing base 13F, since the two-step pulleys 150F and 152F having the diameter ratio (D1:D2) the same as the mass ratio (M2:M1) work as pulleys, a moment around a shaft of the second pulleys situated at an upper step is balanced. Hence, regardless of the existence of the mass difference, raising and lowering motions by the driving force of the main linear motor 14 can be stably performed.

Therefore, in the case where the mover device 10F is provided in the perpendicular state, it is possible to control the moving velocities of the processing base 13F and the movable base 12F so that the moving velocities in uniform velocity regions of a raising process and a lowering process of the processing base 13F and the movable base 12F are the same and constant.

As shown in FIG. 24, the mover device 10F can be tilted or the mover device 10F can be in the perpendicular state, by using the driving mechanism 115B (see FIG. 23) of the ion implantation device 100B. In this case, it is possible to set an angle of the wafer provided on the platen 72 against an irradiation direction of the ion beam to an optional angle.

Therefore, in a case where the mover device 10F having the pulley type cooperative device 158F is provided to the ion implantation device 100A or 100B, the platen 72, to which the wafer is to be attached, is moved in the directions of the arrows X1 and X2 at high speed by the mover device 10F, and is also moved in the directions of the arrows Y1 and Y2 by the driving mechanism 113B. Thus, IB can be emitted onto the entire surface of the wafer attached to the platen 72.

Furthermore, the mover device 10F having the pulley type cooperative device 158F can be used for a semiconductor manufacturing device together with the ion implantation device 100B. That is, in the semiconductor manufacturing device, when ions are implanted on the surface of the wafer so that doping is performed in an impurity introduction process, the wafer attached to the platen 72 is reciprocated at high speed by the mover device 10F. In a process where the wafer is moved in the uniform velocity region of reciprocating movement, the ions are implanted. Therefore, it is possible to efficiently perform doping in the semiconductor manufacturing process by reciprocating the wafer at high speed with the mover device 10F provided at the semiconductor manufacturing device. Furthermore, since the mover base 12F moves in a direction opposite to the direction in which the processing base 13F moves in the semiconductor manufacturing device so that the impact at the time when the moving direction of the processing base 13F is contra-rotated is eased, it is possible to implant the ions with high precision.

The ion implantation devices 100A and 100B having the mover device 10F can be used for a liquid crystal manufacturing device whereby, for example, the ions are given to a liquid crystal substrate and the surface of the liquid crystal substrate is anneal-processed in a liquid crystal manufacturing process. In this case, since the IB is given to the liquid crystal substrate while the liquid crystal substrate is reciprocated by the mover device 10F having the pulley type cooperative device 158F, it is possible to improve manufacturing efficiency of the liquid crystal substrate.

The ion implantation device 100A is a two-axis mechanical scan type ion implantation device whereby the wafer is moved in the X1-X2 or Z1-Z2 directions without scanning the IB. The mover device 10F reciprocates the wafer in the X1-X2 directions. The driving mechanism 113A makes the mover device 10A where the wafer is held rise and fall.

The mover device 10F can be applied to a one-axis mechanical scan type ion implantation device wherein the IP is scanned in the Z1-Z2 directions. In this case, the mover device 10F reciprocates the wafer at high speed in the X1-X2 directions so that the ions are implanted over the entire surface of the wafer.

Tenth Embodiment

Next, a mover device 10G of the tenth embodiment of the present invention is discussed.

FIG. 28A through FIG. 28F shows a structural example of the mover device 10G of the tenth embodiment. In FIG. 28A through FIG. 28F, parts that are the same as the parts discussed in the above-discussed embodiments and drawings are given the same reference numerals, and explanation thereof will be omitted.

As shown in FIG. 28A through FIG. 28F, the mover device 10G has a structure where the main linear motor 14 is provided in the center of the Y1-Y2 directions of the fixed base 11G and an cooperative device 158G formed by two-step pulleys 150G and 152G, belt-shaped wires 174 and 175, and the adjustment mechanism 172 is provided at a side of the Y1 direction of the movable base 12G. A processing base 13G is driven in the X1-X2 directions by the main linear motor 14. The two-step pulleys 150G and 152G have the same structures as the above-mentioned two-step pulleys 150F and 152F.

The F-P sensor 16, the F-M sensor 17, the F-M overrun sensor 19, the F-P overrun sensor 20, the movable base origin detecting sensor 22, the F-P linear scale 33, the F-M linear scale 34, the F-P overrun detecting pieces 43, the F-M overrun detecting pieces 44, the movable base origin mark 45, the cable bearings 46A and 46B, and others are provided at the Y2 direction side of the movable base 12F.

The platen 72 where the wafer is attached and the stay frame 71 supporting the platen 72 are provided on the upper surface of the processing base 13A.

A pair of connection parts 13a is projected on a Y1 direction side surface of the processing base 13G so as to connect both ends of the belt-shaped wire 174. In addition, a pair of connection parts 12a is projected on a Y1 direction side surface of the movable base 12G so as to connect both ends of the belt-shaped wire 175.

In the cooperative device 158G, when the processing base 13G is driven in the X1 or X2 direction by the linear motor 14, the belt-shaped wires 174 and 175 and the two-step pulleys 150G and 152G are rotated so that the movable base 12G is moved in the opposite direction. As a result of this, the reaction force generated when the movement of the processing base 13G is accelerated or decelerated is not transferred to the fixed base 11G but absorbed by the movement of the movable base 12G.

In the mover device 10G of this embodiment, due to the ratio of the diameters D1 of the large diameter pulleys 150a and 152a to the diameters D2 of the small diameter pulleys

150b and 152b, namely D1:D2, the distance of the movement of the movable base 12G is shorter than the distance of the movement of the processing base 13G. However, when the direction of the movement of the processing base 13G is contra-rotated, although the contra-rotating motion of the movable base 12G is delayed due to an inertia force, the first and second excess tension adjustment members 172a and 172b expand so that the excess tension of the belt-shaped wire 175 is absorbed and the movable base 12G is decelerated.

In the mover device 10G of this embodiment, as well as the mover device 10A, it is possible to perform the motion accompanying the above-mentioned motion of the center of gravity as a motion whereby the movable base 12G is moved in an opposite direction against the movement of the processing device 13G, by the cooperative device 158G formed by the two-step pulleys 150 and 152, the belt-shaped wires 174 and 175, and the adjustment mechanism 172. That is, in the mover device 10G, although the movement of the movable base 12G is delayed against the movement of the processing base 13G, since either first or second excess tension adjustment members 172a or 172b is extended so that a relative displacement distance between the movable base 12G and the processing base 13G increases when the processing base 13G is contra-rotated, a motion same as the motion of the center of gravity shown in FIG. 5A through FIG. 5D is carried out.

In this embodiment, at the time of contra-rotating motions of the movable base 12G and the processing base 13G, the center of composite gravity G3 of the center of gravity G1 of the processing base 13G and the center of gravity G2 of the movable base 12G remains at the predetermined point over the fixed base 11G. Accordingly, the fixed base 11G can be prevented from vibrating due to shifting of the center of composite gravity G3. Thus, vibration and noise can be eliminated from the mover device 10G, and the processing base 13G can be steadily moved with high precision.

In the mover device 10G of this embodiment, the center of composite gravity G3 of the center of gravity G1 of the processing base 13G and the center of gravity G2 of the movable base 12G is substantially the same as a composite application point at which a moving force is given to the processing base 13G.

In other words, the location of the center of composite gravity G3 is substantially the same as the location at which the composite force of the moving force of the main linear motor 14 moving the processing base 13G and the moving force of the cooperative device 158G moving the processing base 13F through the movable base 12G is applied to move the processing base 13G (this location will be hereinafter referred to as the composite moving force application point).

With this structure, unnecessary moment generation in the processing base 13G can be prevented when the linear motor 14 applies the moving forces to the processing base 13G. Thus, the processing base 13G can be smoothly moved with high precision.

Eleventh Embodiment

Next, a mover device 10H of the tenth embodiment of the present invention is discussed.

FIG. 29A through FIG. 29F shows a structural example of the mover device 10H of the tenth embodiment. In FIG. 29A through FIG. 29F, parts that are the same as the parts discussed in the above-discussed embodiments and drawings are given the same reference numerals, and explanation thereof will be omitted.

As shown in FIG. 29A through FIG. 29F, the mover device 10H has a structure where the main linear motor 14 is provided in the center of the Y1-Y2 directions of the fixed base 11H and an cooperative device 158H formed by two-step pulleys 150H and 152H, first and second tooth timing belt 176 and 177, and the adjustment mechanism 172 is provided at a side of the Y1 direction of the movable base 12H. A processing base 13H is driven in the X1-X2 directions by the main linear motor 14. The two-step pulleys 150H and 152H have the same structures as the above-mentioned two-step pulleys 150H and 152H. The first and second tooth timing belts 176 and 177, corresponding to the first and second belts, are made of resin and wind around the two-step pulleys 150H and 152H.

Figure 30:
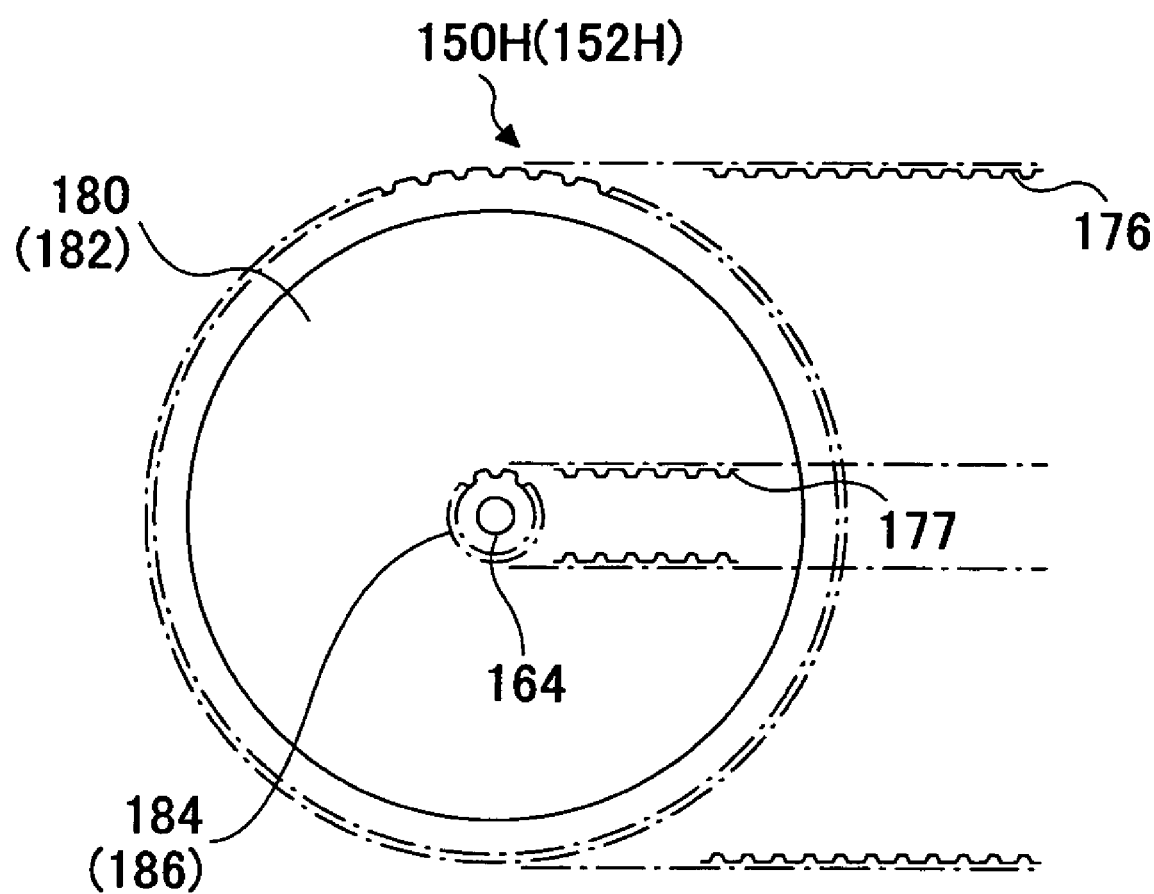
FIG. 30 is an enlarged view of a structure of two-step pulleys in the eleventh embodiment.

FIG. 30 is an enlarged view of structures of two-step pulleys 150H and 152H. The two-step pulleys 150H and 152H of the movable base 10H have unified structures where large diameter gears 180 and 182 and small diameter gears 184 and 186 are provided in concentric states. The first tooth timing belt 176 connected to the processing base 13H winds around the large diameter gears 180 and 182 so as to be intermeshed with the large diameter gears 180 and 182. The second tooth timing belt 177 winds around the small diameter gears 184 and 186 so as to be intermeshed with the small diameter gears 184 and 186. Diameters D3 of the large diameter gears 180 and 182 are set to be larger than diameters D4 of the small diameter gears 184 and 186 (D3>D4). The ratio of the diameters D3 of the large diameter gears 180 and 182 to the diameters D4 of the small diameter gears 184 and 186, namely D3:D4, is set to be equal to the ratio of the mass M1 of the processing base 13H and the mass M2 of the movable base 12H, namely M2:M1 (D3:D4=M2:M1). The mass M2 of the movable base 12H is set to be much greater than the mass M1 of the fixed base 13H and may not be influenced by a reaction force when the movement of the processing base 13H is accelerated or decelerated. Since the mass M1 of the processing base 13H is smaller the mass M2 of the movable base 12H (M1<M2), the ratio of the diameters D3 of the large diameter gears 180 and 182 to the diameters D4 of the small diameter gears 184 and 186, namely D3:D4, is set so that the movable base 12H is prevented from resisting the motion of the processing base 13H due to this mass difference.

Concave parts and convex parts are formed by turns in a circumferential direction of winding parts of the large diameter gears 180 and 182 and small diameter gears 184 and 186 so as to intermesh with the tooth timing belts 176 and 177. Because of this, since the tooth timing belts 176 and 177 are prevented from sliding against the large diameter gears 180 and 182 and small diameter gears 184 and 186, it is possible to securely transfer even relatively large torque.

Hence, the two-step pulleys 150H and 152H can efficiently transfer the driving force at the time when the processing base 13H is moved with a high speed via the tooth timing belts 176 and 177, to the movable base 12H without a transfer loss.

In the mover device 10H of this embodiment, as well as the mover device 10A, it is possible to perform the motion accompanying the above-mentioned motion of the center of gravity as a motion whereby the movable base 12H is moved in an opposite direction against the movement of the processing device 13H, by the cooperative device 158H formed by the two-step pulleys 150H and 152H, the tooth timing belts 176 and 177, and the adjustment mechanism 172. That is, in the mover device 10H, although the movement of the movable base 12H is delayed against the movement of the processing base 13H, since either first or second excess tension adjustment members 172a or 172b is extended so that a relative displacement distance between the movable base 12H and the processing base 13H increases when the processing base 13H is contra-rotated, a motion same as the motion of the center of gravity shown in FIG. 5A through FIG. 5D is carried out.

In this embodiment, at the time of contra-rotating motions of the movable base 12H and the processing base 13H, the center of composite gravity G3 of the center of gravity G1 of the processing base 13H and the center of gravity G2 of the movable base 12H remains at the predetermined point over the fixed base 11H. Accordingly, the fixed base 11H can be prevented from vibrating due to shifting of the center of composite gravity G3. Thus, vibration and noise can be eliminated from the mover device 10H, and the processing base 13H can be steadily moved with high precision.

Twelfth Embodiment

Next, a mover device 10I of the twelfth embodiment of the present invention is discussed.

FIG. 31A through FIG. 31F shows a structural example of the mover device 10I of the twelfth embodiment. In FIG. 31A through FIG. 31F, parts that are the same as the parts discussed in the above-discussed embodiments and drawings are given the same reference numerals, and explanation thereof will be omitted.

As shown in FIG. 31A through FIG. 31F, the mover device 10I has a structure where the main linear motor 14 is provided in the center of the Y1-Y2 directions of the fixed base 11I and an cooperative device 150I formed by two-step pulleys 150I and 152I, chains 190 and 191, and the adjustment mechanism 172 is provided at a side of the Y1 direction of the movable base 12I. A processing base 13I is driven in the X1-X2 directions by the main linear motor 14. The two-step pulleys 150I and 152I have the same structures as the above-mentioned two-step pulleys 150F and 152F. The chains 190 and 191, corresponding to the first and second belts, wind around the two-step pulleys 150I and 152I.

Figure 32:
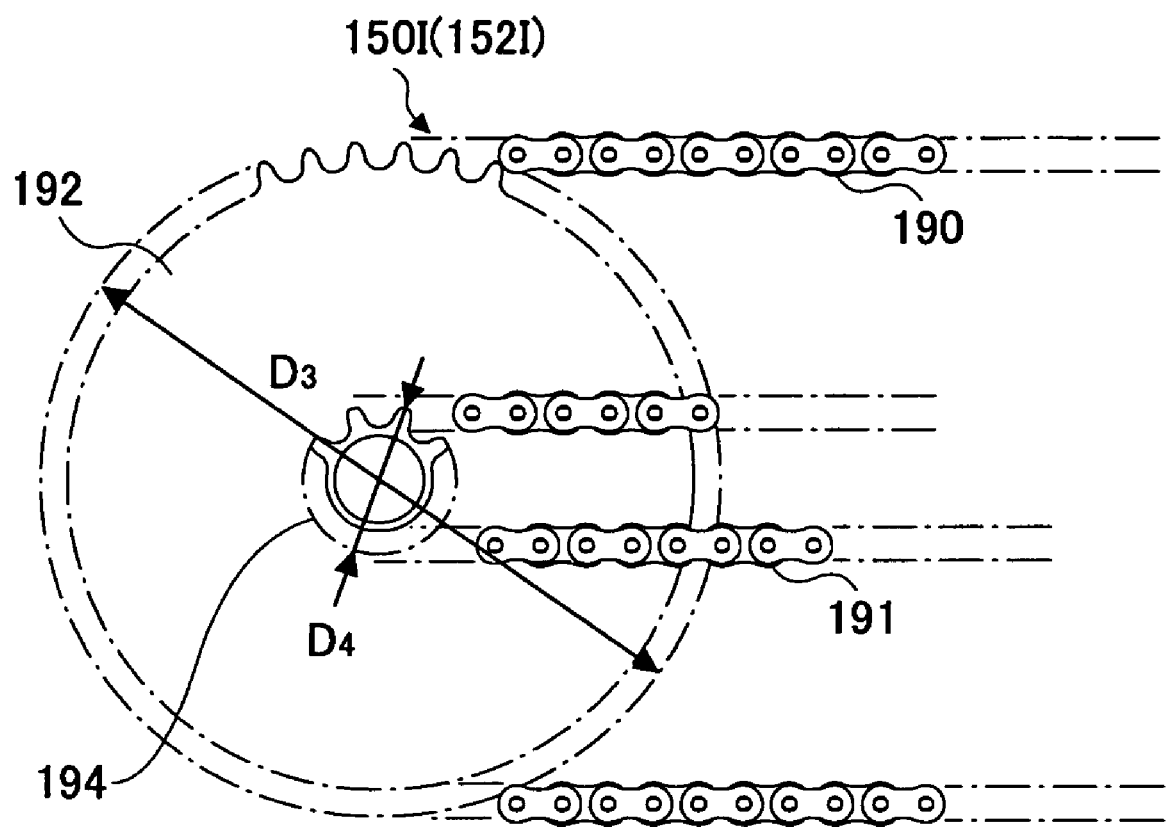
FIG. 32 is an enlarged view of a structure of two-step pulley in the twelfth embodiment.
Figure 33A:
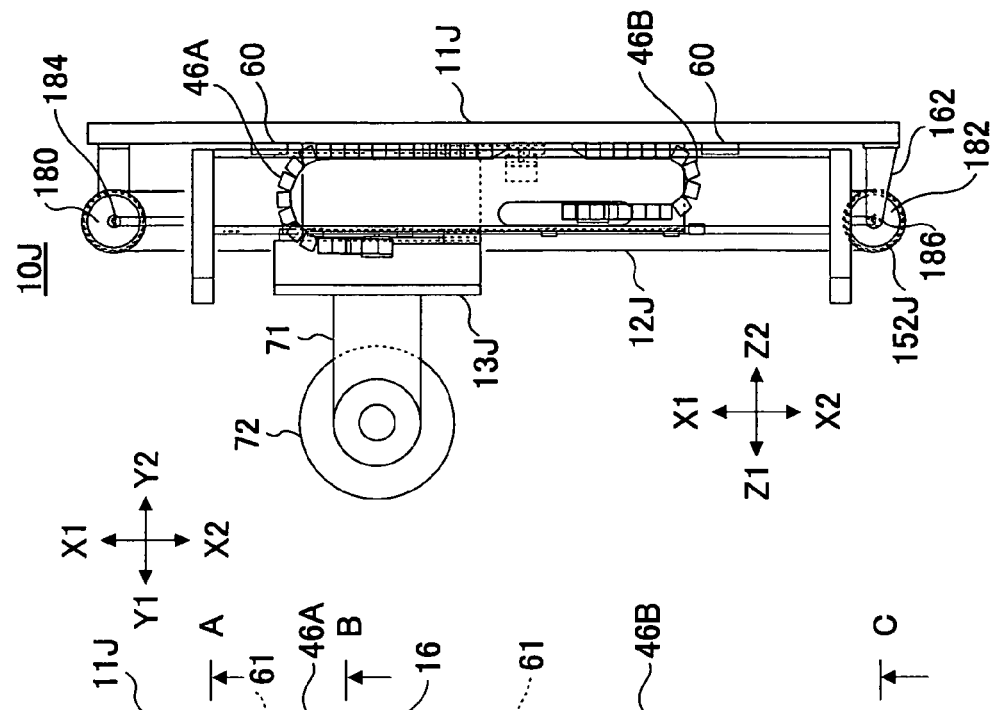
FIG. 33A is a left side view of a mover device in accordance with a thirteenth embodiment.
Figure 33B:
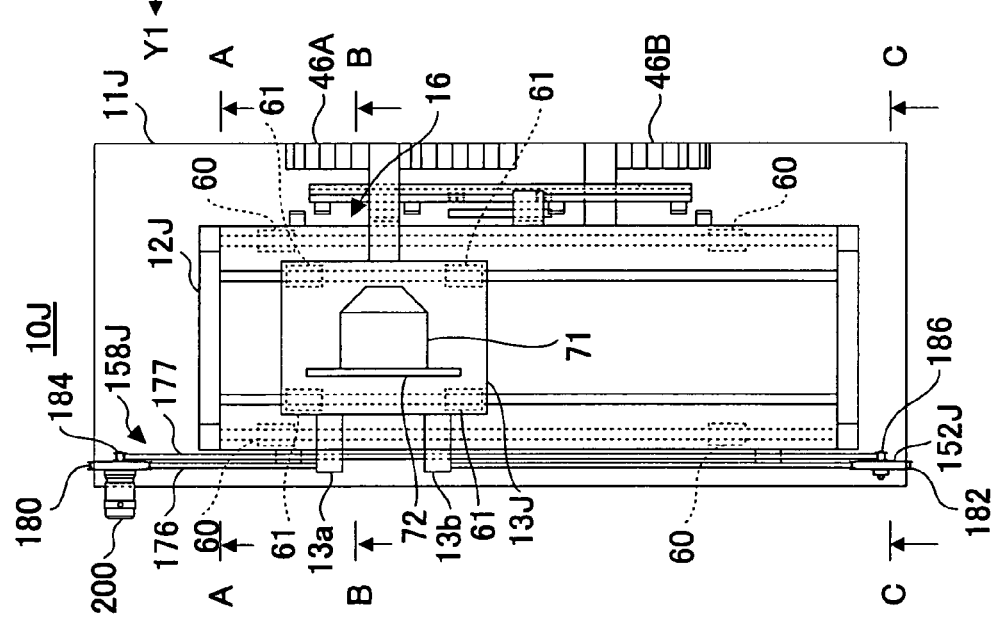
FIG. 33B is a plan view of the mover device in accordance with the thirteenth embodiment.
Figure 33C:
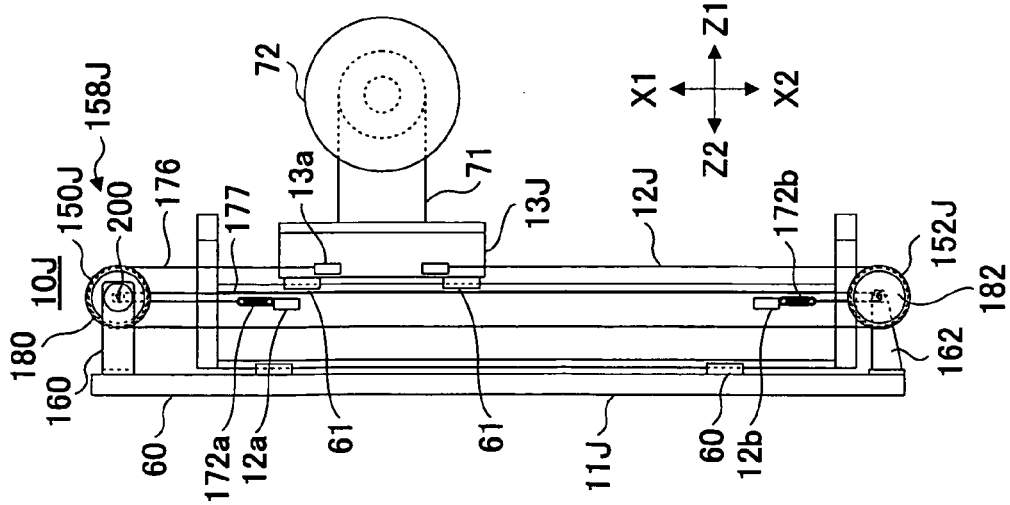
FIG. 33C is a right side view of the mover device in accordance with the thirteenth embodiment.
Figures 34D, 34E, 34F:
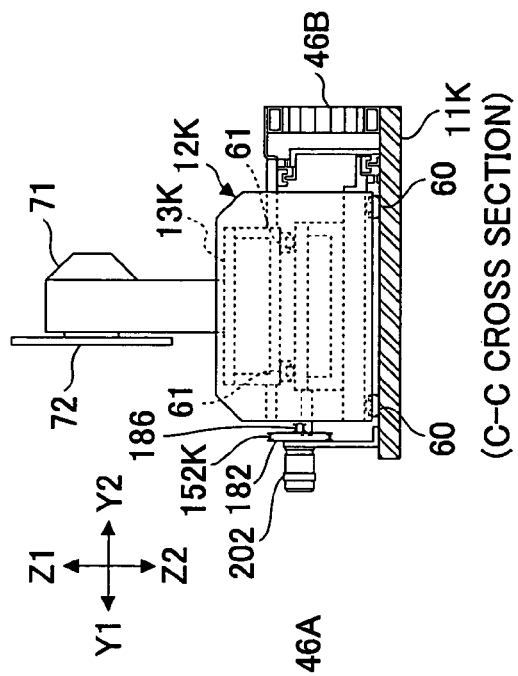
FIG. 34D is a section view of the mover device, taken along the line A-A of FIG. 34B.
FIG. 34E is a section view of the mover device, taken along the line B-B of FIG. 34B.
FIG. 34F is a section view of the mover device, taken along the line C-C of FIG. 34B.
Figures 35A, 35B, 35C:
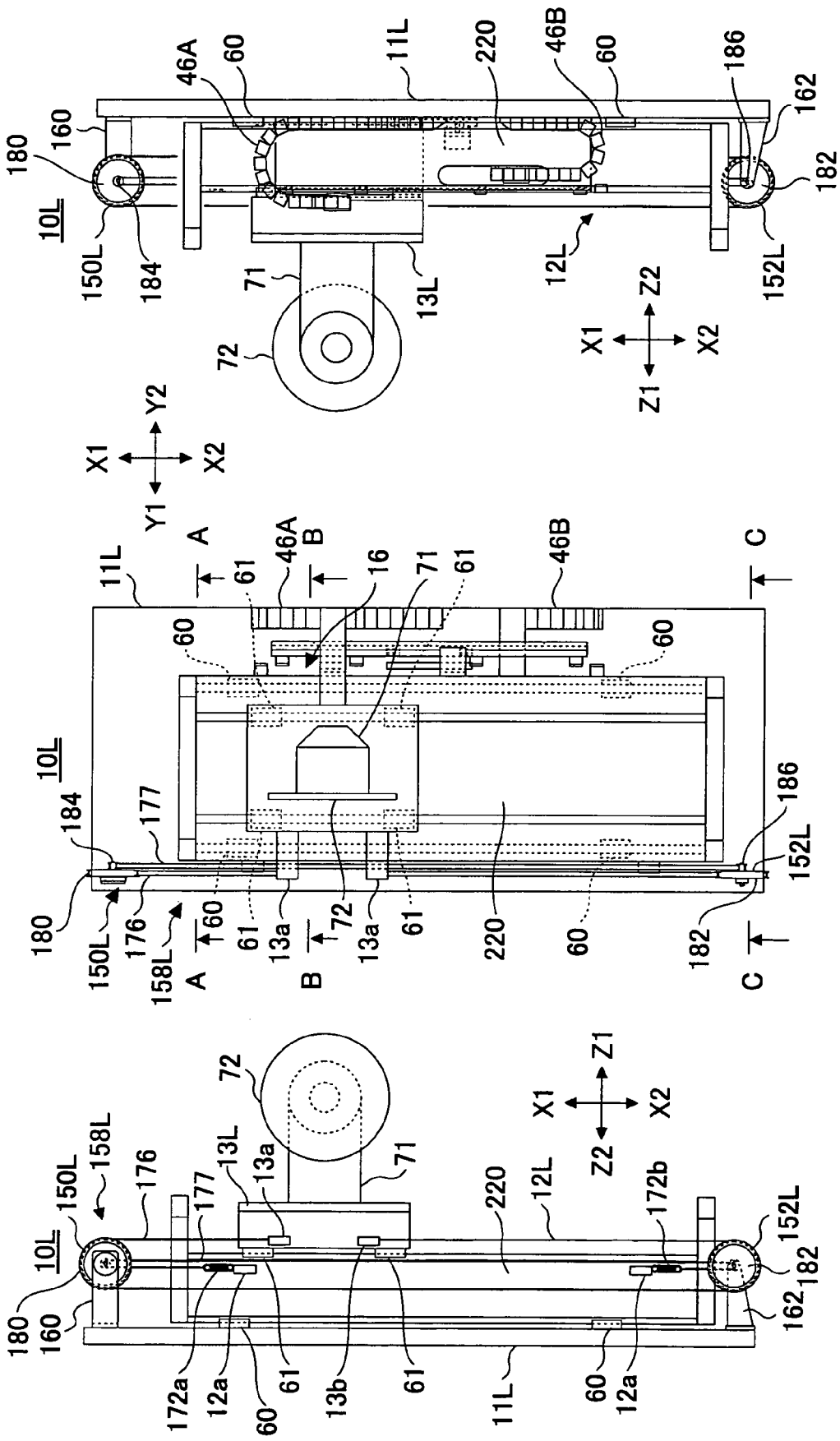
FIG. 35A is a left side view of a mover device in accordance with a fifteenth embodiment.
FIG. 35B is a plan view of the mover device in accordance with the fifteenth embodiment.
FIG. 35C is a right side view of the mover device in accordance with the fifteenth embodiment.

FIG. 32 is an enlarged view of structures of two-step pulleys 150I and 152I. The two-step pulleys 150I and 152I have unified structures where a large diameter sprocket 192 and a small diameter sprocket 191 are provided in concentric states. The first chain 190 connected to the processing base 13I winds around the large diameter sprockets 192. The second chain 191 connected to the movable base 12I winds around the small diameter sprockets 191. Diameters D3 of the large diameter sprockets 192 are set to be larger than diameters D4 of the small diameter sprockets 194 (D3>D4).

The ratio of the diameters D3 of the large diameter sprockets 192 to the diameters D4 of the small diameter sprockets 194, namely D3:D4, is set to be equal to the ratio of the mass M1 of the processing base 13I and the mass M2 of the movable base 12I, namely M2:M1 (D3:D4=M2:M1).

A pair of connection parts 13a is projected on a Y1 direction side surface of the processing base 13I so as to connect both ends of the first chain 191. In addition, a pair of connection parts 12a is projected on a Y1 direction side surface of the movable base 12I so as to connect both ends of the second chain 192.

In the mover device 10I, since the chains 184 and 186 made of metal wind around the two-step pulleys 150I and 152I so as to intermesh with the two-step pulleys 150I and 152I, it is possible to securely transfer the movement of the processing base 13I to the movable base 12I. In addition, since the chains 190 and 191 have higher strengths, the chains 190 and 191 can sufficiently resist high torque. Therefore, it is possible to prevent a motion gap or motion delay due to an expansion of the transfer system. Hence, when the processing base 13I and the movable base 12I are moved at high speed, it is possible to stably transfer the moving force and obtain uniformity of speed in the uniform velocity region.

Furthermore, since the chains 190 and 192 are better then the timing belt from the perspective of durability, it is possible to use the chains 190 and 192 for a long period of time. In addition, the numbers of times of changing the chains 190 and 192 is small and complex maintenance can be done easily.

In the mover device 10I of this embodiment, as well as the mover device 10A, it is possible to perform the motion accompanying the above-mentioned motion of the center of gravity as a motion whereby the movable base 12I is moved in an opposite direction against the movement of the processing base 13I, by the cooperative device 158I formed by the two-step pulleys 150I and 152I, the chains 190 and 191, and the adjustment mechanism 172. That is, in the mover device 10I, although the movement of the movable base 12I is delayed against the movement of the processing base 13I, since either first or second excess tension adjustment members 172a or 172b is extended so that a relative displacement distance between the movable base 12I and the processing base 13I increases when the processing base 13I is contra-rotated, a motion the same as the motion of the center of gravity shown in FIG. 5A through FIG. 5D is carried out.

In this embodiment, at the time of contra-rotating motions of the movable base 12I and the processing base 13I, the center of composite gravity G3 of the center of gravity G1 of the processing base 13I and the center of gravity G2 of the movable base 12I remains at the predetermined point over the fixed base 11I. Accordingly, the fixed base 11I can be prevented from vibrating due to shifting of the center of composite gravity G3. Thus, vibration and noise can be eliminated from the mover device 10I, and the processing base 13I can be steadily moved with high precision.

Thirteenth Embodiment

Next, a mover device 10J of the thirteenth embodiment of the present invention is discussed.

FIG. 33A through FIG. 33F shows a structural example of the mover device 10J of the thirteenth embodiment. In FIG. 33A through FIG. 33F, parts that are the same as the parts discussed in the above-discussed embodiments and drawings are given the same reference numerals, and explanation thereof will be omitted.

As shown in FIG. 33A through FIG. 33F, the mover device 10J includes an cooperative device 158J formed by two-step pulleys 150J and 152J and two timing belts 176 and 177. The two-step pulleys 150J and 152J are provided in the vicinity of corresponding ends in X1-X2 directions of a fixed base 11J. The timing belts 176 and 177, made of resin, corresponding to the first and second belts, wind around the two-step pulleys 150J and 152J. Furthermore, in the mover device 10J, a driving motor 200 is provided as an actuator (driving means), instead of the main linear motor 14. The driving motor 200 rotates the two-step pulley 150J.

The driving motor 200 moves the processing base 13J and the movable base 12J in the X1-X2 direction and the X2-X1 direction by rotating one of the two-step pulley 150J. A motor rotation shaft of the driving motor 200 may be connected to the center of the rotation of the two-step pulley 150J so as to directly rotate the two-step pulley 150J. Alternatively, the two-step pulley 150J may be rotated via a deceleration mechanism received in a motor housing.

Since the main linear motor 14 is not provided in the mover device 10J, for example, it is not necessary to provide the space for the center part connecting body 52 and the main linear motor magnet 53 in the movable base 12J. Hence, it is possible to make the movable base 12J thinner than the movable base 12A of the ninth embodiment. Because of this, since the movable base 12J is made compact and the upper surface of the movable base 12J, namely a sliding surface for the processing base 13J, is situated at a lower position, it is possible to lower the center of gravity of the processing base 13J.

Hence, in the mover device 10J of the thirteenth embodiment, as shown in FIG. 5E through FIG. 5H, unnecessary moment can be prevented from being generated at the processing base 13J and the processing base 13J can be moved more smoothly with high precision.

In this embodiment, the movable base 12J and the processing base 13J are moved in the X1-X2 direction and the X2-X1 direction by a single motor 200. Therefore, the driving motor 200 rotates the two-step pulley 150 so that a tension force is applied to the timing belts 176 and 177 and therefore the movable base 12J and the processing base 13J are moved. Accordingly, for example, in a case where the torque of the driving motor 200 is applied in a direction whereby the processing base 13J is moved in the X1 direction, it is not possible to apply a force in the X2 direction opposite to the moving direction of the processing base 13J, to the processing base 13J. Similarly, in a case where the torque of the driving motor 200 is applied in a direction whereby the movable base 12J is moved in the X2 direction, it is not possible to apply a force in the X1 direction opposite to the moving direction of the movable base 12J, to the movable base 12J.

The control processes shown in FIG. 7 through FIG. 10 and FIG. 13 are performed as a control method of the motor 200, as well as the above-discussed control method of the main motor 14. That is, a velocity control process is performed based on the velocity setting trapezoid A (See FIG. 17) representing the ideal moving velocity of the processing base 13J. Thus, by controlling the velocity of the processing base 13J against the fixed base 11J so that the velocity forms the velocity setting trapezoid A shown in FIG. 17, the processing base 13J can immediately and smoothly move with speeds corresponding to the acceleration region, the uniform velocity region and the deceleration region of the velocity setting trapezoid A.

Fourteenth Embodiment

Next, a mover device 10K of the fourteenth embodiment of the present invention is discussed.

FIG. 34A through FIG. 34F shows a structural example of the mover device 10K of the fourteenth embodiment. In FIG. 34A through FIG. 34F, parts that are the same as the parts discussed in the above-discussed embodiments and drawings are given the same reference numerals, and explanation thereof will be omitted.

As shown in FIG. 34A through FIG. 34F, the mover device 10K includes an cooperative device 158K formed by two-step pulleys 150K and 152K and two timing belts 176 and 177. The two-step pulleys 150K and 152K are provided in the vicinity of corresponding ends in X1-X2 directions of a fixed base 11K. The first and second timing belts 176 and 177, made of resin, corresponding to the first and second belts, wind around the two-step pulleys 150K and 152K. Furthermore, in the mover device 10K, driving motors 200 and 202 are provided as actuators (driving means), instead of the main linear motor 14. The driving motors 200 and 202 rotate the two-step pulleys 150K and 152K, respectively.

The driving motor 200 rotates the two-step pulley 150K so that the processing base 13K and the movable base 12K are moved in the X1-X2 direction and the X2-X1 direction.

The driving motor 202 rotates the two-step pulley 152K so that the processing base 13K and the movable base 12K are moved in the X1-X2 direction and the X2-X1 direction.

Motor rotation shafts of the driving motors 200 and 202 may be connected to the center of the rotations of the two-step pulleys 150K and 152K so as to directly rotate the two-step pulleys 150K and 152K. Alternatively, the two-step pulleys 150K and 152K may be rotated via a deceleration mechanism received in a motor housing.

Since the main linear motor 14 is not provided in the mover device 10K, for example, it is not necessary to provide the space for the center part connecting body 52 and the main linear motor magnet 53 in the movable base 12K. Hence, it is possible to make the movable base 12K thinner than the movable base 12A of the ninth embodiment. Because of this, since the movable member 12K is made compact and the upper surface of the movable base 12K, namely a sliding surface for the processing base 13K, is situated at a lower position, it is possible to lower center of gravity of the processing base 13K.

Hence, in the mover device 10K of the fourteenth embodiment, as shown in FIG. 5E through FIG. 5H, unnecessary moment can be prevented from being generated at the processing base 13K and the processing base 13K can be moved more smoothly with high precision.

In this embodiment, the movable base 12K and the processing base 13K are moved in the X1-X2 direction and the X2-X1 direction by the two motors 200 and 202. Therefore, the driving motors 200 and 202 can separately rotate the two-step pulleys 150K and 152K. Therefore, when the movable base 12K and the processing base 13K are moved, a back tension can be given not only in a pulling direction in which the movable base 12K and the processing base 13K are moved but also a side followed with the movement of the movable base 12K and the processing base 13K. Hence, it is possible to move the movable base 12K and the processing base 13K by applying a pulling force at one end of the timing belts 176 and 177, and generation of slackness at the other end of the timing belts 176 and 177 situated at an opposite side can be prevented.

Fifteenth Embodiment

Next, a mover device 10L of the fifteenth embodiment of the present invention is discussed.

FIG. 35A through FIG. 35F shows a structural example of the mover device 10L of the fifteenth embodiment. In FIG. 35A through FIG. 35F, parts that are the same as the parts discussed in the above-discussed embodiments and drawings are given the same reference numerals, and explanation thereof will be omitted.

As shown in FIG. 35A through FIG. 35F, the mover device 10L includes an cooperative device 158I formed by two-step pulleys 150I and 152I and two timing belts 176 and 177. The two-step pulleys 150L and 152L are provided in the vicinity of corresponding ends in X1-X2 directions of a fixed base 11L. The first and second timing belts 176 and 177, made of resin, corresponding to the first and second belts, wind around the two-step pulleys 150L and 152L. Furthermore, in the mover device 10L, a fluid actuator 220 is provided instead of the main linear motor 14. Fluid including gas and liquid is used as transfer means in the fluid actuator 220.

The fluid actuator 220 is provided at the movable base 12L. In this embodiment, an air pressure actuator is used for the fluid actuator 220, as well as the fluid actuator 90. For example, a liquid pressure actuator for which liquid is used, can be applied as fluid other than air.

The fluid actuator 220 includes a piston 224 which slides inside of a cylinder 222 of the movable base 12L in the X1 or X2 direction. A cylinder room at an X1 direction side and a cylinder room at an X2 direction side are formed inside of the cylinder 222 by the piston 224. Compressed air having a designated air pressure is supplied to the cylinder rooms inside of the cylinder 222. Because of the pressure difference of the cylinder rooms, the piston 224 is driven in the X1 or X2 direction.

In the fluid actuator 220, an intake and exhaust system is connected to the cylinders such as laying pipes for supplying and exhausting the compressed air or a switch valve for switching the intake and exhaust. Because of this, the compressed air is supplied to one of the cylinder rooms, and, at the same time, the air in the other cylinder room is exhausted so that the piston 224 can be moved in the X1 or X2 direction.

The piston 224 is connected to the processing base 13L via a connection part 226 connected to the processing base 13L and moves in the X1 or X2 direction with a velocity corresponding to the pressure difference of the cylinder rooms. By controlling the velocity of the processing base 13L against the fixed base 11L so that the velocity forms the velocity setting trapezoid A shown in FIG. 17, the processing base 13L can immediately and smoothly move with speeds corresponding to the acceleration region, the uniform velocity region and the deceleration region of the velocity setting trapezoid A.

The connection part 226 connects the piston 224 and the processing base 13L. For example, the connection part 226 may pierce the upper surface of the movable base 12L. Alternatively, the connection part 226 may connect to the processing base 13L via a piston rod extending in the X1 or X2 direction from the piston 224. In a case where the connection part 226 pierces the upper surface of the movable base 12L, it is necessary to provide a piercing grove which is formed extended in the X1 or X2 direction so as to form a seal structure whereby the fluid is prevented from leaking from the piercing groove.

Thus, by using the fluid actuator 220 as moving force generation means, the driving force of the processing base 13L generated by a compressed air supply source can be larger than a case of using the main linear motor 14. Hence, according to the mover device 10L of this embodiment, it is possible to move the processing base 13L at high speed.

It should be noted that the present invention is not limited to the embodiments specifically disclosed above, but other variations and modifications may be made without departing from the scope of the present invention. For example, the mover device used for the ion implantation device is discussed in the above-mentioned embodiments. However, the present invention is not limited to this. The present invention can be applied to a structure of a device other than the ion implantation device whereby a subject of a process is held and reciprocates.

This patent application is based on Japanese Priority Patent Application No. 2004-23961 filed on Jan. 30, 2004, the entire contents of which are hereby incorporated by reference.

What is claimed is:

1. A method of controlling a mover device that includes: a fixed base; a movable base that is moveable in a linear direction with respect to the fixed base; a processing base that is movable in a linear direction with respect to the movable base, the linear direction being in parallel with the linear moving direction of the movable base; and a moving force generating unit that is provided between the processing base and the movable base, and forms a main moving unit in cooperation with the processing base and the movable base, the method comprising the steps of:
generating a moving force to accelerate and decelerate the processing base with respect to the movable base, so that the processing base is moved with respect to the movable base, and, as a result, the processing base is moved with respect to the fixed base;
moving the movable base on the fixed base in the opposite direction to the moving direction of the processing base by virtue of a reaction force caused by the moving force generated from the moving force generating unit to move the processing base;
converting the reaction force caused by the movement of the processing base into linear-direction inertial movements of the movable base, so that the processing base and the movable base linearly move with respect to each other;
controlling the moving velocity of the processing base and the movable base that interactively move on the fixed base in linear directions,
wherein the linear-direction inertial movements of the movable base caused by the reaction force generated from the movement of the processing base includes accelerating or decelerating movements and a uniform velocity movement.

2. The method of controlling the mover device as claimed in claim 1,
wherein disturbance correction controls of the movable base and the processing base are independently performed by the moving force generating unit and an auxiliary driving unit.

3. The method of controlling the mover device, as claimed in claim 2,
wherein the moving force generating unit performs asynchronous driving so as to shift timings of pulse driving of the main moving device and pulse driving of the auxiliary driving unit to achieve non-driving interference.

4. The control method of the mover device as claimed in claim 2,
wherein the auxiliary driving unit is provided between the fixed base and the movable base;
the movable base with respect to the fixed base is controlled by the auxiliary driving unit so as to have a uniform velocity in a uniform velocity control interval by driving of the moving force generating unit of the processing base; and
a gap of the movable base against the fixed base is adjusted by the auxiliary driving unit in the acceleration and deceleration intervals.

5. The method of controlling the mover device as claimed in claim 1,
wherein the movable base and the processing base are controlled so that moving time of acceleration and deceleration motions and a uniform velocity motion of the processing base and the movable base is same and constant.

6. The method of controlling the mover device as claimed in claim 1,
wherein the movable base and the processing base are set so that moving time of acceleration and deceleration motions and a uniform velocity motion of the processing base and the movable base is same and constant by a position-time control; and
the movable base and the processing base are driven by a control whereby the movable base and the processing base are synchronized in intervals of the acceleration and deceleration motions and the uniform velocity motion.

7. The method of controlling the mover device as claimed in claim 1,
wherein a velocity controlling unit controls the processing base to reciprocate in a predetermined range.

8. The method of controlling the mover device as claimed in claim 7,
wherein the velocity controlling unit controls the processing base to reciprocate in a predetermined range in such a manner that the processing base moves in both directions at the same velocity in each uniform velocity reciprocation movement.

9. The method of controlling the mover device as claimed in claim 7,
wherein the velocity controlling unit repeats acceleration control, uniform velocity control, and deceleration control, while moving the processing base with respect to the fixed base.

* * * * *